US012620364B2

(12) United States Patent　　　　(10) Patent No.: US 12,620,364 B2
Kim et al.　　　　　　　　　　　　(45) Date of Patent: May 5, 2026

(54) GATE DRIVING PANEL CIRCUIT AND DISPLAY DEVICE

(71) Applicant: LG Display Co., Ltd., Seoul (KR)

(72) Inventors: Dongmyoung Kim, Paju-si (KR);
HongJae Shin, Paju-si (KR); YongHo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 19/085,908

(22) Filed: Mar. 20, 2025

(65) Prior Publication Data

US 2025/0246154 A1　　Jul. 31, 2025

Related U.S. Application Data

(63) Continuation of application No. 18/593,260, filed on Mar. 1, 2024, now Pat. No. 12,283,249.

(30) Foreign Application Priority Data

Mar. 3, 2023　(KR) ........................ 10-2023-0028372

(51) Int. Cl.
　　*G09G 3/32*　　　(2016.01)
　　*G09G 3/3266*　　(2016.01)
　　*H10K 59/121*　　(2023.01)
(52) U.S. Cl.
　　CPC ............. *G09G 3/3266* (2013.01); *G09G 3/32* (2013.01); *H10K 59/1216* (2023.02); *G09G 2300/0426* (2013.01); *G09G 2300/0842* (2013.01); *G09G 2310/0286* (2013.01);
　　　　　　　　(Continued)
(58) Field of Classification Search
　　CPC ................... G09G 3/3266; G09G 3/32; G09G 2300/0426; G09G 2300/0842; G09G 2310/0286; G09G 2310/0289; G09G 2310/0291; G09G 2330/04; G09G 3/20; G09G 3/3233; G09G 2310/0267; G09G 3/3674; G09G 2310/08; G09G 2330/06; G09G 2330/08; H10K 59/1216; H10K 59/131; H10K 50/11; H10K 59/122; H10K 59/8052
See application file for complete search history.

(56)　　　　　References Cited

U.S. PATENT DOCUMENTS 7,109,744 B1　9/2006　Shumarayev et al.
2012/0212256 A1　8/2012　Nicholas et al.
2018/0061302 A1　3/2018　Hu et al.
　　　　　　　(Continued)

FOREIGN PATENT DOCUMENTS

KR　10-2012-0073495 A　7/2012
KR　10-2020-0023563 A　3/2020

*Primary Examiner* — Pegeman Karimi
(74) *Attorney, Agent, or Firm* — Birch, Stewart, Kolasch & Birch, LLP

(57)　　　　　ABSTRACT

A display device can include a substrate including a display area in which one or more images are displayed and a non-display area different from the display area, and a gate driving panel circuit configured to output a plurality of gate signals to a plurality of gate signal lines disposed in the display area. The gate driving panel circuit can include an output buffer block configured to receive at least one first input signal and output at least one output signal, and a logic block configured to control respective voltages of a Q node and a QB node, which are electrically connected to the output buffer block.

20 Claims, 38 Drawing Sheets

(52) U.S. Cl.
CPC ............... *G09G 2310/0289* (2013.01); *G09G 2310/0291* (2013.01); *G09G 2330/04* (2013.01)

(56) References Cited

U.S. PATENT DOCUMENTS

| | | | |
|---|---|---|---|
| 2018/0138256 A1* | 5/2018 | Han | H10K 59/1213 |
| 2019/0180691 A1* | 6/2019 | Takasugi | G09G 3/3266 |
| 2021/0201768 A1* | 7/2021 | Jo | G11C 19/28 |
| 2021/0201770 A1* | 7/2021 | Park | G09G 3/32 |
| 2021/0201814 A1* | 7/2021 | Choi | G09G 3/3275 |
| 2022/0068184 A1* | 3/2022 | Oh | G09G 3/3275 |

* cited by examiner

*Vsen Wave*

$$Csc = Ca$$

$$Csc = Ca + Cb$$

$$Csc = Ca + Cb$$

GATE DRIVING PANEL CIRCUIT AND DISPLAY DEVICE

CROSS-REFERENCE TO RELATED APPLICATION

This application is a Continuation of U.S. patent application Ser. No. 18/593,260, filed on Mar. 1, 2024, which claims priority to Korean Patent Application No. 10-2023-0028372, filed on Mar. 3, 2023 in the Korean Intellectual Property Office, the entire contents of all these applications being hereby expressly incorporated by reference into the present application.

BACKGROUND

Technical Field

The present disclosure relates to electronic devices with a display, and more specifically, to a gate driving panel circuit and a display device.

Discussion of the Related Art

A display device can include a display panel in which a plurality of data lines and a plurality of gate lines are disposed, a data driving circuit for outputting data signals to the plurality of data lines, a gate driving circuit for outputting gate signals to the plurality of gate lines, and the like.

In order for images to be displayed properly on the display device, gate signals toned to be supplied properly through the plurality of gate lines. For example, in order to present images properly, it is needed for gate driving to be performed properly. However, in a situation where gate driving is not performed properly, image quality can be affected and degraded.

SUMMARY OF THE DISCLOSURE

One or more embodiments of the present disclosure can provide a gate driving panel circuit having a structure suitable for a gate-in-panel (GIP) type, and a display device including the gate driving panel circuit.

One or more embodiments of the present disclosure can provide a gate driving panel circuit suitable for driving gate lines connected to subpixels having a structure capable of allowing sensing to be performed, and a display device including the gate driving panel circuit.

One or more embodiments of the present disclosure can provide a gate driving panel circuit having a capacitor structure capable of curing or preventing or minimizing defects such as short circuit which can be caused by undesirable substances or particles, and a display device including the gate driving panel circuit. Short circuit defects caused by undesirable substances or particles can be addressed or prevented by designing capacitors included in an output buffer block and a sensing control block to have a split structure in which each of the capacitors is split into sub-capacitor regions.

According to aspects of the present disclosure, a display device can include a substrate including a display area in which one or more images are displayed and a non-display area different from the display area, and a gate driving panel circuit configured to output a plurality of scan signals to a plurality of scan signal lines disposed in the display area. The gate driving panel circuit can include an output buffer block including a scan output buffer configured to receive a clock signal and output a scan signal, and a logic block configured to control respective voltages of a Q node and a QB node, which are electrically connected to the output buffer block. The scan output buffer can include a scan pull-up transistor disposed between a clock node to which the clock signal is input and a scan output node from which the scan signal is output, and a scan pull-down transistor disposed between a gate low voltage node to which a gate low voltage is applied and the output node. The gate node of the scan pull-up transistor can be electrically connected to the Q node. The scan output buffer can further include a first capacitor disposed between the gate node and the source node of the scan pull-up transistor. The first capacitor can be split into at least two sub-capacitor regions.

According to aspects of the present disclosure, a gate driving panel circuit can include an output buffer block configured to receive a clock signal and output a scan signal; and a logic block configured to control respective voltages of a Q node and a QB node electrically connected to the output buffer block, wherein the output buffer block comprises a pull-up transistor disposed between a clock node to which the clock signal is input and an output node to which the scan signal is output, and a pull-down transistor disposed between a gate low voltage node to which a gate low voltage is applied and the output node, wherein a gate node of the pull-up transistor is electrically connected to the Q node. Further, the output buffer block further comprises a first capacitor disposed between the gate node and a source node of the pull-up transistor, and the first capacitor comprises at least two sub-capacitor regions.

In addition to the aspects above described, other aspects, embodiments and examples of the present disclosure and resulted advantages will be described below, and variations thereof will become apparent to those skilled in the art from the following detailed description.

According to one or more embodiments of the present disclosure, a gate driving panel circuit can be provided that has a structure suitable for a gate-in-panel (GIP) type, and a display device can be provided that includes the gate driving panel circuit.

According to one or more embodiments of the present disclosure, since a display panel and a display device are designed to include a gate driving panel circuit disposed on a substrate of the display panel and formed during the manufacturing process of the display panel or the display device, advantage of enabling process optimization of the display panel and the display device can be provided.

According to one or more embodiments of the present disclosure, a gate driving panel circuit can be provided that is capable of (or is suitable for) eliminating, minimizing or preventing defects and limitations such as short circuits caused by undesirable substances or particles through an easily repairable capacitor structure, and a display device including the gate driving panel circuit can be provided.

According to one or more embodiments of the present disclosure, production energy can be reduced and a manufacturing process leading to poor yields can be cured or prevented by reducing the number of discarded display panels and thereby improving panel manufacturing yields through an easily repairable capacitor structure.

Effects according to aspects of the present disclosure are not limited to the above description, more various effects will be apparent in following description.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION OF THE EMBODIMENTS

Figure 1:
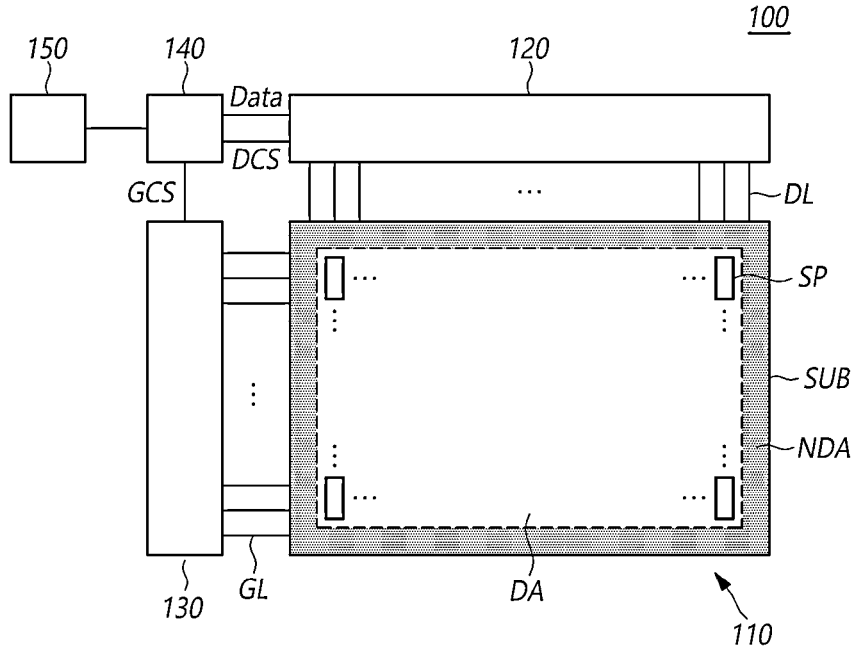
FIG. 1 illustrates an example system configuration of a display device according to aspects of the present disclosure.

Reference will now be made in detail to embodiments of the present disclosure, examples of which can be illustrated in the accompanying drawings. In the following description, the structures, embodiments, implementations, methods and operations described herein are not limited to the specific example or examples set forth herein and can be changed as is known in the art, unless otherwise specified. Like reference numerals designate like elements throughout, unless otherwise specified. Names of the respective elements used in the following explanations are selected only for convenience of writing the specification and can thus be different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the protected scope of the present disclosure is defined by claims and their equivalents.

In the following description, where the detailed description of the relevant known function or configuration can unnecessarily obscure aspects of the present disclosure, a detailed description of such known function or configuration can be omitted. The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," and the like are used, one or more other elements can be added unless the term, such as "only," is used. An element described in the singular form is intended to include a plurality of elements, and vice versa, unless the context clearly indicates otherwise.

Although the terms "first," "second," "A", "B", "(a)", or "(b)", and the like can be used herein to describe various elements, these elements should not be interpreted to be limited by these terms as they are not used to define a particular order or precedence. These terms are used only to distinguish one element from another; thus, related elements should not be interpreted to be limited by these terms as they are not used to define a particular order or precedence.

Further, the expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified. Further, the another element can be included in one or more of the two or more elements connected, combined, coupled, or contacted (to) one another.

For the expression that an element or layer "overlaps," or the like with another element or layer, the element or layer can not only directly contact, overlap, or the like with another element or layer, but also indirectly overlap, or the like with another element or layer with one or more intervening elements or layers "disposed" or "interposed" between the elements or layers, unless otherwise specified.

Where positional relationships are described, for example, where the positional relationship between two parts is described using "on," "over," "under," "above," "below," "beside," "next," or the like, one or more other parts can be located between the two parts unless a more limiting term, such as "immediate(ly)," "direct(ly)," or "close(ly)" is used. For example, where an element or layer is disposed "on" another element or layer, a third element or layer can be interposed therebetween. Furthermore, the terms "left," "right," "top," "bottom, "downward," "upward," "upper," "lower," and the like refer to an arbitrary frame of reference. In describing a temporal relationship, when the temporal order is described as, for example, "after," "subsequent," "next," or "before," a case which is not continuous can be included unless a more limiting term, such as "just," "immediate(ly)," or "direct(ly)," is used. In construing an element, the element is to be construed as including an error or tolerance range even where no explicit description of such an error or tolerance range is provided. Further, the term "may" fully encompasses all the meanings of the term "can." The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Hereinafter, various example embodiments of the present disclosure will be described in detail with reference to the accompanying drawings. All components of each display device and each circuit according to all embodiments and aspects of the present disclosure are operatively coupled and configured. In addition, for convenience of description, a scale in which each of elements is illustrated in the accompanying drawings can differ from an actual scale. Thus, the illustrated elements are not limited to the specific scale in which they are illustrated in the drawings.

FIG. 1 illustrates an example system configuration of a display device 100 according to aspects of the present disclosure.

Referring to FIG. 1, in one or more embodiments, the display device 100 according to aspects of the present disclosure can include a display panel 110 including a plurality of subpixels SP and at least one driving circuit for driving the plurality of subpixels SP included in the display panel 110.

The at least one driving circuit can include a data driving circuit 120, a gate driving circuit 130, and the like, and further include a controller 140 for controlling the data driving circuit 120 and the gate driving circuit 130.

The display panel 110 can include a substrate SUB, and signal lines such as a plurality of data lines DL, a plurality of gate lines GL, and the like disposed over the substrate SUB. The plurality of data lines DL and the plurality of gate lines GL can be connected to the plurality of subpixels SP.

The display panel 110 can include a display area DA in which one or more images can be displayed and a non-display area NDA in which an image is not displayed. A plurality of subpixels SP for displaying images can be disposed in the display area DA of the display panel 110. Driving circuits (e.g., 120, 130) and the controller 140 can be electrically connected to, or be mounted in, the non-display area NDA of the display panel 110. Further, a pad portion including one or more pads to which one or more integrated circuits or one or more printed circuits are connected can be disposed in the non-display area NDA.

The data driving circuit 120 can be a circuit for driving the plurality of data lines DL, and can supply data signals to the plurality of data lines DL.

The gate driving circuit 130 can be a circuit for driving the plurality of gate lines GL, and can supply gate signals to the plurality of gate lines GL.

The controller 140 can supply a data control signal DCS to the data driving circuit 120 in order to control operation timing of the data driving circuit 120. The controller 140 can supply a gate control signal GCS to the gate driving circuit 130 in order to control operation timing of the gate driving circuit 130.

The controller 140 can start to scan pixels according to respective timings set in each frame, convert image data inputted from external devices or external image providing sources (e.g. host systems) in a data signal form readable by the data driving circuit 120 and then supply image data Data resulting from the converting to the data driving circuit 120, and in line with the scan of at least one pixel (or at least one pixel array) among the pixels, control the loading of the image data to the at least one pixel at a time at which the illumination of at least one corresponding light emitting element of the at least one pixel is intended.

The controller 140 can receive, in addition to input image data, several types of timing signals including a vertical synchronous signal VSYNC, a horizontal synchronous signal HSYNC, an input data enable signal DE, a clock signal CLK, and the like from external devices, networks, or systems (e.g., a host system 150).

In order to control the data driving circuit 120 and the gate driving circuit 130, the controller 140 can receive one or more of the timing signals such as the vertical synchronization signal VSYNC, the horizontal synchronization signal HSYNC, the input data enable signal DE, the clock signal CLK, and the like, generate several types of control signals DCS and GCS, and output the generated signals to the data driving circuit 120 and the gate driving circuit 130.

For example, in order to control the gate driving circuit 130, the controller 140 can output several types of gate control signals GCS including a gate start pulse GSP, a gate shift clock GSC, a gate output enable signal GOE, and the like.

Further, to control the data driving circuit 120, the controller 140 can output several types of data control signals DCS including a source start pulse SSP, a source sampling clock SSC, a source output enable SOE signal, and the like.

The controller 140 can be implemented in a separate component from the data driving circuit 120, or integrated with the data driving circuit 120, so that the controller 140 and the data driving circuit 120 can be implemented in a single integrated circuit.

The data driving circuit 120 can drive a plurality of data lines DL by supplying data voltages corresponding to image data Data received from the controller 140 to the plurality of data lines DL. The data driving circuit 120 can also be referred to as a source driving circuit.

The data driving circuit 120 can include, for example, one or more source driver integrated circuits SDIC.

Each source driver integrated circuit SDIC can include a shift register, a latch circuit, a digital-to-analog converter DAC, an output buffer, and the like. In one or more embodiments, each source driver integrated circuit SDIC can further include an analog-to-digital converter ADC.

In one or more embodiments, each source driver integrated circuit SDIC can be connected to the display panel 110 using a tape-automated-bonding (TAB) technique, or connected to a conductive pad such as a bonding pad of the display panel 110 using a chip-on-glass (COG) technique or a chip-on-panel (COP) technique, or connected to the display panel 110 using a chip-on-film (COF) technique.

The gate driving circuit 130 can supply a gate signal of a turn-on level voltage or a gate signal of a turn-off level voltage according to the control of the controller 140. The gate driving circuit 130 can sequentially drive a plurality of gate lines GL by sequentially supplying gate signals of the turn-on level voltage to the plurality of gate lines GL.

In one or more embodiments, the gate driving circuit 130 can be connected to the display panel 110 using the tape-automated-bonding (TAB) technique, or connected to a conductive pad such as a bonding pad of the display panel 110 using the chip-on-glass (COG) technique or the chip-on-panel (COP) technique, or connected to the display panel 110 using the chip-on-film (COF) technique. In one or more embodiments, the gate driving circuit 130 can be disposed in the non-display area NDA of the display panel 110 using the gate-in-panel (GIP) technique. The gate driving circuit 130 can be disposed on a substrate SUB, or connected to the substrate SUB. In an example where the gate driving circuit 130 is implemented with the GIP technique, the gate driving circuit 130 can be disposed in the non-display area NDA of the substrate SUB. The gate driving circuit 130 can be connected to the substrate SUB in examples where the gate driving circuit 130 is implemented with the chip-on-glass (COG) technique, the chip-on-film (COF) technique, or the like.

In an embodiment, at least one of the data driving circuit 120 and the gate driving circuit 130 can be disposed in the display area DA. For example, at least one of the data driving circuit 120 and the gate driving circuit 130 can be disposed not to overlap with subpixels SP, or disposed to overlap with one or more, or all, of the subpixels SP.

When a specific gate line is selected and driven by the gate driving circuit 130, the data driving circuit 120 can convert image data Data received from the controller 140 into data voltages in an analog form and supply the data voltages resulting from the converting to a plurality of data lines DL.

The data driving circuit 120 can be located in, and/or electrically connected to, but not limited to, only one side or portion (e.g., an upper edge or a lower edge) of the display panel 110. In one or more embodiments, the data driving circuit 120 can be located in, and/or electrically connected to, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 130 can be located in, and/or electrically connected to, but not limited to, only one side or portion (e.g., a left edge or a right edge) of the display panel 110. In one or more embodiments, the gate driving circuit 130 can be located in, and/or electrically connected to, but not limited to, two sides or portions (e.g., a left edge and a right edge) of the panel 110 or at least two of four sides or portions (e.g., an upper edge, a lower edge, the left edge, and the right edge) of the display panel 110 according to driving schemes, panel design schemes, or the like.

The controller 140 can be a timing controller used in the typical display technology or a control apparatus/device capable of additionally performing other control functionalities in addition to the typical function of the timing controller. In one or more embodiments, the controller 140 can be one or more other control circuits different from the timing controller, or a circuit or component in the control apparatus/device. The controller 140 can be implemented using various circuits or electronic components such as an integrated circuit (IC), a field programmable gate array (FPGA), an application specific integrated circuit (ASIC), a processor, and/or the like.

The controller 140 can be mounted on a printed circuit board, a flexible printed circuit, or the like, and can be electrically connected to the data driving circuit 120 and the gate driving circuit 130 through the printed circuit board, the flexible printed circuit, or the like.

The controller 140 can transmit signals to, and receive signals from, the data driving circuit 120 via one or more predetermined interfaces. For example, such interfaces can include a low voltage differential signaling (LVDS) interface, an embedded clock point-point interface (EPI), a serial peripheral interface (SPI), and the like.

The controller 140 can include a storage medium such as one or more registers.

In one or more aspects, the display device 100 can be a display including a backlight unit such as a liquid crystal display device, or can be a self-emissive display such as an organic light emitting diode (OLED) display device, a quantum dot (QD) display device, a micro light emitting diode (M-LED) display device, a light emitting diode (LED) display device based on an inorganic material, or the like.

In an embodiment where the display device 100 is an organic light emitting display device, each subpixel SP can include, as a light emitting element, an organic light emitting diode (OLED), which is a self-emissive element.

In an embodiment where the display device 100 is a quantum dot display device, each subpixel SP can include a light emitting element configured with quantum dots, which are self-emissive semiconductor crystals.

In an embodiment where the display device 100 is an inorganic light emitting display device, each subpixel SP can include, as a light emitting element, an inorganic light emitting diode, which is a self-emissive element and includes an inorganic material. In this embodiment, the inorganic light emitting diode can be referred to as a micro light emitting diode (LED), and the inorganic light emitting display device can be referred to as a micro light emitting diode (LED) display device.

Figure 2:
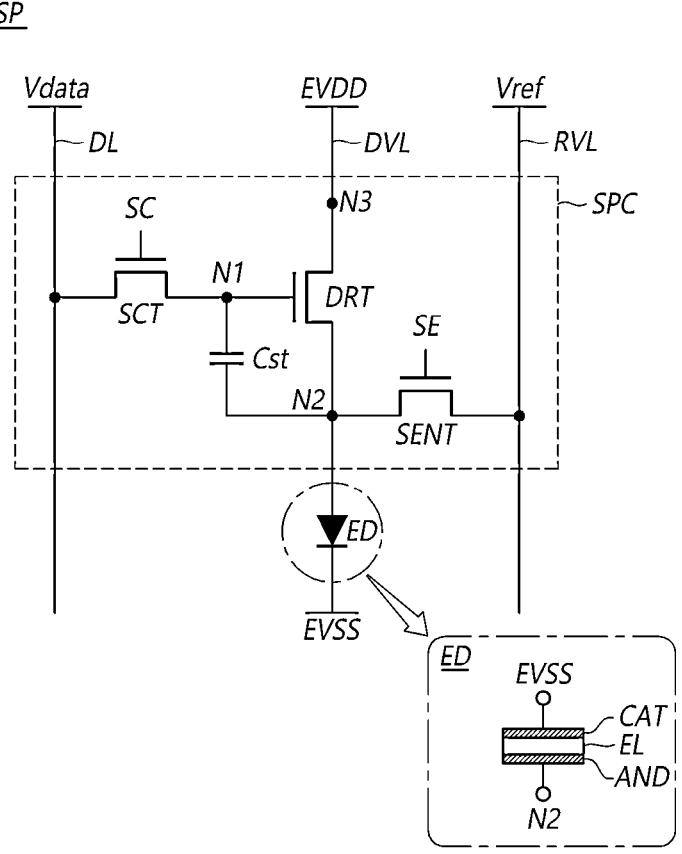
FIG. 2 illustrates an example equivalent circuit of a subpixel in a display panel according to aspects of the present disclosure.

FIG. 2 illustrates an example equivalent circuit of a subpixel in the display panel 110 according to aspects of the present disclosure.

Referring to FIG. 2, in one or more embodiments, each of a plurality of subpixels SP disposed in the display panel 110 of the display device 100 according to aspects of the present disclosure can include a light emitting element ED and a subpixel circuit SPC for driving the light emitting element ED.

For example, the corresponding subpixel circuit SPC of each subpixel SP can include a driving transistor DRT, a scan transistor SCT, a sensing transistor SENT, and a storage capacitor Cst. In this example, as the corresponding subpixel circuit SPC of each subpixel SP is configured with three transistors (3T: DRT, SCT and SENT) and one capacitor (1C: Cst), this structure of subpixel circuit SPC can be referred to as a "3T1C structure".

The light emitting element ED can include an anode electrode AND and a cathode electrode CAT, and include an emission layer EL located between the anode electrode AND and the cathode electrode CAT.

One of the anode electrode AND and the cathode electrode CAT can be a pixel electrode connected to a transistor such as the driving transistor DRT, and the other can be a common electrode to which a common voltage is applied. The pixel electrode can be an electrode disposed in each subpixel SP, and the common electrode can be an electrode commonly disposed in all or two or more of subpixels SP. For example, the common voltage can be a high voltage EVDD, which is a high level common voltage, or be a low voltage EVSS, which is a low level common voltage. In this example, the high voltage EVDD can be sometimes referred to as a driving voltage, and the low voltage EVSS can be sometimes referred to as a base voltage.

According to the example of FIG. 2, the anode electrode AND can be a pixel electrode connected to a transistor such as the driving transistor DRT, and the cathode electrode CAT can be a common electrode to which the low voltage EVSS is applied.

For example, the light emitting element ED can be an organic light emitting diode (OLED), a light emitting diode (LED) based on an inorganic material, a quantum dot light emitting element, or the like.

Referring to FIG. 2, the driving transistor DRT can be a transistor for driving the light emitting element ED, and can include a first node N1, a second node N2, and a third node N3.

The first node N1 of the driving transistor DRT can be the gate node of the driving transistor DRT, and can be electrically connected to the source node or drain node of the scan transistor SCT. The second node N2 of the driving transistor DRT can be the source node or drain node of the driving transistor DRT, be electrically connected to the source node or drain node of the sensing transistor SENT, and be electrically connected to the anode electrode AND of the light emitting element ED. The third node N3 of the driving transistor DRT can be electrically connected to a high voltage line DVL for carrying the high voltage EVDD.

Referring to FIG. 2, the scan transistor SCT can be controlled by a scan signal SC, which is a type of gate signal, and can be connected between the first node N1 of the driving transistor DRT and a data line DL. In other words, the scan transistor SCT can be turned on or turned off depending on a scan signal SC carried through a scan signal line SCL (see FIG. 3), which is a type of the gate line GL, and control an electrical connection between the data line DL and the first node N1 of the driving transistor DRT.

The scan transistor SCT can be turned on by a scan signal SC having a turn-on level voltage, and thereby, pass a data voltage Vdata carried through the data line DL to the first node N1 of the driving transistor DRT.

In an example where the scan transistor SCT is an n-type transistor, the turn-on level voltage of the scan signal SC can be a high level voltage. In another example where the scan transistor SCT is an p-type transistor, the turn-on level voltage of the scan signal SC can be a low level voltage. Hereinafter, for simplicity, discussions are provided based on the example where the scan transistor SCT is an n-type transistor. Accordingly, in discussions that follow, the turn-on level voltage of the scan signal SC can be a high level voltage.

Referring to FIG. 2, the sensing transistor SENT can be controlled by a sensing signal SE, which is a type of gate signal, and can be connected between the second node N2 of the driving transistor DRT and a reference voltage line RVL. In other words, the sensing transistor SENT can be turned on or turned off depending on a sensing signal SE carried through a sensing signal line SENL (see FIG. 3), which is another type of the gate line GL, and control an electrical connection between the second node N2 of the driving transistor DRT and the reference voltage line RVL.

The sensing transistor SENT can be turned on by a sensing signal SE having a turn-on level voltage, and thereby, pass a reference voltage Vref carried through the reference voltage line RVL to the second node N2 of the driving transistor DRT. The sensing signal SE can be referred to as a second scan signal that is different from the scan signal SC.

Further, the sensing transistor SENT can be turned on by a sensing signal SE having the turn-on level voltage, and thereby, pass a voltage at the second node N2 of the driving transistor DRT to the reference voltage line RVL.

In an embodiment where the sensing transistor SENT is an n-type transistor, the turn-on level voltage of the sensing signal SE can be a high level voltage. In another example where the sensing transistor SENT is an p-type transistor, the turn-on level voltage of the sensing signal SE can be a low level voltage. Hereinafter, for simplicity, discussions are provided based on the example where the sensing transistor SENT is an n-type transistor. Accordingly, in discussions that follow, the turn-on level voltage of a sensing signal SE can be a high level voltage.

For example, the function of the sensing transistor SENT configured to pass the voltage of the second node N2 of the driving transistor DRT to the reference voltage line RVL can be used when the corresponding subpixel SP is driven to sense one or more characteristic values of the subpixel SP. In this example, the voltage passed to the reference voltage line RVL can be a voltage to determine a characteristic value of the subpixel SP or a voltage where the characteristic value of the subpixel SP is contained.

Herein, the characteristic value of the subpixel SP can be a characteristic value of the driving transistor DRT or the light emitting element ED. For example, the characteristic value of the driving transistor DRT can include a threshold voltage and/or mobility of the driving transistor DRT. The characteristic value of the light emitting element ED can include a threshold voltage of the light emitting element ED.

Referring to FIG. 2, the storage capacitor Cst can be connected between the first node N1 and the second node N2 of the driving transistor DRT. The storage capacitor Cst can store an amount of electric charge corresponding to a voltage difference between both terminals and maintain the voltage difference between both terminals for a predetermined frame time. As a result, the corresponding subpixel SP can emit light for the predetermined frame time.

Each of the driving transistor DRT, the scan transistor SCT, and the sensing transistor SENT can be an n-type transistor, or a p-type transistor. Herein, for convenience of description, discussions are provided based on an example where each of the driving transistor DRT, the scan transistor SCT, and the sensing transistor SENT is an n-type transistor.

The storage capacitor Cst can be an external capacitor intentionally designed to be located outside of the driving transistor DRT, other than an internal capacitor, such as a parasitic capacitor (e.g., a Cgs or a Cgd), that can be formed between the gate node and the source node (or the drain node) of the driving transistor DRT.

It should be noted that FIG. 2 illustrates just one example subpixel SP. For example, the subpixel SP can be modified in various ways by further including one or more transistors or one or more capacitors according to design requirements.

Figure 3:
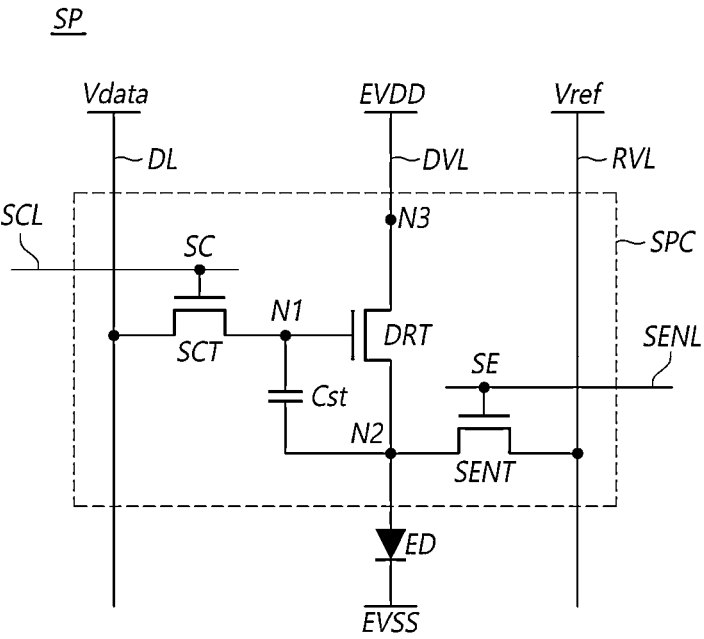
FIG. 3 illustrates an example equivalent circuit of a subpixel having a two-gate driven structure in the display panel according to aspects of the present disclosure.

FIG. 3 illustrates an example equivalent circuit of a subpixel SP having a two-gate driven structure in the display panel 110 according to aspects of the present disclosure.

The subpixel circuit SPC of the subpixel SP of FIG. 3 can have the same 3T1C structure as the subpixel circuit SPC of the subpixel SP of FIG. 2. The subpixel SP of FIG. 3 can have a two-gate driven structure.

Referring to FIG. 3, in examples where a subpixel SP has the two-gate driven structure, the subpixel SP can be connected to two gate lines GL serving as a scan signal line SCL and a sensing signal line SENL, respectively.

In the subpixel circuit SPC of the two-gate driven structure-based subpixel SP, the gate node of a scan transistor SCT can be connected to the scan signal line SCL, and the gate node of a sensing transistor SEN can be connected to the sensing signal line SENL. As a result, the scan transistor SCT and the sensing transistor SENT can operate independently of each other.

The subpixel circuit SPC of the two-gate driven structure-based subpixel SP can receive a scan signal SC through the scan signal line SCL, and receive a sensing signal SE through the sensing signal line SENL. In this manner, in the subpixel circuit SPC of the two-gate driven structure-based subpixel SP, the gate node of the scan transistor SCT can receive a scan signal SC through the scan signal line SCL, and the gate node of the sensing transistor SENT can receive a sensing signal SE through the sensing signal line SENL.

In examples where a subpixel SP has the two-gate driven structure, on and/or off timings of a scan transistor SCT and on and/or off timings of a sensing transistor SENT in one subpixel SP can be independent of each other. For example, when a subpixel SP has the two-gate driven structure, on and/or off timings of a scan transistor SCT and on and/or off timings of a sensing transistor SENT in one subpixel SP can be different from, or be the same as, each other according to design requirements.

Figure 4:
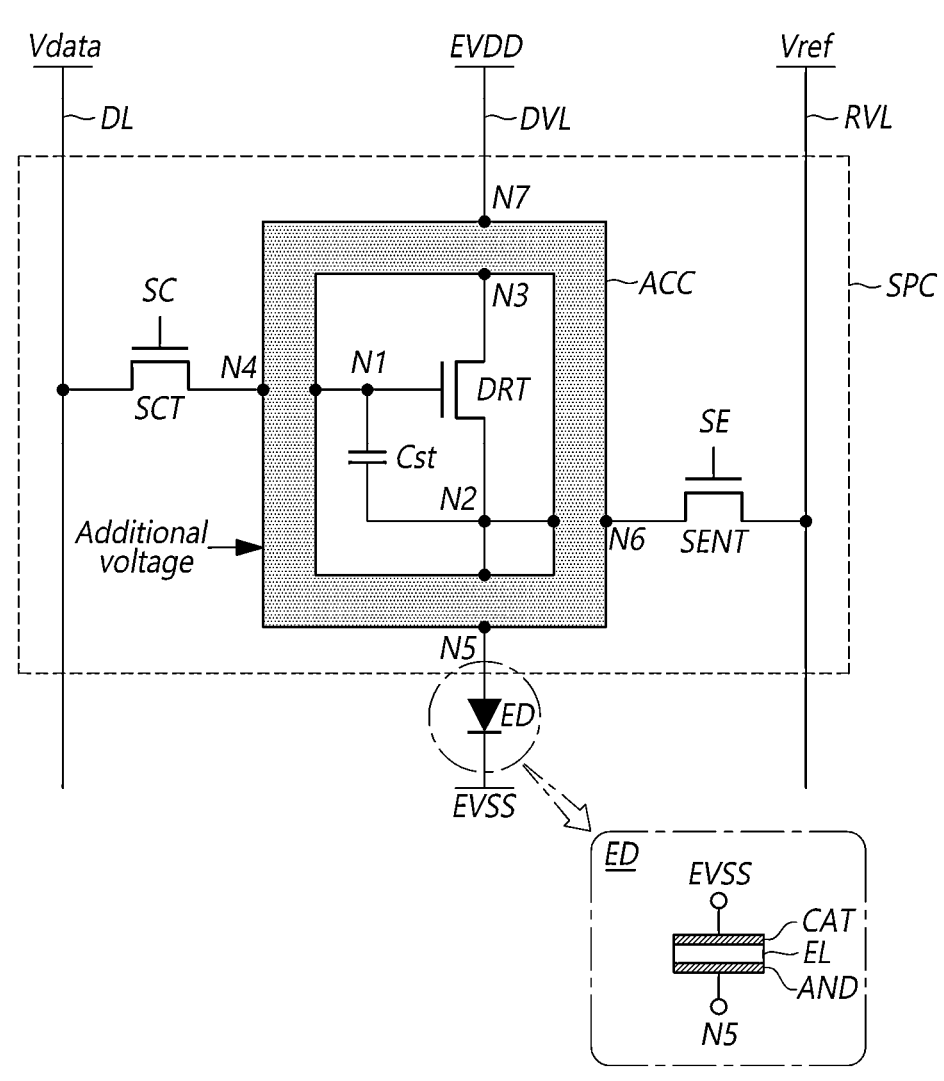
FIG. 4 illustrates another example equivalent circuit of a subpixel in the display panel according to aspects of the present disclosure.

FIG. 4 illustrates another example equivalent circuit of a subpixel in the display panel 110 according to aspects of the present disclosure.

Referring to FIG. 4, a subpixel SP can include a light emitting element ED and a subpixel circuit SPC for driving the light emitting element ED. The subpixel circuit SPC can include a driving transistor DRT, a scan transistor SCT, a sensing transistor SENT, and a storage capacitor Cst, and in addition, include an additional control circuit CC ACC.

The additional control circuit ACC can include one or more transistors and/or one or more capacitors.

The additional control circuit ACC can include a fourth node N4 electrically connected to the source node or drain node of the scan transistor SCT, a fifth node N5 electrically connected to the anode electrode AND of the light emitting element ED, a sixth node N6 electrically connected to the source node or drain node of the sensing transistor SENT, and a seventh node N7 electrically connected to a high voltage line DVL.

The additional control circuit ACC can be supplied with an additional voltage, when needed or desired.

Referring to FIG. 4, when the fourth node N4 and the first node N1 are electrically connected to each other, the fifth node N5, the sixth node N6, and the second node N2 are electrically connected to each other, and the seventh node N7 and the third node N3 are electrically connected to each other, by the additional control circuit ACC, the subpixel SP of FIG. 4 can be the same as the subpixel SP of FIG. 2.

For example, the additional control circuit ACC can include a light emitting control transistor configured to control a connection between the second node N2 and the fifth node N5. In another example, the additional control circuit ACC can include a light emitting control transistor configured to control a connection between the seven node N7 and the third node N3.

Figure 5:
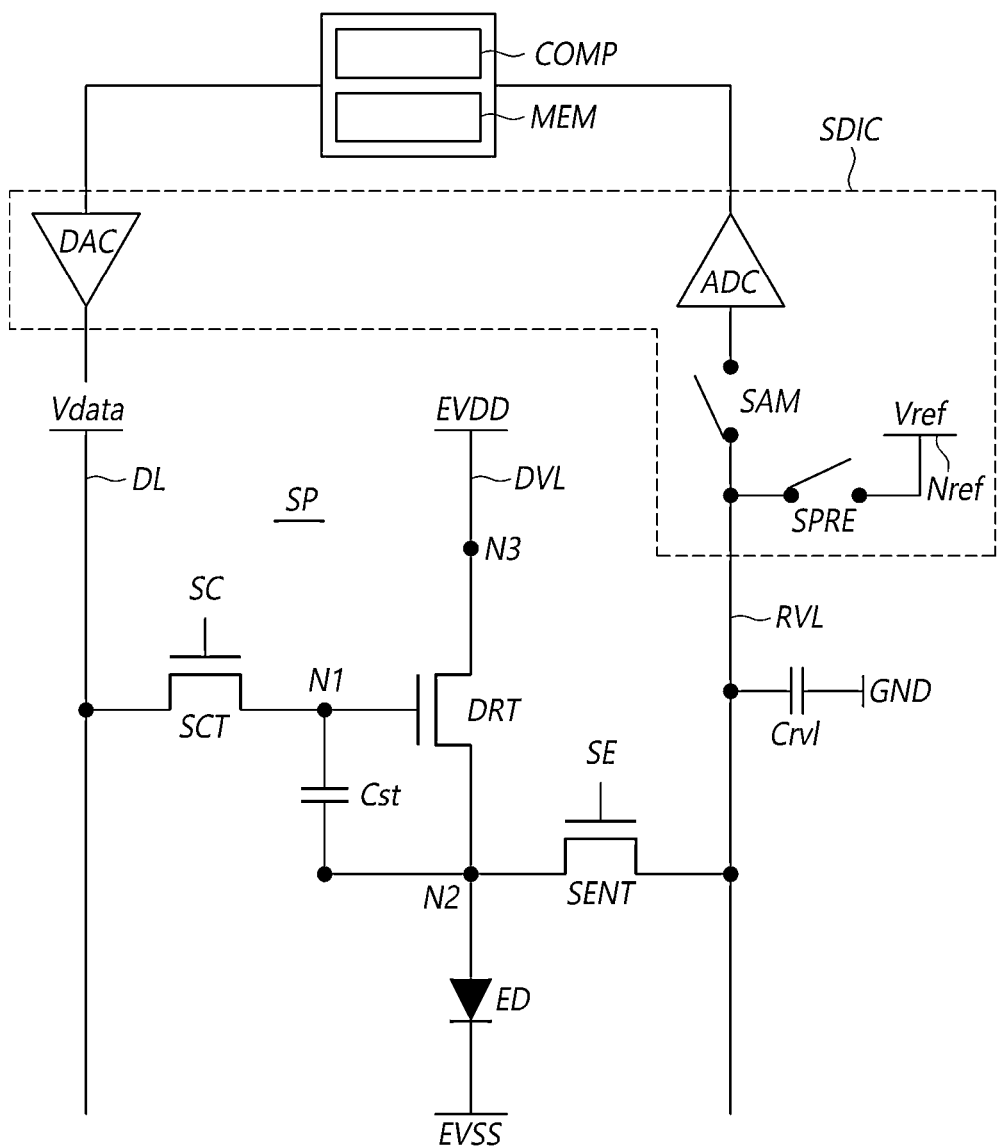
FIG. 5 illustrates an example compensation circuit of the display device according to aspects of the present disclosure.

FIG. 5 illustrates an example compensation circuit of the display device 100 according to aspects of the present disclosure. It should be noted here that the subpixel SP of FIG. 5 represents the subpixel SP of FIG. 2 as an example.

Referring to FIG. 5, the compensation circuit can be configured to perform sensing operation for characteristic values of circuit elements in the subpixel SP and an associated compensation process. In an embodiment, the circuit elements can include light emitting elements ED, driving transistors DRT, and the like.

The compensation circuit can include a power switch SPRE, a sampling switch SAM, an analog-to-digital converter ADC, a compensator COMP, a memory MEM, and the like. In an embodiment, the compensation circuit can further include a subpixel SP (e.g., the subpixel SP of FIG. 2 or 3).

The power switch SPRE can control a connection between the reference voltage line RVL and a reference voltage supply node Nref. A reference voltage Vref supplied by a power supply can be applied to the reference voltage supply node Nref, and the reference voltage Vref applied to the reference voltage supply node Nref can be passed to the reference voltage line RVL via the power switch SPRE.

The sampling switch SAM can control a connection between the analog-to-digital converter ADC and the reference voltage line RVL. When the analog-to-digital converter ADC is connected to the reference voltage line RVL by a sampling switch SAM, the analog-to-digital converter ADC can convert a voltage (analog voltage) of the connected reference voltage line RVL into a sensing value in the form of digital value.

As the subpixel SP is driven, a line capacitor Crvl can be formed between the reference voltage line RVL and the ground GND. The voltage of the reference voltage line RVL can correspond to an amount of electric charges stored across the line capacitor Crvl.

The analog-to-digital converter ADC can provide sensing data containing the sensing value to the compensator COMP.

The compensator COMP can determine at least one corresponding characteristic value of at least one circuit element (e.g., the light emitting element ED, the driving transistor DRT, and/or the like) included in the subpixel SP based on the sensing data from the analog-to-digital converter ADC. Thereafter, the compensator COMP can determine a compensation value to reduce or eliminate a difference in characteristic values between circuit elements based on the at least one characteristic value, and store the compensation value in the memory MEM.

For example, the compensation value can be information determined to reduce or eliminate a difference in characteristic values between light emitting elements ED or a difference in characteristic values between driving transistors DRT, and include an offset and/or a gain for modifying data.

The controller 140 can modify image data using the compensation value stored in the memory MEM, and supply the modified image data to the data driving circuit 120.

The data driving circuit 120 can convert the changed image data into a data voltage Vdata in the form of analog voltage by using a digital-to-analog converter DAC, and output the data voltage Vdata. In this manner, the compensation process can be executed.

Referring to FIG. 5, in an embodiment, the analog-to-digital converter ADC, the power switch SPRE, and the sampling switch SAM can be included in a source driver integrated circuit SDIC. In this embodiment, the source driver integrated circuit SDIC can be an integrated circuit serving as the data driving circuit 120 or a part of the data driving circuit 120, and include the digital-to-analog converter DAC.

In an embodiment, the compensator COMP can be included in the controller 140.

As described above, the display device 100 can perform the compensation process to reduce a difference in characteristic values between the driving transistors DRT. Further, in order to perform the compensation process, the display device 100 can perform sensing driving to acquire information on a difference in characteristic values between the driving transistors DRT.

In an embodiment, the display device 100 according to aspects of the present disclosure can perform sensing driving in two sensing modes (a first sensing mode and a second sensing mode). Hereinafter, sensing driving in two sensing modes (the first sensing mode and the second sensing mode) will be described with reference to FIGS. 6A and 6B.

Figure 6A:
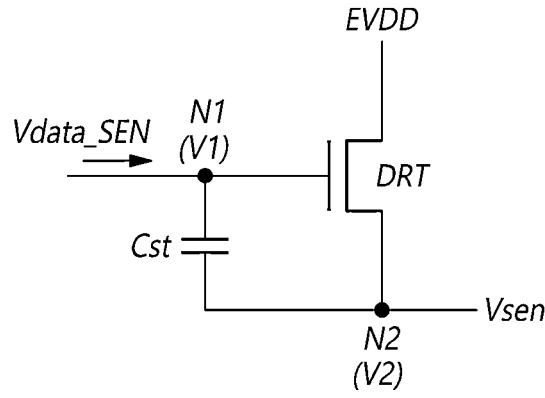
FIGS. 6A and 6B illustrate an example first sensing mode and an example second sensing mode used in the display device according to aspects of the present disclosure.
Figure 6A:
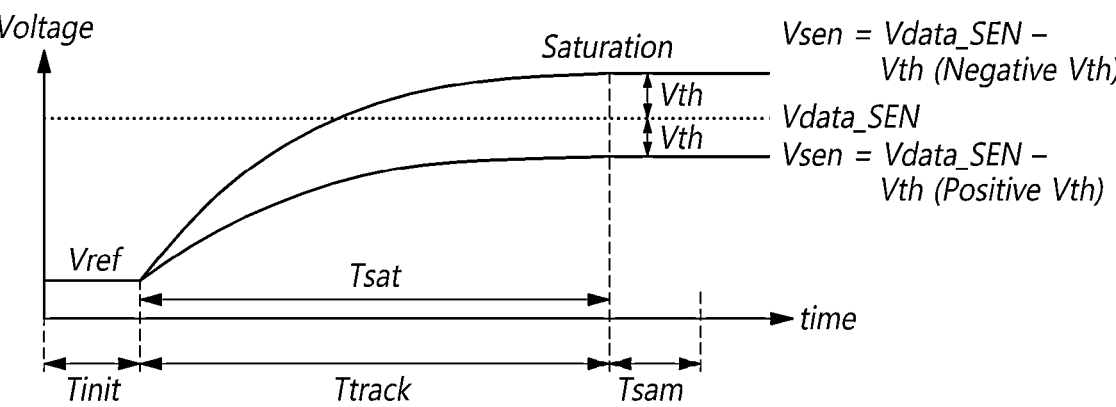
Figure 6B:
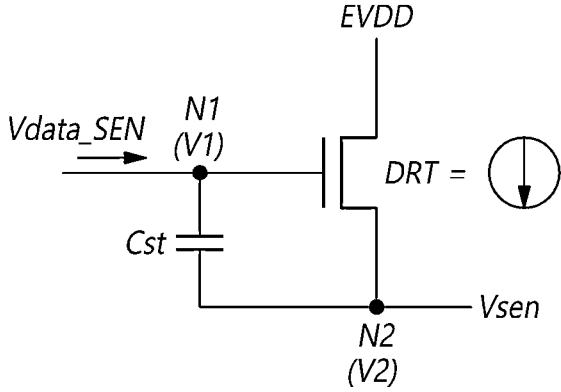
Figure 6B:
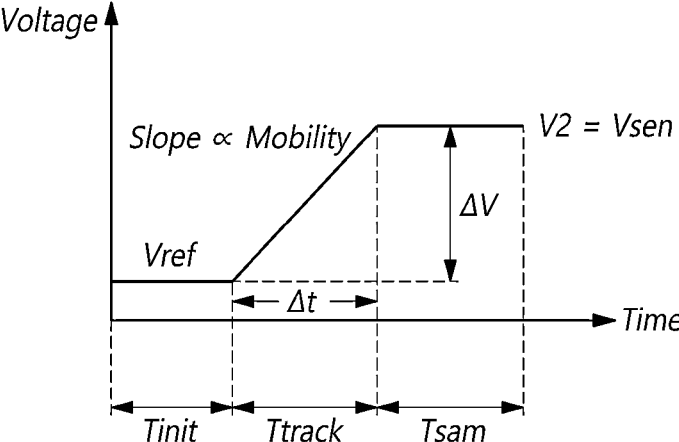

FIGS. 6A and 6B illustrate an example first sensing mode and an example second sensing mode used in the display device 100 according to aspects of the present disclosure.

Referring to FIG. 6A, the "first sensing mode" can be a sensing mode for sensing a threshold voltage, which requires a relatively long sensing time, among the characteristic values (e.g., the threshold voltage and the mobility)

of the driving transistor DRT. The first sensing mode can also be referred to as a "slow sensing mode" or a "threshold voltage sensing mode."

Referring to FIG. 6B, the "second sensing mode" can be a sensing mode for sensing mobility, which requires a relatively short sensing time, among the characteristic values (e.g., the threshold voltage and the mobility) of the driving transistor DRT. The second sensing mode can also be referred to as a "fast sensing mode" or a "mobility sensing mode."

Hereinafter, sensing driving in the first sensing mode and sensing driving in the second sensing mode will be described with reference to the compensation circuit of FIG. 5, as well as FIGS. 6A and 6B.

First, sensing driving in the first sensing mode will be described with reference to FIG. 6A.

In FIG. 6A, a sensing driving period of the first sensing mode can include an initialization sub-period Tinit, a tracking sub-period Ttrack, and a sampling sub-period Tsam.

The initialization sub-period Tinit of the sensing driving period in the first sensing mode can be a period for initializing the first node N1 and the second node N2 of the driving transistor DRT.

During the initialization sub-period Tinit, a voltage V1 of the first node N1 of the driving transistor DRT can be initialized to a sensing driving data voltage Vdata_SEN, and a voltage V2 of the second node N2 of the driving transistor DRT can be initialized to a sensing driving reference voltage Vref.

During the initialization sub-period Tinit, the scan transistor SCT and the sensing transistor SENT can be turned on, and the power switch SPRE can be turned on.

Referring to FIG. 6A, the tracking sub-period Ttrack of the sensing driving period in the first sensing mode can be a period for tracking a voltage V2 of the second node N2 of the driving transistor DRT containing a threshold voltage Vth of the driving transistor DRT or a shift ΔVth in the threshold voltage Vth.

During the tracking sub-period Ttrack, the power switch SPRE can be turned off or the sensing transistor SENT can be turned off.

Accordingly, during the tracking sub-period Ttrack, while the first node N1 of the driving transistor DRT is in a constant voltage state with the sensing driving data voltage Vdata_SEN, the second node N2 of the driving transistor DRT can be electrically floating. Accordingly, during the tracking sub-period Ttrack, the voltage V2 of the second node N2 of the driving transistor DRT can vary.

During the tracking sub-period Ttrack, the voltage V2 of the second node N2 of the driving transistor DRT can increase until the voltage V2 of the second node N2 of the driving transistor DRT contains a threshold voltage Vth of the driving transistor DRT (i.e., until the voltage V2 of the second node N2 of the driving transistor DRT reaches a saturation point at which the threshold voltage Vth of the driving transistor DRT (or a shift ΔVth in the threshold voltage Vth) is contained in the voltage V2 of the second node N2 of the driving transistor DRT).

During the initialization sub-period Tinit, a voltage difference between the first node N1 and the second node N2 of the driving transistor DRT, which has been initialized, can be greater than or equal to the threshold voltage Vth of the driving transistor DRT. Accordingly, when the tracking sub-period Ttrack is initiated, the driving transistor DRT can be turned on and allow current to flow. Thereby, when the tracking sub-period Ttrack is initiated, the voltage V2 of the second node N2 of the driving transistor DRT can increase.

During the tracking sub-period Ttrack, the voltage V2 of the second node N2 of the driving transistor DRT cannot continuously increase.

As the latter part of the tracking sub-period Ttrack progresses, an increasing width of the voltage V2 of the second node N2 of the driving transistor DRT can be reduced, and the voltage V2 of the second node N2 of the driving transistor DRT can be eventually saturated.

A saturated voltage V2 of the second node N2 of the driving transistor DRT can correspond to a difference (Vdata_SEN−Vth) between the sensing driving data voltage Vdata_SEN and the threshold voltage Vth or a difference (Vdata_SEN−ΔVth) between the sensing driving data voltage Vdata_SEN and a shift in the threshold voltage ΔVth. The threshold voltage Vth can be a negative threshold voltage (−Vth) or a positive threshold voltage (+Vth).

When the voltage V2 of the second node N2 of the driving transistor DRT is saturated, the sampling sub-period Tsam can be initiated.

Referring to FIG. 6A, the sampling sub-period Tsam of the sensing driving period in the first sensing mode can be a period for measuring a voltage (i.e., Vdata_SEN−Vth, Vdata_SEN−ΔVth) containing the threshold voltage Vth of the driving transistor DRT or a shift in the threshold voltage Vth.

During the sampling sub-period Tsam of the sensing driving period in the first sensing mode, a voltage of the reference voltage line RVL can be sensed by the analog-to-digital converter ADC. The voltage of the reference voltage line RVL can correspond to the voltage of the second node N2 of the driving transistor DRT, and correspond to a charging voltage of a line capacitor Crvl formed on the reference voltage line RVL.

During the sampling sub-period Tsam, a voltage Vsen sensed by the analog-to-digital converter ADC can be the voltage (Vdata_SEN−Vth) resulting from subtracting the threshold voltage Vth from the sensing driving data voltage Vdata_SEN or the voltage (Vdata_SEN−ΔVth) resulting from subtracting the threshold voltage shift ΔVth from the sensing driving data voltage Vdata_SEN. The Vth can be a positive threshold voltage or a negative threshold voltage.

Referring to FIG. 6A, during the tracking sub-period Ttrack of the sensing driving period in the first sensing mode, a saturation time Tsat taken until the voltage V2 of the second node N2 of the driving transistor DRT increases and then reaches saturation can be a time period of the tracking sub-period Ttrack of the sensing driving period in the first sensing mode, and be a time taken until the threshold voltage Vth or threshold voltage shift ΔVth of the driving transistor DRT is contained in the voltage (V2=Vdata_SEN−Vth, or V2=Vdata_SEN−ΔVth) of the second node N2 of the driving transistor DRT.

This saturation time Tsat can occupy most of the entire time period of the sensing driving period in the first sensing mode. Thus, in the case of the first sensing mode, it can take quite a long time (saturation time Tsat) for the voltage V2 of the second node N2 of a driving transistor DRT to reach saturation after increasing.

As described above, the sensing driving method for sensing the threshold voltage of a driving transistor DRT (i.e., the first sensing mode) is sometimes referred to as a slow mode since a long saturation time Tsat is required until the voltage of the second node N2 of the driving transistor DRT contains the threshold voltage of the driving transistor DRT.

Next, sensing driving in the second sensing mode will be described with reference to FIG. 6B.

Referring to FIG. 6B, a sensing driving period of the second sensing mode can include an initialization sub-period Tinit, a tracking sub-period Ttrack, and a sampling sub-period Tsam.

The initialization sub-period Tinit of the sensing driving period in the second sensing mode can be a period for initializing the first node N1 and the second node N2 of the driving transistor DRT.

During the initialization sub-period Tinit, the scan transistor SCT and the sensing transistor SENT can be turned on, and the power switch SPRE can be turned on.

During the initialization sub-period Tinit, a voltage V1 of the first node N1 of the driving transistor DRT can be initialized to a sensing driving data voltage Vdata_SEN, and a voltage V2 of the second node N2 of the driving transistor DRT can be initialized to a sensing driving reference voltage Vref.

Referring to FIG. 6B, the tracking sub-period Ttrack of the sensing driving period in the second sensing mode can be a period for changing the voltage V2 of the second node N2 of the driving transistor DRT for a preset tracking time Δt until the voltage V2 of the second node N2 of the driving transistor DRT reaches a voltage containing mobility of the driving transistor DRT or a shift in the mobility.

During the tracking sub-period Ttrack, the preset tracking time Δt can be set to a relatively short time. Therefore, it can be difficult for the voltage V2 of the second node N2 of the driving transistor DRT to contain the threshold voltage Vth of the driving transistor DRT for a short tracking time Δt. To address this issue, the voltage V2 of the second node N2 of the driving transistor DRT can be changed enough to determine the mobility of the driving transistor DRT for such a short tracking time Δt.

Accordingly, the second sensing mode can be a sensing driving method for sensing the mobility of a driving transistor DRT.

During the tracking sub-period Ttrack, as the power switch SPRE is turned off or the sensing transistor SENT is turned off, the second node N2 of the driving transistor DRT can be electrically floating.

During the tracking sub-period Ttrack, the scan transistor SCT can be turned off by a scan signal SC of a turn-off level voltage, and the first node N1 of the driving transistor DRT can be also electrically floating.

During the initialization sub-period Tinit, a voltage difference between the first node N1 and the second node N2 of the driving transistor DRT, which has been initialized, can be greater than or equal to the threshold voltage Vth of the driving transistor DRT. Accordingly, when the tracking sub-period Ttrack is initiated, the driving transistor DRT can be turned on and allow current to flow.

The voltage difference between the first node N1 and the second node N2 of the driving transistor DRT can be denoted by Vgs when the first node N1 and the second node N2 of the driving transistor DRT are the gate node and the source node, respectively.

Accordingly, during the tracking sub-period Ttrack, the voltage V2 of the second node N2 of the driving transistor DRT can increase. In this situation, the voltage V1 of the first node N1 of the driving transistor DRT can also increase.

During the tracking sub-period Ttrack, an increasing rate of the voltage V2 of the second node N2 of the driving transistor DRT can vary depending on the current capability (i.e., mobility) of the driving transistor DRT. As the driving transistor DRT has greater current capability (mobility), the voltage V2 of the second node N2 of the driving transistor DRT can increase more steeply.

After the tracking sub-period Ttrack progresses for the preset tracking time $\Delta t$, for example, after the voltage V2 of the second node N2 of the driving transistor DRT increases for the preset tracking time $\Delta t$, the sampling sub-period Tsam can proceed.

During the tracking sub-period Ttrack, an increasing rate of the voltage V2 of the second node N2 of the driving transistor DRT can corresponds to an amount of voltage variance $\Delta V$ in the second node N2 of the driving transistor DRT during the preset tracking time $\Delta t$. The amount of voltage variance $\Delta V$ in the second node N2 of the driving transistor DRT can correspond to an amount of voltage variance in the reference voltage line RVL.

Referring to FIG. 6B, after the tracking sub-period Ttrack progresses for the preset tracking time $\Delta t$, the sampling sub-period Tsam can be initiated. During the sampling sub-period Tsam, the sampling switch SAM can be turned on, and the reference voltage line RVL and the analog-to-digital converter ADC can be electrically connected.

The analog-to-digital converter ADC can sense a voltage of the reference voltage line RVL. The voltage Vsen sensed by the analog-to-digital converter ADC can be a voltage (Vref+$\Delta V$) increased from the reference voltage Vref by the amount of voltage variance $\Delta V$ for the preset tracking time $\Delta t$.

The voltage Vsen sensed by the analog-to-digital converter ADC can be the voltage of the reference voltage line RVL, and be the voltage of the second node N2 electrically connected to the reference voltage line RVL through the sensing transistor SENT.

Referring to FIG. 6B, in the sampling sub-period Tsam of the sensing driving period in the second sensing mode, the voltage Vsen sensed by the analog-to-digital converter ADC can vary depending on the mobility of the driving transistor DRT. As the driving transistor DRT has higher mobility, the sensing voltage Vsen can increase. As the driving transistor DRT has lower mobility, the sensing voltage Vsen can decrease.

As described above, the sensing driving method for sensing the mobility of a driving transistor DRT (i.e., the second sensing mode) is sometimes referred to as a fast mode since this method can be executed by changing the voltage of the second node N2 of the driving transistor DRT for such a short period of time $\Delta t$.

Referring to FIG. 6A, the compensator COMP can detect a threshold voltage Vth or a shift in the threshold voltage Vth of a driving transistor DRT of a corresponding subpixel SP based on sensing data corresponding to a voltage Vsen sensed through the first sensing mode, determine a threshold voltage compensation value for reducing or eliminating a difference in threshold voltages between driving transistors DRT, and store the acquired threshold voltage compensation value in the memory MEM.

Referring to FIG. 6B, the compensator COMP can detect mobility or a shift in the mobility of a driving transistor DRT of a corresponding subpixel SP based on sensing data corresponding to a voltage Vsen sensed through the second sensing mode, determine a mobility compensation value for reducing or eliminating a difference in mobilities between driving transistors DRT, and store the acquired mobility compensation value in the memory MEM.

The controller 140 can modify data Data based on the threshold voltage compensation value $\Phi$ and mobility compensation value a stored in the memory MEM, and supply the modified data (Data'=$\alpha$×Data+$\Phi$) to the data driving circuit 120.

The data driving circuit 120 can convert the data (Data'=$\alpha$×Data+$\Phi$) supplied by the controller 140 into a data voltage Vdata, and supply the converted data voltage Vdata to the corresponding subpixel SP. The data voltage Vdata supplied to the corresponding subpixel SP can be a data voltage Vdata capable of reducing a difference in threshold voltages and a difference in mobilities.

As described above, since a long sensing time is required for threshold voltage sensing, and a short sensing time is sufficient for mobility sensing, therefore, the threshold voltage sensing can be performed in the first sensing mode corresponding to the slow sensing mode, and the mobility sensing can be performed in the second sensing mode corresponding to the fast sensing mode.

Figure 7:
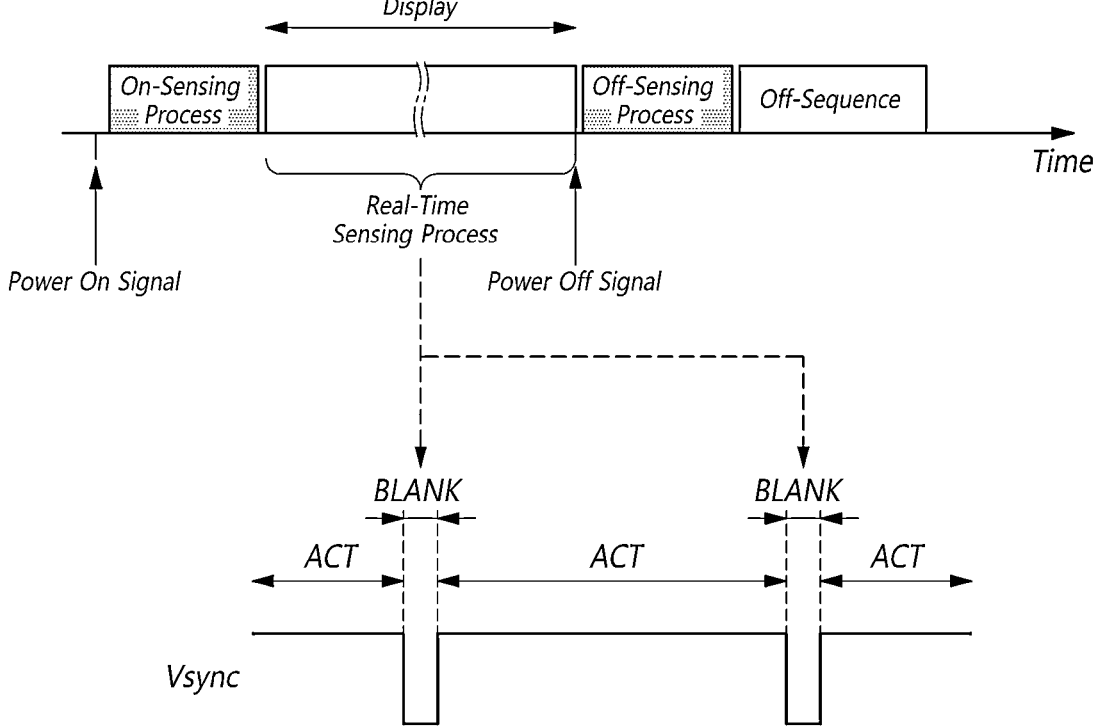
FIG. 7 illustrates various example sensing driving timings of the display device according aspects of the present disclosure.

FIG. 7 illustrates various sensing driving timings (various sensing periods) defined in the display device 100 according to aspects of the present disclosure.

Referring to FIG. 7, in an embodiment, when a power-on signal is generated, the display device 100 according to aspects of the present disclosure can sense respective characteristic values of corresponding driving transistors of all or one or more of a plurality subpixel SP disposed in the display panel 110. This sensing process can be referred to as an "on-sensing process".

In another embodiment, when a power-off signal is generated, before an off-sequence such as switch-off of power proceeds, the display device 100 can also sense respective characteristic values of corresponding driving transistors of all or one or more of the plurality subpixels SP disposed in the display panel 110. This sensing process can be referred to as an "off-sensing process".

In further another embodiment, while display driving is being performed after the power-on signal is generated and before the power-off signal is generated, the display device 100 can also sense respective characteristic values of corresponding driving transistors of all or one or more of the plurality subpixels SP. This sensing process can be referred to as a "real-time sensing process".

The real-time sensing process can be performed every blank period BLANK between active periods ACT based on a vertical synchronization signal Vsync.

As discussed above, a relatively short period of time can be sufficient for sensing the mobility of a driving transistor DRT, and therefore, mobility sensing can be performed in the second sensing mode, which is the faster sensing mode among the two sensing modes.

Since a relatively short period of time is sufficient for mobility sensing, mobility sensing can be performed using any one of the on-sensing process, the off-sensing process, and the real-time sensing process. For example, mobility sensing, which can be performed in the second sensing mode, can be performed in the real-time sensing process that can reflect a variance in mobility in real time while the display is being driving. Accordingly, mobility sensing can be performed every blank period BLANK while the display is being driven.

As discussed above, threshold voltage sensing of a driving transistor DRT can require a relatively long sensing time including a long saturation time Tsat. Accordingly, threshold voltage sensing can be performed in the first sensing mode corresponding to the slow sensing mode among the two sensing modes.

Since threshold voltage sensing has a relatively long sensing time, threshold voltage sensing is desired to be performed using timing that does not interfere with the user's viewing. Accordingly, threshold voltage sensing of a driving transistor DRT can be performed after a power-off signal is generated by an input event from a user, and the like. For example, the threshold voltage sensing can be performed in a period during which the display device 100 is not driven for display image or a situation in which the user has no intention of viewing. In this manner, threshold voltage sensing can be performed using the off-sensing process.

Figure 8:
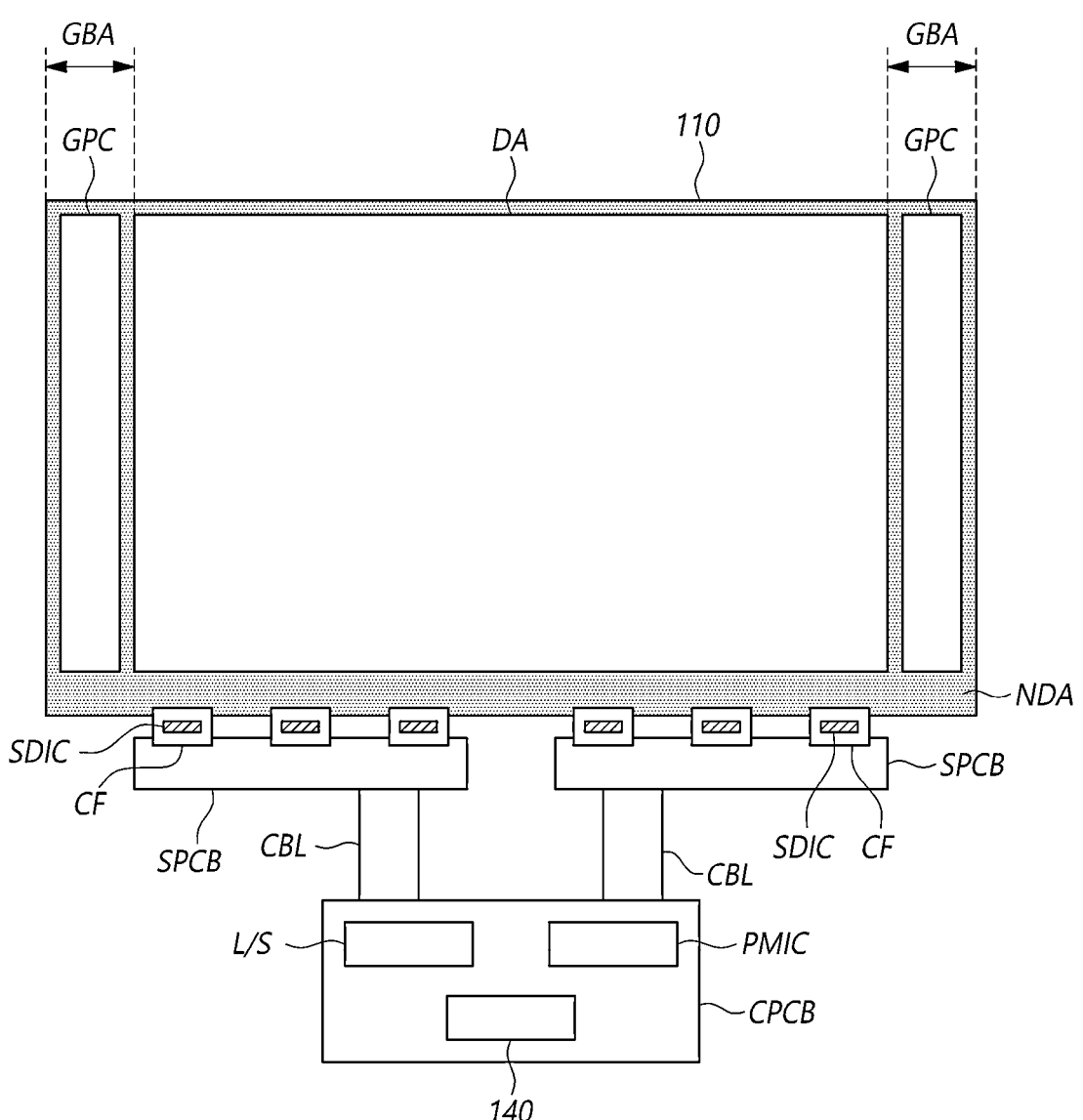
FIG. 8 illustrates an example system configuration of the display device according to aspects of the present disclosure.

FIG. 8 illustrates an example system configuration of the display device according to aspects of the present disclosure.

Referring to FIG. 8, the display panel 110 can include a display area DA in which one or more images can be displayed and a non-display area NDA in which an image is not displayed.

According to the configuration of FIG. 8, a data driving circuit 120 (e.g., the data driving circuit 120 discussed above with reference to FIG. 1) can include a plurality of source driver integrated circuits SDIC and can be implemented using the chip-on-film (COF) technique. For example, each of the plurality of source driver integrated circuits SDIC can be mounted on a corresponding circuit film CF connected to the non-display area NDA of the display panel 110. In this example, the circuit film CF can be also referred to as a flexible printed circuit.

In an embodiment, in the configuration of FIG. 8, one or more gate driving circuits 130 can be implemented using the gate-in-panel (GIP) technique. Hereinafter, a gate driving circuit 130 implemented using the gate-in-panel (GIP) technique can be also referred to as a gate driving panel circuit GPC.

One or more gate driving panel circuit GPC can be located in the non-display area NDA of the display panel 110. In an embodiment, in the configuration of FIG. 8, one or more gate driving panel circuits GPC can be located in, and/or electrically connected to, but not limited to, one or more areas of the non-display area NDA of the display panel 110. For example, the one or more gate driving panel circuits GPC can be located in, and/or electrically connected to, only one side or portion (e.g., a left edge, a right edge, an upper edge, or a lower edge), or two sides or portions (e.g., a left edge and a right edge, an upper edge and a lower edge, or the like) of the display panel 110. Hereinafter, two or more gate driving panel circuits GPC, which are gate driving circuits 130 configured using the GIP technique, can be disposed in the display panel 110 as shown in FIG. 8; however, for merely convenience of description, discussions related to the gate driving panel circuits GPC will be provided by restricting to one gate driving panel circuit GPC unless explicitly stated otherwise. It should be therefore understood that the scope of the present disclosure includes examples where the two or more gate driving panel circuits GPC are disposed in the display panel 110.

The display device 100 can include at least one source printed circuit board SPCB and a control printed circuit board CPCB for a circuital connection between the plurality of source driver integrated circuits SDIC and other devices or components (e.g., the controller 140, the level shifter L/S, the power management integrated circuit PMIC, and the like).

At least one circuit film CF on which a corresponding source driver integrated circuit SDIC is mounted can be connected to a corresponding one of the at least one source printed circuit board SPCB. For example, a first side of each of the at least one circuit film CF on which a corresponding source driver integrated circuit SDIC is mounted can be electrically connected to the display panel 110, and a second opposing side thereof can be electrically connected to the source printed circuit board SPCB.

A controller 140 (e.g., the controller 140 discussed above with reference to FIG. 1) and a power management integrated circuit PMIC can be mounted on the control printed circuit board CPCB.

The controller 140 can perform an overall control function related to the driving of the display panel 110 and control operations of the plurality of source driver integrated circuits SDIC and the gate driving panel circuit GPC.

The power management integrated circuit PMIC can supply various types of voltages or currents to the plurality of source driver integrated circuits SDIC, the gate driving panel circuit GPC, and the like, or control the various types of voltages or currents to be supplied.

A circuital connection between the at least one source printed circuit board SPCB and the control printed circuit board CPCB can be performed through at least one connection cable CBL. For example, the connection cable CBL can be one of a flexible printed circuit (FPC) and a flexible flat cable (FFC).

In an embodiment, the at least one source printed circuit board SPCB and the control printed circuit board CPCB can be integrated into one printed circuit board.

In an embodiment, the display device 100 according to aspects of the present disclosure can further include at least one level shifter L/S for adjusting a voltage level of a signal. For example, the level shifter L/S can be disposed on the control printed circuit board CPCB or the at least one source printed circuit board SPCB.

In an embodiment, in the display device 100 according to aspects of the present disclosure, the level shifter L/S can output signals needed for gate driving to the gate driving panel circuit GPC, which is the gate driving circuit 130 configured using the GIP technique.

For example, the power management integrated circuit PMIC can supply a signal to the level shifter L/S. The level shifter L/S can adjust a voltage level of the signal supplied by the power management integrated circuit PMIC. The signal whose voltage level has been adjusted by the level shifter L/S can be supplied to the gate driving panel circuit GPC.

For example, the level shifter L/S can supply a plurality of clock signals with different phases to the gate driving panel circuit GPC. The gate driving panel circuit GPC can generate a plurality of gate signals (e.g., at least one scan signal SC, at least one sensing signal SE, and the like) based on the plurality of clock signals supplied by the level shifter L/S, and output the generated gate signals to a plurality of gate lines (e.g., at least one scan signal line SCL, at least one sensing signal line SENL, and the like).

Referring to FIG. 8, the non-display area NDA of the display panel 110 can include one or more gate bezel areas GBA. FIG. 8 illustrates two or more gate bezel areas GBA disposed in the non-display area NDA, but for merely convenience of description, discussions related to the gate bezel areas GBA will be provided by restricting to one gate bezel area GBA unless explicitly stated otherwise. It should be therefore understood that the scope of the present disclosure includes examples where the two or more gate bezel areas GBA are disposed in the non-display area NDA. The gate bezel area GBA can refer to an area where the gate driving panel circuit GPC, which is the gate driving circuit 130 configured using the GIP technique, and several types of lines connected to the gate driving panel circuit GPC are disposed.

Referring to FIG. 8, the several types of lines connected to the gate driving panel circuit GPC can include one or more clock lines, one or more high level gate voltage lines, and one or more low level gate voltage lines, and the like.

Hereinafter, discussions are provided on an example configuration of the gate driving panel circuit GPC and an example structure of the gate bezel area GBA where the gate driving panel circuit GPC is disposed in the display device 100 according to aspects of the present disclosure.

Figure 9:
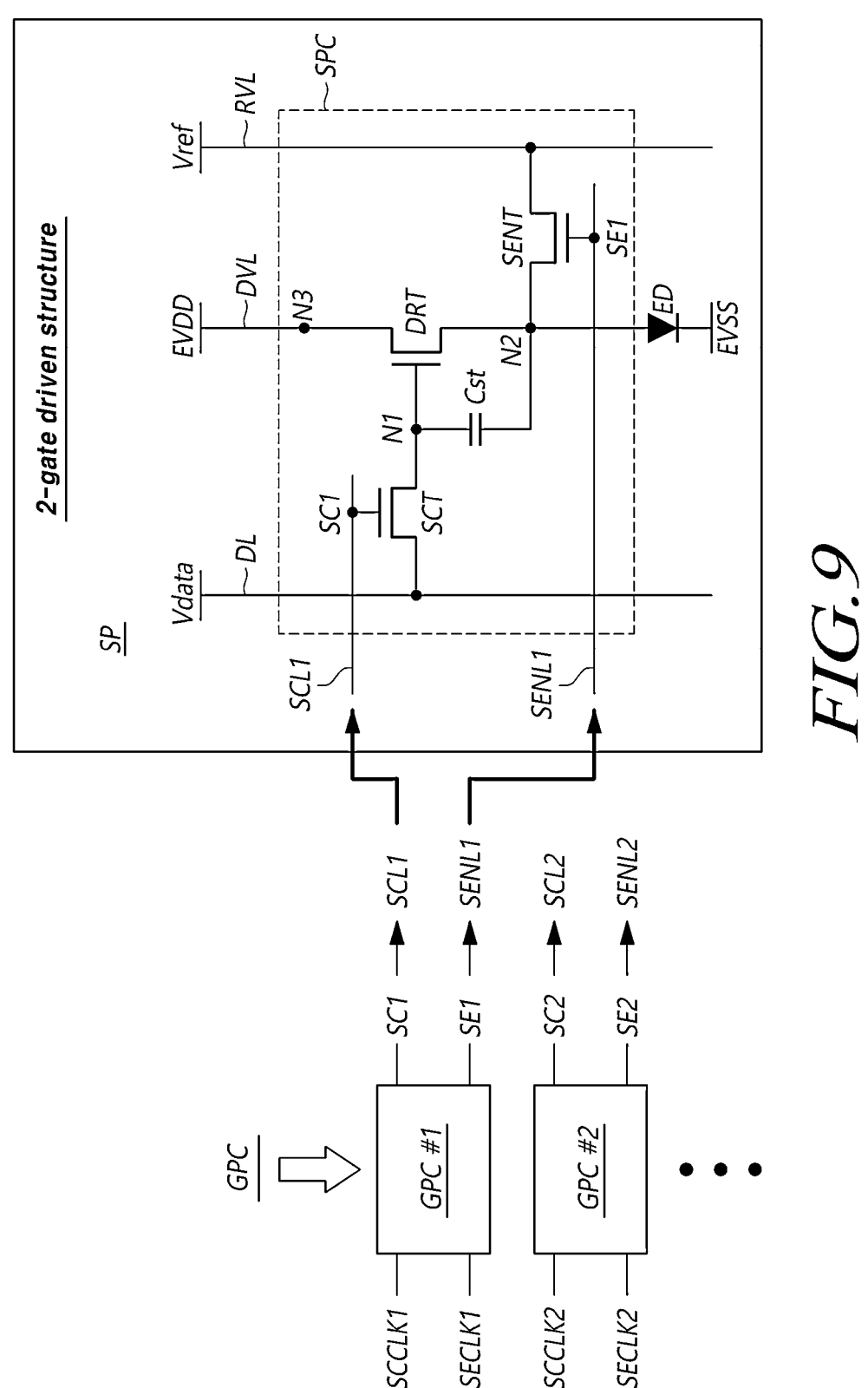
FIG. 9 illustrates inputs and outputs of an example gate driving panel circuit in the display device according to aspects of the present disclosure.

FIG. 9 illustrates inputs and outputs of an example gate driving panel circuit GPC in the display device 100 according to aspects of the present disclosure.

Referring to FIG. 9, in one or more embodiments, the gate driving panel circuit GPC can include a first gate driving panel circuit GPC #1 for outputting a first scan signal SC1 and a first sensing signal SE1, and a second gate driving panel circuit GPC #2 for outputting a second scan signal SC2 and a second sensing signal SE2.

The first gate driving panel circuit GPC #1 can receive a first scan clock signal SCCLK1 and a first sensing clock signal SECLK1, and output the first scan signal SC1 and the first sensing signal SE1.

The first scan clock signal SCCLK1 and the first sensing clock signal SECLK1 can be output by a level shifter L/S.

The first scan signal SC1 and the first sensing signal SE1 can be applied to a first scan signal line SCL1 and a first sensing signal line SENL1, respectively.

The first scan signal line SCL1 and the first sensing signal line SENL1 can be connected to a first subpixel SP.

Referring to FIG. 9, the second gate driving panel circuit GPC #2 can receive a second scan clock signal SCCLK2 and a second sensing clock signal SECLK2, and output the second scan signal SC2 and the second sensing signal SE2.

The second scan clock signal SCCLK2 and the second sensing clock signal SECLK2 can be output by a level shifter L/S.

The second scan signal SC2 and the second sensing signal SE2 can be applied to a second scan signal line SCL2 adjacent to the first scan signal line SCL1 and a second sensing signal line SENL2 adjacent to the first sensing signal line SENL1, respectively.

The second scan signal line SCL2 and the second sensing signal line SENL2 can be connected to a second subpixel SP adjacent to the first subpixel SP.

Figure 10:
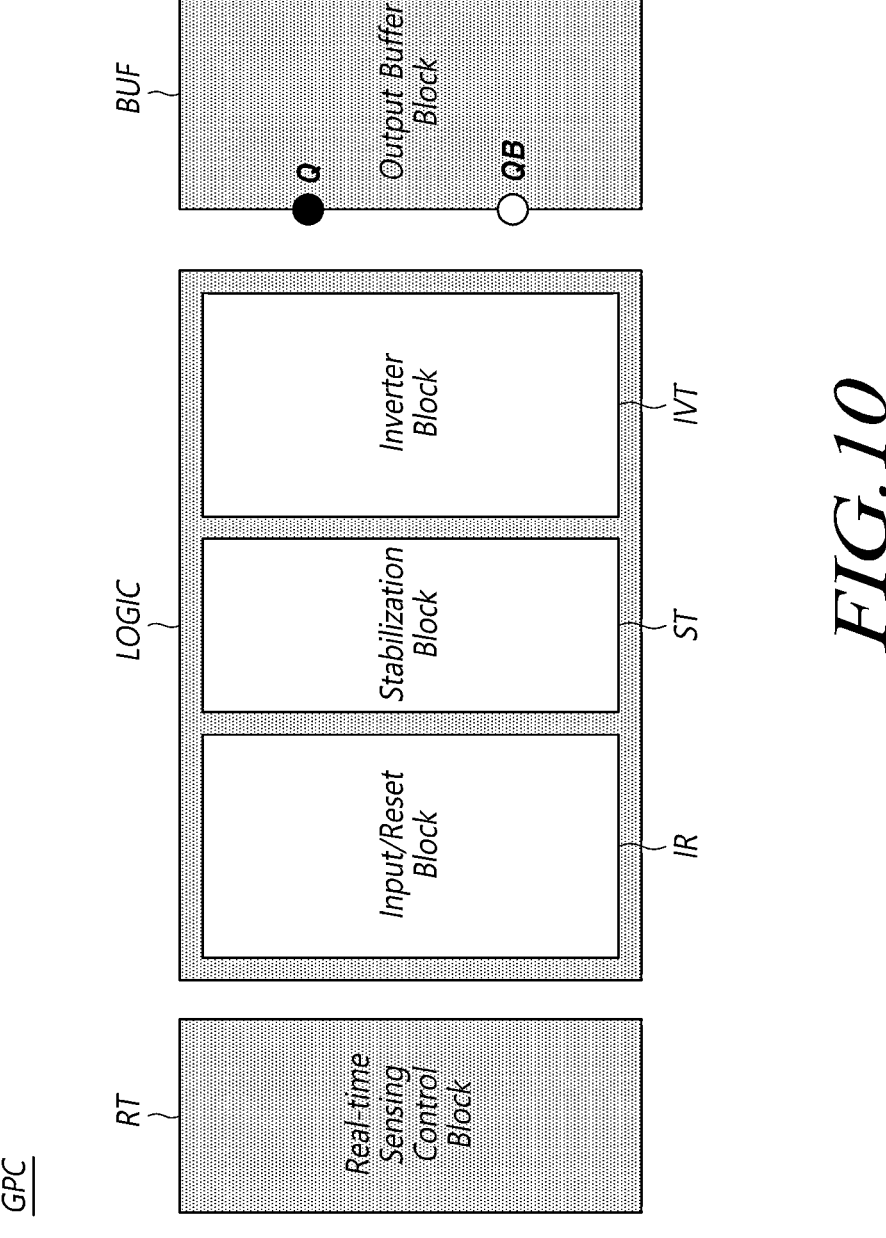
FIG. 10 illustrates an example system configuration of a gate driving panel circuit in the display device according to aspects of the present disclosure.

FIG. 10 illustrates an example system configuration of a gate driving panel circuit GPC (e.g., the gate driving panel circuit in FIG. 9) in the display device 100 according to aspects of the present disclosure.

Referring to FIG. 10, the gate driving panel circuit GPC can include an output buffer block BUF, a logic block LOGIC, and a real-time sensing control block RT.

The output buffer block BUF can be configured to output two or more gate signals. For example, the output buffer block BUF included in the gate driving panel circuit GPC can output at least one scan signal SC and at least one sensing signal SE. The output buffer block BUF can be configured to output the plurality of scan signals during each active period and output one of the plurality of scan signals during any one blank period among a plurality of blank periods. In this example, subpixels SP included in the display device 100 can have the two-gate driven structure illustrated in FIG. 3.

The output buffer block BUF can be controlled depending on respective voltage values or voltage levels of a Q node and a QB node. The operation and output of the output buffer block BUF can vary depending on the voltage values or voltage levels of the Q node and QB node.

The Q node and QB node can have different voltage levels. For example, during a first period, when a voltage of the Q node is a high level voltage, a voltage of the QB node can be a low level voltage. During a second period before or after the first period, when a voltage of the Q node is a low level voltage, a voltage of the QB node can be a high level voltage.

Referring to FIG. 10, the logic block LOGIC can be a circuit block configured to control the operation of the output buffer block BUF and implement the operation of a shift register. The logic block LOGIC can control voltages of the Q node and QB node to control the operation of the output buffer block BUF.

The logic block LOGIC can include an input and reset block IR, a stabilization block ST, an inverter block IVT, and the like.

The input and reset block IR can be a circuit block configured to control charging and discharging of the Q node. The inverter block IVT can be configured to control an electrical value (or level) of the Q node or the QB node such that a voltage level resulting from inverting a voltage level of the Q node becomes a voltage level of the QB node depending on a voltage of the Q node. The stabilization block ST can be configured to stabilize the Q node and the output of the gate driving panel circuit GPC depending on a voltage of the QB node during a period during which an output signal of the gate driving panel circuit GPC has a turn-off level voltage.

Each of the input and reset block IR, the stabilization block ST, and inverter block IVT can include at least one transistor.

The real-time sensing control block RT can be a circuit block configured to control the operation of the output buffer block BUF for real-time sensing driving. The real-time sensing driving can be a sensing driving performed in real time while the display is being driven, and be a sensing driving performed in each blank period BLANK between active periods ACT (see FIG. 7). The real-time sensing control block RT can be configured to charge the Q node during any one blank period among the plurality of blank periods. The real-time sensing driving can proceed in the second sensing mode corresponding to a fast sensing mode (see FIG. 6B). The real-time sensing driving can be a sensing driving for sensing the mobility of a corresponding driving transistor DRT of each subpixel SP (see FIG. 6B).

The real-time sensing control block RT can include at least one transistor.

The real-time sensing control block RT can be configured to control voltages of the Q node and the QB node so that the output buffer block BUF can output a scan signal SC and a sensing signal SE to a subpixel SP where real-time sensing driving is performed.

Figure 11:
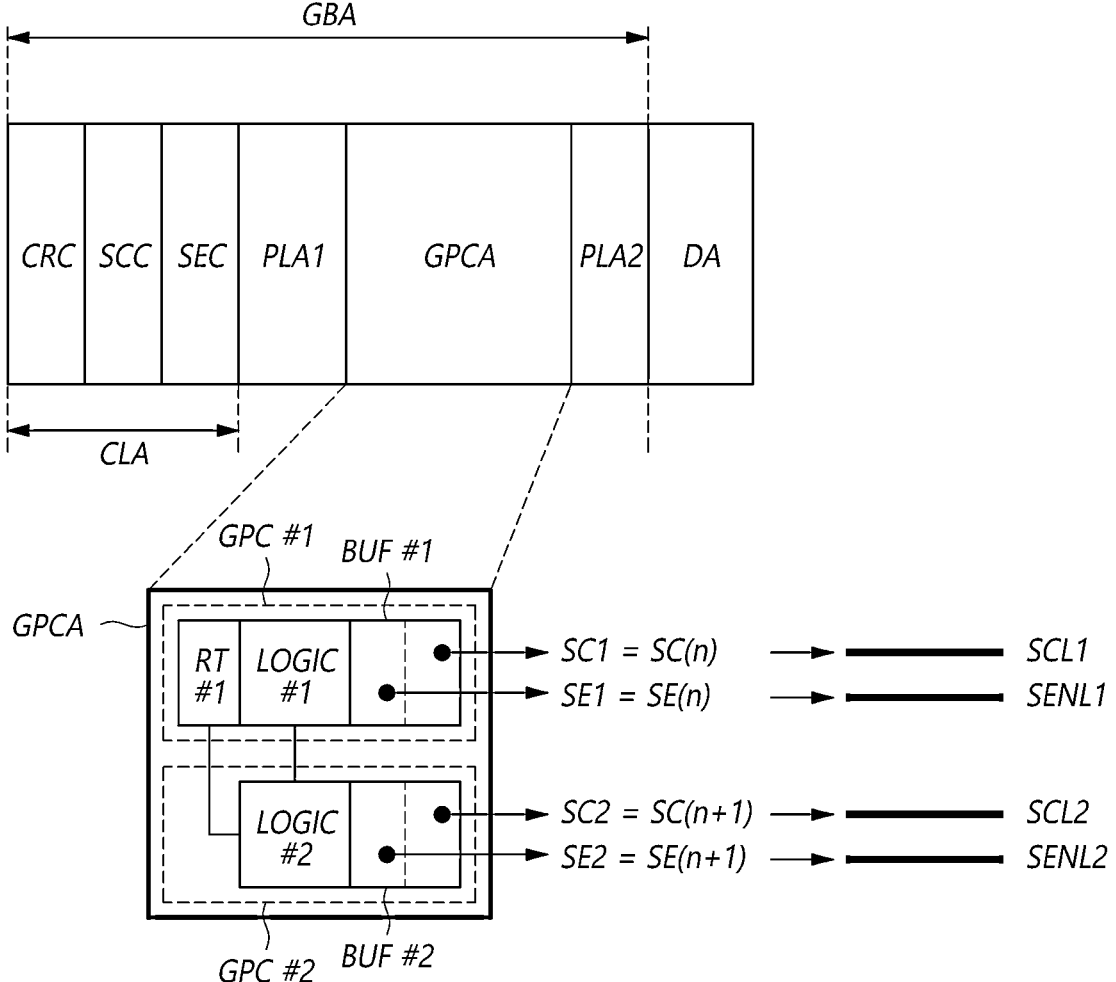
FIG. 11 illustrates an example configuration of a gate bezel area of the display panel according to aspects of the present disclosure.

FIG. 11 illustrates an example configuration of the gate bezel area GBA of the display panel 110 according to aspects of the present disclosure.

Referring to FIG. 11, in one or more embodiments, the gate bezel area GBA of the display panel 110 can include a clock signal line area CLA, a first power line area PLA1, a gate driving panel circuit area GPCA, a second power line area PLA2, and the like.

The gate driving panel circuit area GPCA can be an area in which a gate driving panel circuit GPC (e.g., the gate driving panel circuit GPC discussed above with reference to FIG. 9) is disposed. The gate driving panel circuit GPC can supply scan signals SC and sensing signals SE to be supplied to subpixels SP having the two-gate driving structure.

In an embodiment, several types of lines for carrying power, voltage, and signals to the gate driving panel circuit GPC can be disposed around the gate driving panel circuit area GPCA. For example, the clock signal line area CLA, the first power line area PLA1, and the second power line area PLA2 can be disposed around the gate driving panel circuit area GPCA of the gate bezel area GBA.

For example, the clock signal line area CLA and the first power line area PLA1 can be located on a first side of the gate driving panel circuit area GPCA, and the second power line area PLA2 can be located on a second opposing side of the gate driving panel circuit area GPCA.

For example, the gate driving panel circuit area GPCA can be located on a first side of the second power line area PLA2, and the display area DA can be located on a second opposing side of the second power line area PLA2.

The clock signal line area CLA can be an area in which clock signal lines are disposed for delivering several types of clock signals to the gate driving panel circuit GPC.

The first power line area PLA1 can be an area in which at least one gate high voltage line is disposed for delivering at least one gate high voltage to the gate driving panel circuit GPC.

In an embodiment, at least one control signal line for delivering at least one control signal to the gate driving panel circuit GPC can be further disposed in the first power line area PLA1. For example, the at least one control signal can include at least one of a start signal, a reset signal, and a line selection signal.

The second power line area PLA2 can be an area in which at least one gate low voltage line is disposed for delivering at least one gate low voltage to the gate driving panel circuit GPC.

Referring to FIG. 11, in an embodiment, the clock signal line area CLA can include a carry clock signal line area CRC, a scan clock signal line area SCC, and a sensing clock signal line area SEC.

The carry clock signal line area CRC can be an area in which carry clock signal lines are disposed for delivering carry clock signals to the gate driving panel circuit GPC.

The scan clock signal line area SCC can be an area in which scan clock signal lines are disposed for delivering scan clock signals to the gate driving panel circuit GPC.

The sensing clock signal line area SEC can be an area in which sensing clock signal lines are disposed for delivering sensing clock signals to the gate driving panel circuit GPC.

An order in which the carry clock signal line area CRC, the scan clock signal line area SCC, and the sensing clock signal line area SEC are located can be set in various orders (e.g., CRC-SCC-SEC, SCC-CRC-SEC, SCC-SEC-CRC, SEC-SCC-CRC, or the like).

For example, among the carry clock signal line area CRC, the scan clock signal line area SCC, and the sensing clock signal line area SEC, the scan clock signal line area SCC can be located between the carry clock signal line area CRC and the sensing clock signal line area SEC, and the carry clock signal line area CRC can be located further away from the display area DA or the gate driving panel circuit area GPCA than the sensing clock signal line area SEC.

Referring to FIG. 11, the gate driving panel circuit GPC disposed in the gate driving panel circuit area GPCA can include a first gate driving panel circuit GPC #1 and a second gate driving panel circuit GPC #2. Each of the first gate driving panel circuit GPC #1 and the second gate driving panel circuit GPC #2 can have a separate Q node and a separate QB node.

The first gate driving panel circuit GPC #1 can include a first output buffer block BUF #1, a first logic block LOGIC #1, and a first real-time sensing control block RT #1.

The first output buffer block BUF #1 can be configured to output a first scan signal SC1 and a first sensing signal SE1 respectively to a first scan signal line SCL1 and a first sensing signal line SENL1 connected to a first subpixel SP. For example, the first scan signal SC1 can be an n-th scan signal SC (n), and the first sensing signal SE1 can be an n-th sensing signal SE (n).

The first logic block LOGIC #1 can be configured to control operation of the first output buffer block BUF #1 by controlling respective voltages of Q and QB nodes of the first gate driving panel circuit GPC #1.

The second gate driving panel circuit GPC #2 can include only a second output buffer block BUF #2 and a second logic block LOGIC #2.

The second output buffer block BUF #2 can be configured to output a second scan signal SC2 and a second sensing signal SE2 respectively to a second scan signal line SCL2 and a second sensing signal line SENL2 connected to a second subpixel SP. For example, the second scan signal SC2 can be an (n+1)-th scan signal SC (n+1), and the second sensing signal SE2 can be an (n+1)-th sensing signal SE (n+1).

The second logic block LOGIC #2 can be configured to control operation of the second output buffer block BUF #2 by controlling respective voltages of the Q node and the QB node of the second gate driving panel circuit GPC #2.

The first real-time sensing control block RT #1 can be shared by the first gate driving panel circuit GPC #1 and the second gate driving panel circuit GPC #2. Accordingly, the size of the gate bezel area GBA can be significantly reduced.

The first real-time sensing control block RT #1 can be configured to control operation of the first output buffer block BUF #1 so that the first output buffer block BUF #1 can output a first scan signal SC1 and a first sensing signal SE1 for sensing driving to a corresponding first subpixel SP where real-time sensing driving will be performed by controlling respective voltages of the Q node and QB node of the first gate driving panel circuit GPC #1 during a first real-time sensing driving period (a first blank period).

The first real-time sensing control block RT #1 can be configured to control operation of the second output buffer block BUF #2 so that the second output buffer block BUF #2 can output a second scan signal SC2 and a second sensing signal SE2 for sensing driving to a corresponding second subpixel SP where real-time sensing driving will be performed by controlling respective voltages of the Q node and QB node of the second gate driving panel circuit GPC #2 during a second real-time sensing driving period (a second blank period), which is different from the first real-time sensing driving period (the first blank period).

At least one specific node of the first logic block LOGIC #1 and at least one specific node of the second logic block LOGIC #2 can be electrically connected to each other.

Referring to FIG. 11, among the first output buffer block BUF #1, the first logic block LOGIC #1, and the first real-time sensing control block RT #1, the first real-time sensing control block RT #1 can be located furthest away from the display area DA.

Referring to FIG. 11, the gate driving panel circuit area GPCA can be disposed between the first power line area PLA1 and the second power line area PLA2.

Accordingly, at least one gate high voltage line disposed in the first power line area PLA1 and at least one gate low voltage line disposed in the second power line area PLA2 can be separated by the gate driving panel circuit GPC disposed in the gate driving panel circuit area GPCA.

According to the configuration of the power-related lines and areas discussed above, since at least one high voltage line and at least one low voltage line do not overlap with each other, one or more high voltages (e.g., GVDD, GVDD2, GVDD_o, and GVDD_e in FIG. 12) and one or more low voltages (e.g., GVSS0, GVSS1, and GVSS2 of FIG. 12) can be stabilized or stably supplied.

Figure 12:
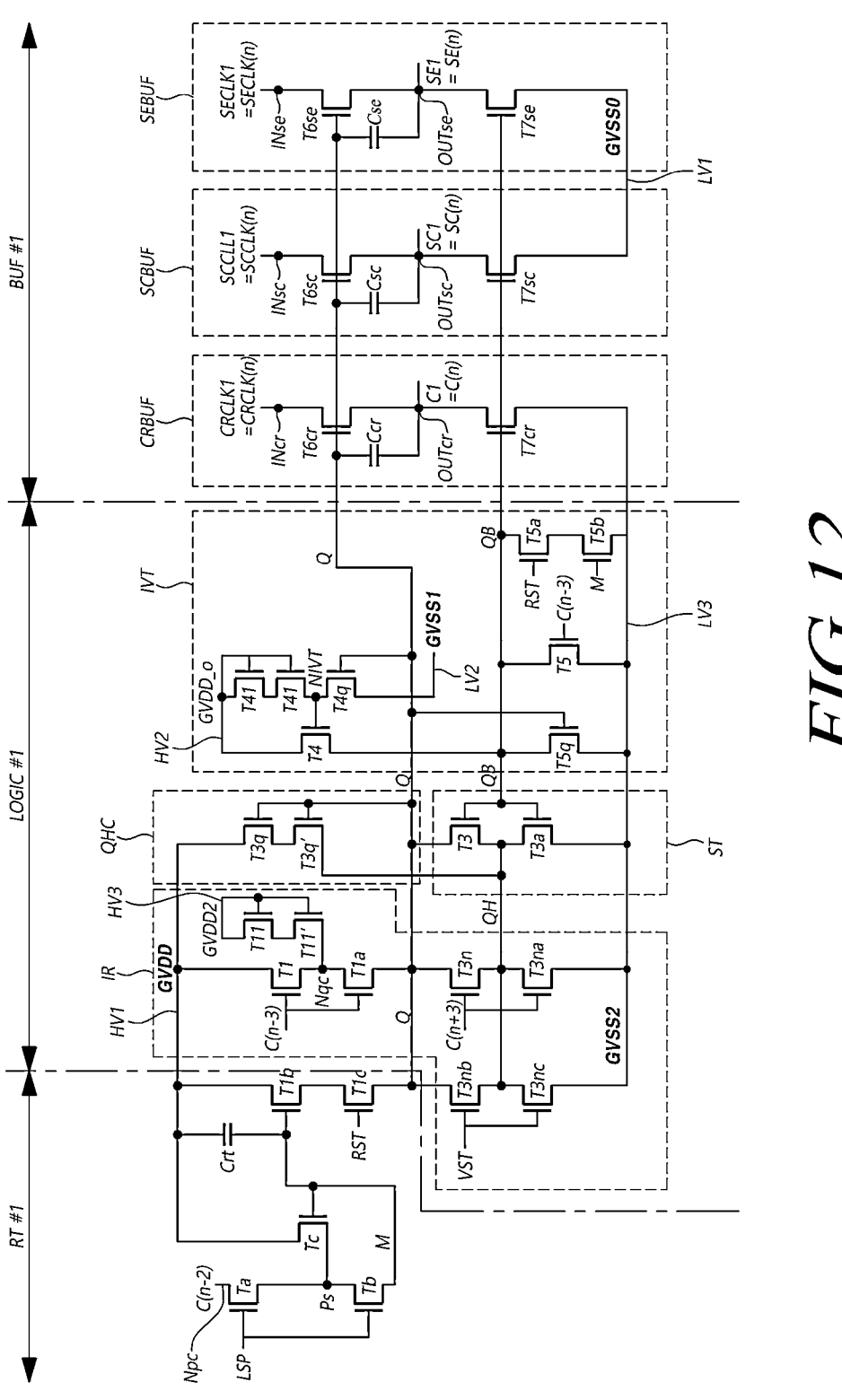
FIG. 12 illustrates an example first gate driving panel circuit included in the gate driving panel circuit according to aspects of the present disclosure.

FIG. 12 illustrates an example first gate driving panel circuit GPC #1 included in the gate driving panel circuit GPC according to aspects of the present disclosure.

In this implementation, the first gate driving panel circuit GPC #1 can be configured to output an odd-numbered n-th scan signal SC (n) and an odd-numbered n-th sensing signal SE (n). The n-th scan signal SC (n) can be supplied to an odd-numbered n-th scan signal line SCL, and the n-th sensing signal SE (n) can be supplied to an odd-numbered n-th sensing signal line SENL. Hereinafter, for convenience of description, the n-th scan signal SC (n) can be also referred to as a first scan signal SC1, and the n-th sensing signal SE (n) can be also referred to as a first sensing signal SE1.

Referring to FIG. 12, the first gate driving panel circuit GPC #1 can include a first output buffer block BUF #1, a first logic block LOGIC #1, and a first real-time sensing control block RT #1.

The first output buffer block BUF #1 can include a carry output buffer CRBUF, a scan output buffer SCBUF, and a sensing output buffer SEBUF.

The carry output buffer CRBUF can include a carry pull-up transistor Tocr and a carry pull-down transistor T7*cr*.

The carry pull-up transistor Tocr can be turned on or turned off depending on a voltage of a Q node, and thereby, control a connection between a carry clock node INcr to which an n-th carry clock signal CRCLK (n) is input and a carry output node OUTer from which an n-th carry signal C(n) is output. Here, the n-th carry clock signal CRCLK (n) can also be referred to as a first carry clock signal CRCLK1, and the n-th carry signal C(n) can also be referred to as a first carry signal C1.

The gate node of the carry pull-up transistor Tocr can be the Q node or be electrically connected to the Q node. The source node (or drain node) of the carry pull-up transistor T6*cr* can be the carry output node OUTer or be electrically connected to the carry output node OUTcr. The drain node (or source node) of the carry pull-up transistor Tocr can be the carry clock node INcr or be electrically connected to the carry clock node INcr.

When the carry pull-up transistor T6*cr* is turned on, the carry pull-up transistor T6*cr* can output the first carry signal C1 having a high level voltage using the first carry clock signal CRCLK1.

The carry output buffer CRBUF can further include a carry bootstrapping capacitor Ccr connected between the gate node and the source node (or drain node) of the carry pull-up transistor T6*cr*.

The carry pull-down transistor T7*cr* can be turned on or turned off depending on a voltage of a QB node, and thereby, control a connection between a third gate low voltage node LV3 to which a third gate low voltage GVSS2 is input and the carry output node OUTcr from which the n-th carry signal C(n) is output.

The gate node of the carry pull-down transistor T7*cr* can be the QB node or can be electrically connected to the QB node. The drain node or source node of the carry pull-down transistor T7*cr* can be the third gate low voltage node LV3 or be electrically connected to the third gate low voltage node LV3, and the source node or drain node of the carry pull-down transistor T7*cr* can be the carry output node OUTer or be electrically connected to the carry output node OUTcr.

When the carry pull-down transistor T7*cr* is turned on, the carry pull-down transistor T7*cr* can output the first carry signal C1 having a low level voltage using the third gate low voltage GVSS2.

Referring to FIG. 12, the scan output buffer SCBUF can be configured to output an n-th scan signal SC (n) having a turn-on level voltage or a turn-off level voltage to a scan output node OUTsc. The n-th scan signal SC (n) output to the scan output node OUTsc can be applied to a first scan signal line SCL1 electrically connected to the scan output node OUTsc.

Referring to FIG. 12, the scan output buffer SCBUF can include a scan pull-up transistor T6*sc* and a scan pull-down transistor T7*sc*.

The scan pull-up transistor T6*sc* can be turned on or turned off depending on a voltage of the Q node, and thereby, control a connection between a scan clock node INsc to which an n-th scan clock signal SCCLK(n) is input and the scan output node OUTsc from which the n-th scan signal SC (n) is output. Here, the n-th scan clock signal SCCLK(n) can also be referred to as a first scan clock signal SCCLK1, and the n-th scan signal SC (n) can also be referred to as a first scan signal SC1.

The gate node of the scan pull-up transistor T6*sc* can be the Q node or be electrically connected to the Q node. The source node (or drain node) of the scan pull-up transistor T6*sc* can be the scan output node OUTsc or be electrically connected to the scan output node OUTsc. The drain node (or source node) of the scan pull-up transistor T6*sc* can be the scan clock node INsc or be electrically connected to the scan clock node INsc.

When the scan pull-up transistor T6*sc* is turned on, the scan pull-up transistor T6*sc* can output the first scan signal SC1 having a turn-on level voltage (e.g., a high level voltage) using the first scan clock signal SCCLK1 to the scan output node OUTsc. The first scan signal SC1 having the turn-on level voltage (e.g., the high level voltage) output from the scan pull-up transistor T6*sc* can be applied to the first scan signal line SCL1.

The scan output buffer SCBUF can further include a scan bootstrapping capacitor Csc connected between the gate node and the source node (or drain node) of the scan pull-up transistor T6*sc*.

The scan pull-down transistor T7*sc* can be turned on or turned off depending on a voltage of the QB node, and thereby, control a connection between a first gate low voltage node LV1 to which a first gate low voltage GVSS0 is input and the scan output node OUTsc from which the n-th scan signal SC (n) is output.

The gate node of the scan pull-down transistor T7*sc* can be the QB node or can be electrically connected to the QB node. The drain node or source node of the scan pull-down transistor T7*sc* can be the first gate low voltage node LV1 or be electrically connected to the first gate low voltage node LV1. The source node or drain node of the scan pull-down transistor T7*sc* can be the scan output node OUTsc or be electrically connected to the scan output node OUTsc.

When the scan pull-down transistor T7*sc* is turned on, the scan pull-down transistor T7*sc* can output the first scan signal SC1 having a turn-off level voltage (e.g., a low level voltage) using the first gate low voltage GVSS0 to the scan output node OUTsc. The first scan signal SC1 having the turn-off level voltage (e.g., the low level voltage) output from the scan pull-down transistor T7*sc* can be applied to the first scan signal line SCL1.

Referring to FIG. 12, the sensing output buffer SEBUF can be configured to output an n-th sensing signal SE (n) having a turn-on level voltage or a turn-off level voltage to a sensing output node OUTse. The n-th sensing signal SE (n) output to the sensing output node OUTse can be applied to a first sensing signal line SENL1 electrically connected to the sensing output node OUTse.

The sensing output buffer SEBUF can include a sensing pull-up transistor T6*se* and a sensing pull-down transistor T7*se*.

The sensing pull-up transistor T6*se* can be turned on or turned off depending on a voltage of the Q node, and thereby, control a connection between a sensing clock node INse to which an n-th sensing clock signal SECLK(n) is input and the sensing output node OUTse from which the n-th sensing signal SE (n) is output. Here, the n-th sensing clock signal SECLK(n) can also be referred to as a first sensing clock signal SECLK1, and the n-th sensing signal SE (n) can also be referred to as a first sensing signal SE1.

The gate node of the sensing pull-up transistor T6*se* can be the Q node or be electrically connected to the Q node. The source node (or drain node) of the sensing pull-up transistor T6*se* can be the sensing output node OUTse or be electrically connected to the sensing output node OUTse. The drain node (or source node) of the sensing pull-up transistor T6*se* can be the sensing clock node INse or be electrically connected to the sensing clock node INse.

When the sensing pull-up transistor T6*se* is turned on, the scan pull-up transistor T6*se* can output the first sensing signal SE1 having a turn-on level voltage (e.g., a high level voltage) using the first sensing clock signal SECLK1 to the sensing output node OUTse. The first sensing signal SE1 having the turn-on level voltage (e.g., the high level voltage) output from the sensing pull-up transistor T6*se* can be applied to the first sensing signal line SENL1.

The sensing output buffer SEBUF can further include a sensing bootstrapping capacitor Cse connected between the gate node and the source node (or drain node) of the sensing pull-up transistor T6*se*.

The sensing pull-down transistor T7*se* can be turned on or turned off depending on a voltage of the QB node, and thereby, control a connection between the first gate low voltage node LV1 to which the first gate low voltage GVSS0 is input and the sensing output node OUTse from which the n-th sensing signal SE (n) is output.

The gate node of the sensing pull-down transistor T7*se* can be the QB node or can be electrically connected to the QB node. The drain node or source node of the sensing pull-down transistor T7*se* can be the first gate low voltage node LV1 or be electrically connected to the first gate low voltage node LV1. The source node (or drain node) of the sensing pull-down transistor T7*se* can be the sensing output node OUTse or be electrically connected to the sensing output node OUTse.

When the sensing pull-down transistor T7*se* is turned on, the sensing pull-down transistor T7*se* can output the first sensing signal SE1 having a turn-off level voltage (e.g., a low level voltage) using the first gate low voltage GVSS0 to the sensing output node OUTse. The first sensing signal SE1 having the turn-off level voltage (e.g., the low level voltage) output from the sensing pull-down transistor T7*se* can be applied to the first sensing signal line SENL1.

The respective gate nodes of the carry pull-up transistor Tocr, the scan pull-up transistor T6*sc*, and the sensing pull-up transistor T6*se* included in the first output buffer block BUF #1 can be electrically connected to each other.

The Q node can be shared by the carry output buffer CRBUF, the scan output buffer SCBUF, and the sensing output buffer SEBUF included in the first output buffer block BUF #1. The Q node can be electrically connected to the gate node of the carry pull-up transistor Tocr, the gate node of the scan pull-up transistor T6*sc*, and the gate node of the sensing pull-up transistor T6*se*. This structure can also be referred to as a "Q node sharing structure."

The respective gate nodes of the carry pull-down transistor T7*cr*, the scan pull-down transistor T7*sc*, and the sensing pull-down transistor T7*se* included in the first output buffer block BUF #1 can be electrically connected to each other.

The QB node can be shared by the carry output buffer CRBUF, the scan output buffer SCBUF, and the sensing output buffer SEBUF included in the first output buffer block BUF #1. The Q node can be electrically connected to the gate node of the carry pull-down transistor T7*cr*, the gate node of the scan pull-down transistor T7*sc*, and the gate node of the sensing pull-down transistor T7*se*.

Referring to FIG. 12, the first logic block LOGIC #1 can be a circuit block configured to control voltages of the Q node and QB node to control operation of the first output buffer block BUF #1, and include an input and reset block IR, a stabilization block ST, and an inverter block IVT.

The input and reset block IR can be a circuit block configured to control charging and discharging of the Q node, and include a Q node charging block connected between a first gate high voltage node HV1 and the Q node and a Q node discharging block connected between the Q node and the third gate low voltage node LV3. For example, a first gate high voltage GVDD can be input to the first gate high voltage node HV1. The third gate low voltage GVSS2 can be input to the third gate low voltage node LV3.

To cause the Q node to charge, the Q node charging block of the input and reset block IR can include at least one Q node charging transistor, which can be turned on or turned off by an (n−3)-th carry signal C(n−3) and thereby, control a connection between the first gate high voltage node HV1 and the Q node.

For example, the Q node charging block of the input and reset block IR can include a first Q node charging transistor T1 and a second Q node charging transistor T1*a* connected in series between the first gate high voltage node HV1 and the Q node.

The gate node of the first Q node charging transistor T1 and the gate node of the second Q node charging transistor T1*a* can be electrically connected to each other, and receive the (n−3)-th carry signal C(n−3) together.

The first Q node charging transistor T1 can be connected between the first gate high voltage node HV1 and a Q node charging control node Nqc, and the second Q node charging transistor T1*a* can be connected between the Q node charging control node Nqc and the Q node.

Referring to FIG. 12, to control the Q node charging control node Nqc, the Q node charging block of the input and reset block IR can further include a first Q node charging control transistor T11 and a second Q node charging control transistor T11' connected in series between a third gate high voltage node HV3 and the Q node charging control node Nqc. For example, a third gate high voltage GVDD2 can be applied to the third gate high voltage node HV3.

The gate node of the first Q node charge control transistor T11 and the gate node of the second Q node charge control transistor T11' can be electrically connected to each other, and be connected to the third gate high voltage node HV3 together.

Referring to FIG. 12, to cause the Q node to discharge, the Q node discharging block of the input and reset block IR can include a first Q node discharging transistor T3n and a second Q node discharging transistor T3na connected in series between the Q node and the third gate low voltage node LV3.

The first Q node discharging transistor T3n and the second Q node discharging transistor T3na can be turned on or turned off together by an (n+3)-th carry signal C(n+3), and control a connection between the Q node and the third gate low voltage node LV3.

The first Q node discharging transistor T3n can be connected between the Q node and a holding node (QH node), and the second Q node discharging transistor T3na can be connected between the holding node (QH node) and the third gate low voltage node LV3.

The gate node of the first Q node discharging transistor T3n and the gate node of the second Q node discharging transistor T3na can be electrically connected to each other, and receive the (n+3)-th carry signal C(n+3) together.

Referring to FIG. 12, to cause the Q node to discharge, the Q node discharging block of the input and reset block IR can further include a third Q node discharging transistor T3nb and a fourth Q node discharging transistor T3nc connected in series between the Q node and the third gate low voltage node LV3.

The third Q node discharging transistor T3nb and the fourth Q node discharging transistor T3nc can be turned on or turned off together by a start signal VST, and control a connection between the Q node and the third gate low voltage node LV3.

The third Q node discharging transistor T3nb can be connected between the Q node and the holding node (QH node), and the fourth Q node discharging transistor T3nc can be connected between the holding node (QH node) and the third gate low voltage node LV3.

Referring to FIG. 12, the stabilization block ST can be a circuit block configured to stabilize the Q node and the output of the gate driving panel circuit GPC depending on a voltage of the QB node during a period during which an output signal of the gate driving panel circuit GPC has a turn-off level voltage.

The stabilization block ST can include a first stabilization transistor T3 and a second stabilization transistor T3a, which can be turned on or turned off depending on a voltage of the QB node and thereby, control a connection between the Q node and the third gate low voltage node LV3.

The first stabilization transistor T3 can be connected between the Q node and the holding node (QH node). The first stabilization transistor T3 can be turned on or turned off depending on a voltage of the QB node, and thereby, control a connection between the Q node and the holding node (QH node).

The second stabilization transistor T3a can be connected between the holding node (QH node) and the third gate low voltage node LV3. The second stabilization transistor T3a can be turned on or turned off depending on a voltage of the QB node, and thereby, control a connection between the holding node (QH node) and the third gate low voltage node LV3.

Referring to FIG. 12, the inverter block IVT can be a circuit block configured to control an electrical value (or level) of the Q node or the QB node such that depending on a voltage of the Q node, a voltage level resulting from inverting a voltage level of the Q node becomes a voltage level of the QB node.

The inverter block IVT can include a QB node charging transistor T4 to cause the QB node to charge.

The QB node charging transistor T4 can be connected between a second gate high voltage node HV2 and the QB node. The QB node charging transistor T4 can be turned on or turned off depending on a voltage of an inverter control node NIVT, and thereby, control a connection between the second gate high voltage node HV2 and the QB node. For example, a second gate high voltage GVDD_o can be applied to the second gate high voltage node HV2.

Referring to FIG. 12, the inverter block IVT can further include a first inverter control transistor T4q for controlling the voltage of the inverter control node NIVT.

The first inverter control transistor T4q can be connected between the inverter control node NIVT and a second gate low voltage node LV2. The first inverter control transistor T4q can be turned on or turned off depending on a voltage of the Q node, and thereby, control a connection between the inverter control node NIVT and the second gate low voltage node LV2. For example, a second gate low voltage GVSS1 can be applied to the second gate low voltage node LV2.

As the Q node has a low level voltage, the first inverter control transistor T4q can be turned off. In this situation, the inverter control node NIVT can be in a state in which the second gate high voltage GVDD_o supplied by a second inverter control transistor T41 is applied. Accordingly, the QB node charging transistor T4 can be turned on, and thereby, the second gate high voltage GVDD_o can be applied to the QB node (QB node charging).

As the Q node has a high level voltage, the first inverter control transistor T4q can be turned on, and thereby, pass the second gate low voltage GVSS1 to the inverter control node NIVT. Accordingly, the QB node charging transistor T4 can be turned off, thereby preventing the second gate high voltage GVDD_o from being applied to the QB node.

Referring to FIG. 12, the inverter block IVT can further include a second inverter control transistor T41 for controlling the voltage of the inverter control node NIVT.

A pair of the second inverter control transistor T41 can be connected in series between the second gate high voltage node HV2 and the inverter control node NIVT. The second inverter control transistors T41 can be turned on or turned off depending on the second gate high voltage GVDD_o, and thereby, control a connection between the gate high voltage node HV2 and the inverter control node NIVT.

The second inverter control transistor T41 can always remain in a turn-on state, and can pass the second gate high voltage GVDD_o to the inverter control node NIVT.

Referring to FIG. 12, to cause the QB node to discharge, the inverter block IVT can include a first QB node discharging transistor T5 connected between the QB node and the third gate low voltage node LV3.

The first QB node discharging transistor T5 can be turned on or turned off depending on an (n−3)-th carry signal C(n−3), and thereby, control a connection between the QB node and the third gate low voltage node LV3. When first QB node discharging transistor T5 is turned on, the third gate low voltage GVSS2 can be applied to the QB node. Accordingly, the QB node can be discharged.

Referring to FIG. 12, to cause the QB node to discharge, the inverter block IVT can further include a second QB node discharging transistor T5q connected between the QB node and the third gate low voltage node LV3.

The second QB node discharging transistor T5$q$ can be turned on or turned off depending on a voltage of the Q node, and thereby, control a connection between the QB node and the third gate low voltage node LV3. When second QB node discharging transistor T5$q$ is turned on, the third gate low voltage GVSS2 can be applied to the QB node. Accordingly, the QB node can be discharged.

Referring to FIG. 12, to cause the QB node to discharge, the inverter block IVT can further include a third QB node discharging transistor T5$a$ and a fourth QB node discharging transistor T5$b$ connected in series between the QB node and the third gate low voltage node LV3.

A reset signal RST can be input to the gate node of the third QB node discharging transistor T5$a$. For example, the third QB node discharging transistor T5$a$ can be turned on or turned off depending on a voltage of the reset signal RST.

The gate node of the fourth QB node discharging transistor T5$b$ can be electrically connected to an intermediate node M. For example, the fourth QB node discharging transistor T5$b$ can be turned on or turned off depending on a voltage of the intermediate node M. For example, the intermediate node M can be a node included in the first real-time sensing control block RT #1.

Referring to FIG. 12, among the plurality of QB node discharging transistors (T5, T5$q$, T5$a$, and T5$b$) included in the inverter block IVT, the first QB node discharging transistor T5 and the second QB node discharging transistor T5$q$ can be configured to discharge the QB node for display driving during an active period ACT, and the third QB node discharging transistor T5$a$ and the fourth QB node discharging transistor T5$b$ can be configured to discharge the QB node for sensing driving during a blank period BLANK.

The first logic block LOGIC #1 can further include a holding node control block QHC for controlling a voltage of the holding node (QH node). The holding node control block QHC can be connected between the first gate high voltage node HV1 and the holding node (QH node).

The holding node control block QHC can include a first holding node control transistor T3$q$ and a second holding node control transistor T3$q$' connected in series between the first gate high voltage node HV1 and the holding node (QH node).

Respective gate nodes of the first holding node control transistor T3$q$ and the second holding node control transistor T3$q$' can be connected to the Q node together.

When the Q node has a high level voltage, both the first holding node control transistor T3$q$ and the second holding node control transistor T3$q$' can be turned on, and thereby, the first gate high voltage GVDD can be applied to the holding node (QH node). As the holding node (QH node) has the first gate high voltage GVDD, regardless of respective switching of the third Q node discharging transistor T3$nb$, the first Q node discharging transistor T3$n$, and the first stabilization transistor T3, the Q node can stably maintain a high level voltage.

Referring to FIG. 12, the first real-time sensing control block RT #1 can be a circuit block configured to control operation of the first output buffer block BUF #1 for real-time sensing driving. The first real-time sensing control block RT #1 can be configured to control a voltage of the Q node so that a first scan signal SC1 and a first sensing signal SE1 can be output at a preset timing by the first output buffer block BUF #1 during a blank period BLANK.

The first real-time sensing control block RT #1 can perform a control operation so that during a blank period BLANK, the first scan signal SC1 can be output by the first output buffer block BUF #1 to a corresponding one of a plurality of scan signal lines SCL, and the first sensing signal SE1 can be output by the first output buffer block BUF #1 to a corresponding one of a plurality of sensing signal lines SENL. Through this operation, sensing driving can be performed for a subpixel (or subpixels) SP included in a corresponding one of a plurality of subpixel lines (or sub-pixel arrays).

The first real-time sensing control block RT #1 can include a first sensing control transistor Ta, a second sensing control transistor Tb, a third sensing control transistor Tc, a fourth sensing control transistor T1$b$, and a fifth sensing control transistor T1$c$.

The first sensing control transistor Ta and the second sensing control transistor Tb can be connected in series between a previous carry input node Npc and the intermediate node M. For example, an (n−2)-th carry signal C(n−2) can be input to the previous carry input node Npc.

In order that real-time sensing driving is performed for a subpixel SP intended to receive (or to be determined to receive) the first scan signal SC1 and the first sensing signal SE1 output from the first gate driving panel circuit GPC #1, the first gate driving panel circuit GPC #1 is needed to output the first scan signal SC1 and the first sensing signal SE1 as sensing driving gate signals during a real-time sensing driving period. For example, the real-time sensing driving period can be included in a blank period BLANK.

The first real-time sensing control block RT #1 can use a line selection signal LSP so that the first scan signal SC1 and the first sensing signal SE1 can be output as sensing driving gate signals during a real-time sensing driving period.

During the real-time sensing driving period, the line selection signal LSP can be commonly input to respective gate nodes of the first sensing control transistor Ta and the second sensing control transistor Tb. For example, the line selection signal LSP can be a pulse-shaped signal, and can be commonly applied to the gate nodes of the first sensing control transistor Ta and the second sensing control transistors Tb in a period between a start time and an end time of a frame.

The third sensing control transistor Tc can be turned on or turned off depending on a voltage of the intermediate node M, and thereby, control a connection between a connection point Ps and the first gate high voltage node HV1. For example, the connection point Ps can be a point at which the first sensing control transistor Ta and the second sensing control transistor Tb are connected.

The fourth sensing control transistor T1$b$ and the fifth sensing control transistor T1$c$ can be connected in series between the first gate high voltage node HV1 and the Q node.

The gate node of the fourth sensing control transistor T1$b$ can be connected to the intermediate node M. A reset signal RST can be input to the gate node of the fifth sensing control transistor T1$c$.

During a real-time sensing driving period, the fourth sensing control transistor T1$b$ and the fifth sensing control transistor T1$c$ can be turned on depending on a voltage of the intermediate node M and the reset signal RST, respectively, and thereby, pass the first gate high voltage GVDD to the Q node. Accordingly, the Q node can be charged during the real-time sensing driving period. For example, the real-time sensing driving period can be included in a blank period BLANK.

Referring to FIG. 12, the first real-time sensing control block RT #1 can include a sensing control capacitor Crt connected between the first gate high voltage node HV1 and the intermediate node M.

The sensing control capacitor Crt can also operate as a stabilization capacitor for stabilizing the first gate high voltage GVDD by removing noise components of the first gate high voltage GVDD applied to the first gate high voltage node HV1.

The sensing control capacitor Crt included in the first real-time sensing control block RT #1 can be configured with a size less than each of the carry bootstrapping capacitor Ccr, the scan bootstrapping capacitor Csc, and the sensing bootstrapping capacitor Cse included in the output buffer block BUF. In other words, an area of the sensing control capacitor Crt can be smaller than that of each of the bootstrapping capacitors. For example, the sensing control capacitor Crt can have a smaller capacitance than each of the carry bootstrapping capacitor Ccr, the scan bootstrapping capacitor Csc, and the sensing bootstrapping capacitor Cse.

Figure 13A:
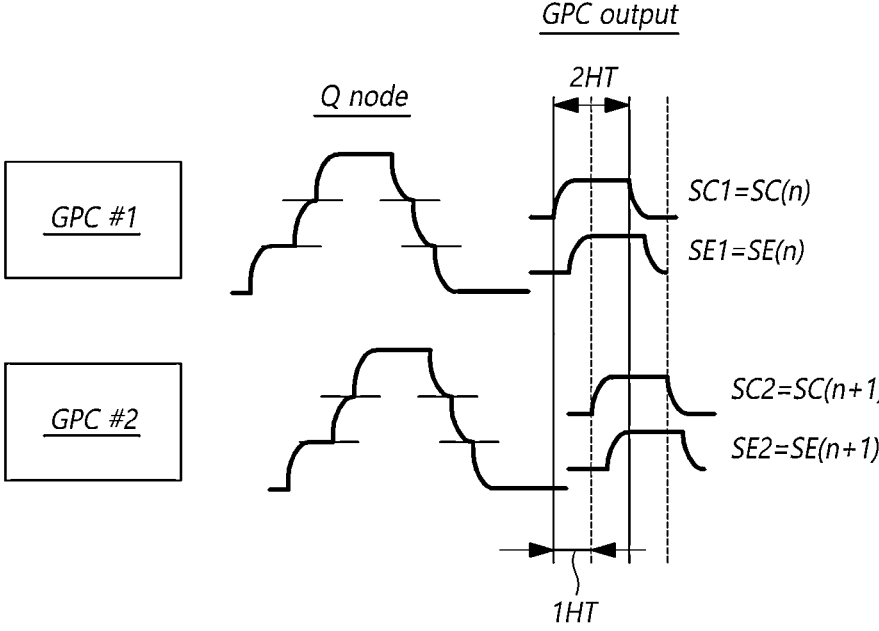
FIG. 13A illustrates respective example outputs and voltage changes at Q nodes of the first gate driving panel circuit and a second gate driving panel circuit included in the gate driving panel circuit according to aspects of the present disclosure.

FIG. 13A illustrates respective example outputs and voltage changes at Q nodes of the first gate driving panel circuit GPC #1 and the second gate driving panel circuit GPC #2 included in the gate driving panel circuit GPC according to aspects of the present disclosure.

Referring to FIG. 13A, voltage rising (boosting) can occur two or more times during a period during which a voltage of the Q node of the first gate driving panel circuit GPC #1 increases. Further, voltage rising can occur two or more times during a period during which a voltage of the Q node of the second gate driving panel circuit GPC #2 increases.

Referring to FIG. 13A, when the Q node of the first gate driving panel circuit GPC #1 has a high level voltage, the first gate driving panel circuit GPC #1 can output a first scan signal SC1 having a high level voltage and a first sensing signal SE1 having a high level voltage. A high level voltage period of the first sensing signal SE1 can proceed after a high level voltage period of the first scan signal SC1.

When the Q node of the second gate driving panel circuit GPC #2 has a high level voltage, the second gate driving panel circuit GPC #2 can output a second scan signal SC2 having a high level voltage and a second sensing signal SE2 having a high level voltage. A high level voltage period of the second sensing signal SE2 can proceed after a high level voltage period of the second scan signal SC2.

A time period of a respective high level voltage period of each of the first scan signal SC1 and the second scan signal SC2 can be two horizontal times 2HT (which can refer to a time period corresponding two horizontal periods).

The high level voltage period of the first scan signal SC1 and the high level voltage period of the second scan signal SC2 can overlap in time. A time period during which the high level voltage period of the first scan signal SC1 and the high level voltage period of the second scan signal SC2 overlap each other can be one horizontal time 1HT (which can refer to a time period corresponding one horizontal period). As described above, a gate driving scheme in which respective high level voltage periods of two scan signals (SC1 and SC2), which are output immediately adjacent to each other in time, overlap in time can be referred to as an "overlap gate driving scheme."

The high level voltage period of the first sensing signal SE1 and the high level voltage period of the second sensing signal SE2 can overlap in time. A time period during which the high level voltage period of the first sensing signal SE1 and the high level voltage period of the second sensing signal SE2 overlaps each other in time can be one horizontal time 1HT.

Figure 13B:
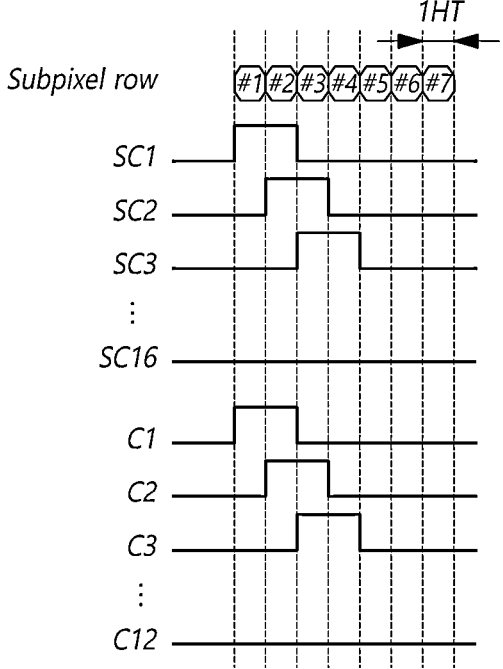
FIG. 13B illustrates example scan signals and carry signals produced from the gate driving panel circuit according to aspects of the present disclosure.

FIG. 13B illustrates example scan signals (SC1 to SC12) and carry signals (C1 to C3) produced from the gate driving panel circuit GPC in the display device 100 according to aspects of the present disclosure.

Referring to FIG. 13B, the gate driving panel circuit GPC can supply a corresponding scan signal to each of a plurality of subpixel rows (e.g., subpixel row: #1, #2, #3, . . . , and #7). The gate driving panel circuit GPC can supply a first scan signal SC1, a second scan signal SC2, and a third scan signal SC3 to a first subpixel row #1, a second subpixel row #2, and a third subpixel row #3, respectively.

A time period of a respective high level voltage period of each of the scan signals (SC1 to SC16) can be two horizontal times 2HT. The second half of the high level voltage period of the first scan signal SC1 and the first half of the high level voltage period of the second scan signal SC2 can overlap by one horizontal time 1HT. The second half of the high level voltage period of the second scan signal SC2 and the first half of the high level voltage period of the third scan signal SC3 can overlap by one horizontal time 1HT.

Referring to FIG. 13B, the carry signals (C1 to C12) can be output by circuit blocks or elements in the gate driving panel circuit GPC.

A time period of a respective high level voltage period of each of the carry signals (C1 to C12) can be two horizontal times 2HT. The second half of the high level voltage period of the first carry signal C1 and the first half of the high level voltage period of the second carry signal C2 can overlap by one horizontal time 1HT. The second half of the high level voltage period of the second carry signal C2 and the first half of the high level voltage period of the third carry signal C3 can overlap by one horizontal time 1HT.

Figure 14:
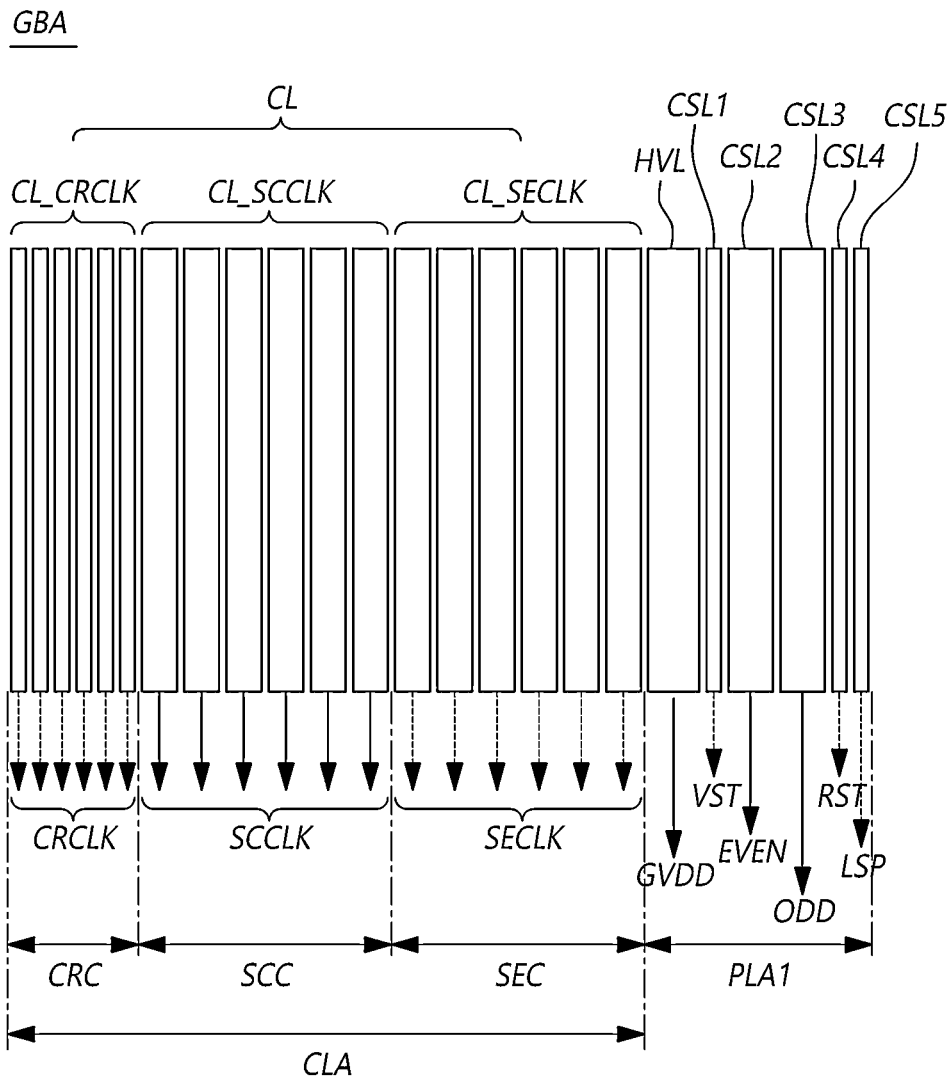
FIG. 14 illustrates an example line arrangement in a clock signal line area and a first power line area included in the gate bezel area in the non-display area of the display panel according to aspects of the present disclosure.

FIG. 14 illustrates an example line arrangement in a clock signal line area CLA and a first power line area PLA1 included in the gate bezel area GBA in the non-display area NDA of the display panel 110 according to aspects of the present disclosure.

Referring to FIG. 14, the gate bezel area GBA of the display panel 110 can include the clock signal line area CLA and the first power line area PLA1. The clock signal line area CLA and the first power line area PLA1 can be located on a first side of a gate driving panel circuit area GPCA.

The clock signal line area CLA in which a plurality of clock signal lines CL are disposed can include a carry clock signal line area CRC, a scan clock signal line area SCC, and a sensing clock signal line area SEC.

Carry clock signal lines CL_CRCLK for delivering carry clock signals CRCLK to the gate driving panel circuit GPC can be disposed in the carry clock signal line area CRC.

Scan clock signal lines CL_SCCLK for delivering scan clock signals SCCLK to the gate driving panel circuit GPC can be disposed in the scan clock signal line area SCC.

Sensing clock signal lines CL_SECLK for delivering sensing clock signals SECLK to the gate driving panel circuit GPC can be disposed in the sensing clock signal line area SEC.

Among the carry clock signal line area CRC, the scan clock signal line area SCC, and the sensing clock signal line area SEC, the scan clock signal line area SCC can be located between the carry clock signal line area CRC and the sensing clock signal line area SEC, the carry clock signal line area CRC can be located furthest away from the display area DA, and the sensing clock signal line area SEC can be located closest to the display area DA.

Among the carry clock signal line area CRC, the scan clock signal line area SCC, and the sensing clock signal line area SEC, the carry clock signal line area CRC can be located furthest away from the gate driving panel circuit area GPCA, and the sensing clock signal line area SEC can be located closest to the gate driving panel circuit area GPCA.

Referring to FIG. 14, in an embodiment, a width of one scan clock signal line CL_SCCLK can be greater than that of one carry clock signal line CL_CRCLK. In an embodiment, a width of one sensing clock signal line CL_SECLK can be greater than that of one carry clock signal line CL_CRCLK.

At least one gate high voltage line HVL for delivering at least one gate high voltage GVDD to the gate driving panel circuit GPC can be disposed in the first power line area PLA1.

At least one control signal line can be further disposed in the first power line area PLA1. For example, the at least one control signal line can include at least one of a start signal line CSL1 for delivering a start signal VST for indicating the start of gate driving operation to the gate driving panel circuit GPC, a first driving sequence control signal line CSL2 for delivering an even-numbered driving control signal EVEN to the gate driving panel circuit GPC, a second driving sequence control signal line CSL3 for delivering an odd-numbered driving control signal ODD to the gate driving panel circuit GPC, a reset signal line CSL4 for delivering a reset signal RST for indicating the end of the gate driving operation to the gate driving panel circuit GPC, and a line selection signal line CSL5 for delivering a line selection signal LSP to the gate driving panel circuit GPC.

The gate high voltage line HVL can have a greater width than each of the start signal line CSL1, the reset signal line CSL4, and the line selection signal line CSL5.

Figure 15:
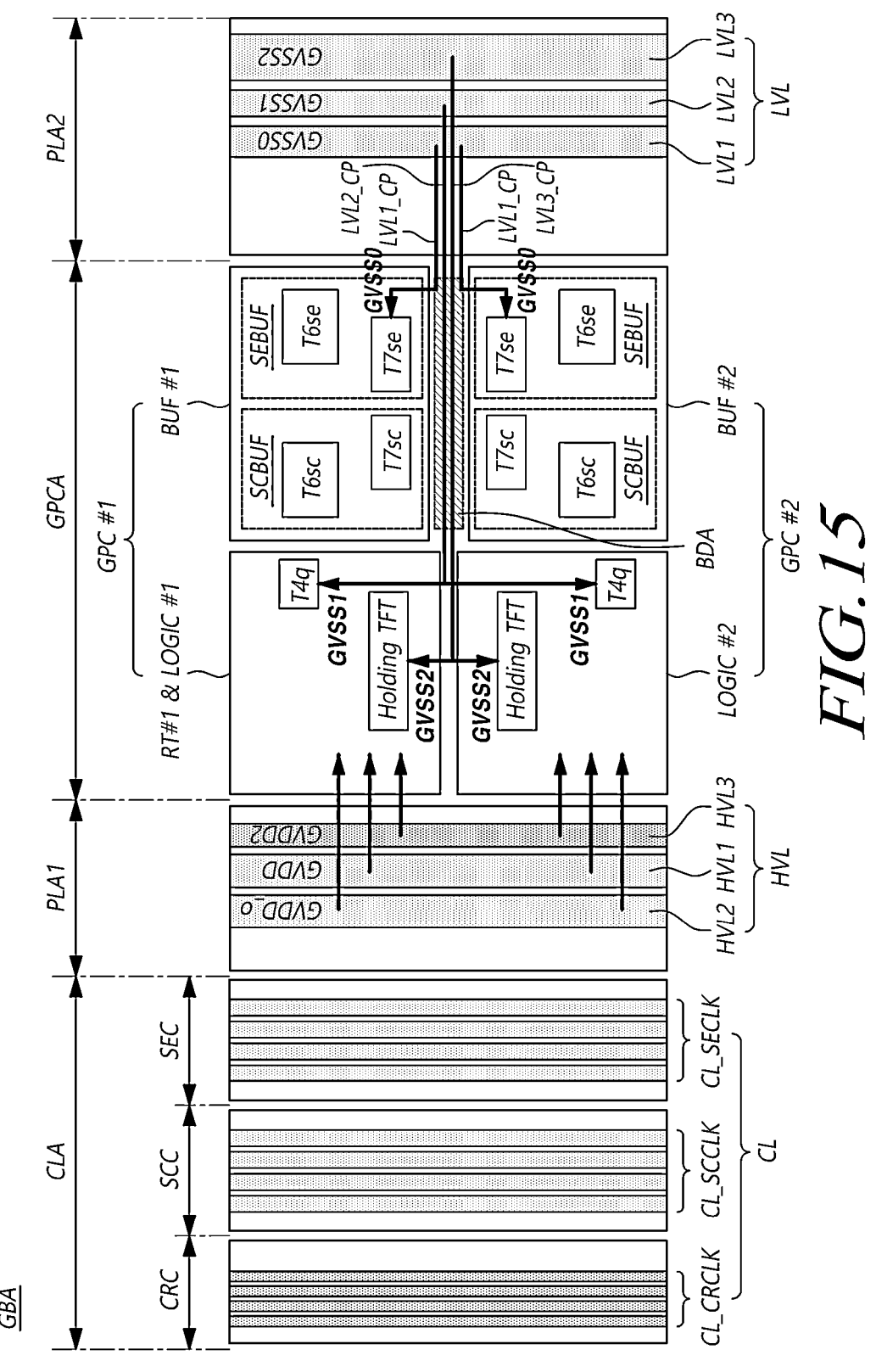
FIG. 15 is an example plan view of the gate bezel area of the display panel according to aspects of the present disclosure.

FIG. 15 is an example plan view of the gate bezel area GBA of the display panel 110 according to aspects of the present disclosure. For discussions, it is assumed that a first gate driving panel circuit GPC #1 (e.g., the first gate driving panel circuit GPC #1 in FIG. 11) and a second gate driving panel circuit (e.g., the second gate driving panel circuit GPC #2 in FIG. 11) are disposed in a gate driving panel circuit area GPCA (e.g., the gate driving panel circuit area GPCA in FIG. 11).

Referring to FIG. 15, the first gate driving panel circuit GPC #1 and the second gate driving panel circuit GPC #2 can be disposed in the gate driving panel circuit area GPCA.

The first gate driving panel circuit GPC #1 can include a first output buffer block BUF #1, a first logic block LOGIC #1, and a first real-time sensing control block RT #1. The second gate driving panel circuit GPC #2 can include a second output buffer block BUF #2, a second logic block LOGIC #2, and the first real-time sensing control block RT #1.

The first output buffer block BUF #1 of the first gate driving panel circuit GPC #1 can include a scan output buffer SCBUF for outputting a first scan signal SC1 and a sensing output buffer SEBUF for outputting a first sensing signal SE1.

The second output buffer block BUF #2 of the second gate driving panel circuit GPC #2 can include a scan output buffer SCBUF for outputting a second scan signal SC2 and a sensing output buffer SEBUF for outputting a second sensing signal SE2.

The scan output buffer SCBUF included in each of the first output buffer block BUF #1 and the second output buffer block BUF #2 can include a scan pull-up transistor T6*sc* and a scan pull-down transistor T7*sc*.

The sensing output buffer SEBUF included in each of the first output buffer block BUF #1 and the second output buffer block BUF #2 can include a sensing pull-up transistor T6*se* and a sensing pull-down transistor T7*se*.

The gate bezel area GBA in the non-display area NDA of the display panel 110 can include a central area BDA for separating the first output buffer block BUF #1 and the second output buffer block BUF #2 from each other.

The display panel 110 can further include at least one first gate low voltage connection line LVL1_CP for connecting a first gate low voltage line LVL1 disposed in a second power line area PLA2 with the first output buffer block BUF #1 and the second output buffer block BUF #2.

The display panel 110 can further include at least one second gate low voltage connection line LVL2_CP for connecting a second gate low voltage line LVL2 disposed in the second power line area PLA2 with the first logic block LOGIC #1 and the second logic block LOGIC #2.

The display panel 110 can further include at least one third gate low voltage connection line LVL3_CP for connecting a third gate low voltage line LVL3 disposed in the second power line area PLA2 with the first logic block LOGIC #1 and the second logic block LOGIC #2.

The first gate low voltage connection line LVL1_CP, the second gate low voltage connection line LVL2_CP, and the third gate low voltage connection line LVL3_CP can run through the central area BDA.

Referring to FIG. 15, the scan output buffer SCBUF of the first output buffer block BUF #1 and the scan output buffer SCBUF of the second output buffer block BUF #2 can have a symmetrical structure about the central area BDA.

For example, locations or shapes of elements included in the scan output buffer SCBUF of the first output buffer block BUF #1 and locations or shapes of elements included in the scan output buffer SCBUF of the second output buffer block BUF #2 can be symmetrical about the central area BDA. For example, the elements included in the scan output buffer SCBUF can include transistors (T6*sc*, T7*sc*) and capacitors (Csc).

Referring to FIG. 15, the sensing output buffer SEBUF of the first output buffer block BUF #1 and the sensing output buffer SEBUF of the second output buffer block BUF #2 can have a symmetrical structure about the central area BDA.

For example, locations or shapes of elements included in the sensing output buffer SEBUF of the first output buffer block BUF #1 and locations or shapes of elements included in the sensing output buffer SEBUF of the second output buffer block BUF #2 can be symmetrical about the central area BDA. For example, the elements included in the sensing output buffer SEBUF can include transistors (T6*se*, T7*se*) and capacitors (Cse).

Referring to FIG. 15, a clock signal line area CLA can be located on a first side of the gate driving panel circuit area GPCA and be an area in which a plurality of clock signal lines CL are disposed.

For example, the clock signal line area CLA can include a carry clock signal line area CRC, a scan clock signal line area SCC, and a sensing clock signal line area SEC.

The plurality of clock signal lines CL can include a plurality of carry clock signal lines CL_CRCLK disposed in the carry clock signal line area CRC, a plurality of scan clock signal lines CL_SCCLK disposed in the scan clock signal line area SCC, and a plurality of sensing clock signal lines CL_SECLK disposed in the sensing clock signal line area SEC.

Since each of the plurality of carry clock signal lines CL_CRCLK, the plurality of scan clock signal lines CL_SC-CLK, and the plurality of sensing clock signal lines CL_SE-CLK is desired to reduce load for gate driving, therefore, these lines can have a multilayer line structure.

Scan clock signals SCCLK and sensing clock signals SECLK can be more sensitive to signal delay or signal waveform changes in terms of driving than carry clock signals CRCLK. Therefore, in order to reduce the load of the plurality of scan clock signal lines CL_SCCLK and the plurality of sensing clock signal lines CL_SECLK, a line width of each of the plurality of scan clock signal lines CL_SCCLK and the plurality of sensing clock signal lines CL_SECLK can be designed to be greater than a line width of each of the plurality of carry clock signal lines CL_CR-CLK.

Referring to FIG. 15, the plurality of scan clock signal lines CL_SCCLK can be disposed between the plurality of carry clock signal lines CL_CRCLK and the plurality of sensing clock signal lines CL_SECLK. The plurality of carry clock signal lines CL_CRCLK can be located further away from the gate driving panel circuit area GPCA than the plurality of sensing clock signal lines CL_SECLK.

A first power line area PLA1 can be located on the first side of the gate driving panel circuit area GPCA and include at least one gate high voltage line HVL disposed in a column direction.

For example, the at least one gate high voltage line HVL can include a first gate high voltage line HVL1 for delivering a first gate high voltage GVDD to the first gate driving panel circuit GPC #1 and the second gate driving panel circuit GPC #2, a second gate high voltage line HVL2 for delivering a second gate high voltage GVDD_o to the first gate driving panel circuit GPC #1 and the second gate driving panel circuit GPC #2, and a third gate high voltage line HVL3 for delivering a third gate high voltage GVDD2 to the first gate driving panel circuit GPC #1 and the second gate driving panel circuit GPC #2.

The first gate high voltage line HVL1 can be a first gate high voltage node HV1 or can be electrically connected to the first gate high voltage node HV1. The second gate high voltage line HVL2 can be a second gate high voltage node HV2 or can be electrically connected to the second gate high voltage node HV2. The third gate high voltage line HVL3 can be a third gate high voltage node HV3 or can be electrically connected to the third gate high voltage node HV3.

The first gate high voltage GVDD, the second gate high voltage GVDD_o, and the third gate high voltage GVDD2 can be supplied to the first logic block LOGIC #1 included in the first gate driving panel circuit GPC #1 and the second logic block LOGIC #2 included in the second gate driving panel circuit GPC #2.

Among the first gate high voltage GVDD, the second gate high voltage GVDD_o, and the third gate high voltage GVDD2, the first gate high voltage GVDD can also be supplied to the first real-time sensing control block RT #1 included in the first gate driving panel circuit GPC #1.

The second power line area PLA2 can be located on a second opposing side of the gate driving panel circuit area GPCA and include at least one gate low voltage line LVL disposed in the column direction.

For example, the at least one gate low voltage line LVL can include the first gate low voltage line LVL1 for delivering a first gate low voltage GVSS0 to the first gate driving panel circuit GPC #1 and the second gate driving panel circuit GPC #2, the second gate low voltage line LVL2 for delivering a second gate low voltage GVSS1 to the first gate driving panel circuit GPC #1 and the second gate driving panel circuit GPC #2, and the third gate low voltage line LVL3 for delivering a third gate low voltage GVSS2 to the first gate driving panel circuit GPC #1 and the second gate driving panel circuit GPC #2.

The first gate low voltage line LVL1 can be a first gate low voltage node LV1 or can be electrically connected to the first gate low voltage node LV1. The second gate low voltage line LVL2 can be a second gate low voltage node LV2 or can be electrically connected to the second gate low voltage node LV2. The third gate low voltage line LVL3 can be a third gate low voltage node LV3 or can be electrically connected to the third gate low voltage node LV3.

The first gate low voltage GVSS0 can be supplied to the scan output buffer SCBUF and the sensing output buffer SEBUF included in the first output buffer block BUF #1 of the first gate driving panel circuit GPC #1 and be supplied to the scan output buffer SCBUF and the sensing output buffer SEBUF included in the second output buffer block BUF #2 of the second gate driving panel circuit GPC #2.

The first gate low voltage GVSS0 can be applied to respective drain nodes or source nodes of a scan pull-down transistor T7*sc* and a sensing pull-down transistor T7*se* included in the first output buffer block BUF #1 and be applied to respective drain nodes or source nodes of a scan pull-down transistor T7*sc* and a sensing pull-down transistor T7*se* included in the second output buffer block BUF #2.

The first gate low voltage connection line LVL1_CP can electrically connect respective drain nodes or source nodes of the scan pull-down transistor T7*sc* and the sensing pull-down transistor T7*se* included in the first output buffer block BUF #1 to the first gate low voltage line LVL1.

Further, the first gate low voltage connection line LVL1_CP can electrically connect respective drain nodes or source nodes of the scan pull-down transistor T7*sc* and the sensing pull-down transistor T7*se* included in the second output buffer block BUF #2 to the first gate low voltage line LVL1.

The first gate low voltage connection line LVL1_CP can be disposed in a row direction and run through the central area BDA.

Referring to FIG. 15, the second gate low voltage GVSS1 can be supplied to the first logic block LOGIC #1 of the first gate driving panel circuit GPC #1 and the second logic block LOGIC #2 of the second gate driving panel circuit GPC #2.

The second gate low voltage GVSS1 can be applied to the drain node or source node of a first inverter control transistor T4*q* included in the first logic block LOGIC #1 and to the drain node or source node of a first inverter control transistor T4*q* included in the second logic block LOGIC #2.

The second gate low voltage connection line LVL2_CP can electrically connect the drain node or source node of the first inverter control transistor T4*q* included in the first logic block LOGIC #1 to the second gate low voltage line LVL2. Further, the second gate low voltage connection line LVL2_CP can electrically connect the drain node or source node of the first inverter control transistor T4*q* included in the second logic block LOGIC #2 to the second gate low voltage line LVL2.

Referring to FIG. 15, the third gate low voltage GVSS2 can be supplied to the first logic block LOGIC #1 of the first gate driving panel circuit GPC #1 and to the second logic block LOGIC #2 of the second gate driving panel circuit GPC #2.

The third gate low voltage GVSS2 can be applied to respective drain nodes or source nodes of holding transistors Holding TFT that are included in each of the first logic block LOGIC #1 and the second logic block LOGIC #2 and are connected to the third gate low voltage node LV3. The holding transistors Holding TFT can include a second Q node discharging transistor T3*na*, a fourth Q node discharging transistor T3*nc*, a second stabilization transistor T3*a*, a second QB node discharging transistor T5*q*, a first QB node discharging transistor T5, and a fourth QB node discharging transistor T5*b*.

The third gate low voltage connection line LVL3_CP can electrically connect the drain nodes or source nodes of the holding transistors Holding TFT, which are included in each of the first logic block LOGIC #1 and the second logic block LOGIC #2 and connected to the third gate low voltage node LV3, to the third gate low voltage line LVL3.

Further, the third gate low voltage GVSS2 can be applied to the drain nodes or source nodes of the carry pull-down transistors T7*cr* included in respective carry output buffers CRBUF of the first output buffer block BUF #1 and the second output buffer block BUF #2.

As described above, since the first output buffer block BUF #1 and the second output buffer block BUF #2 have a symmetrical structure about the central area BDA, the gate low voltages (GVSS0, GVSS1, and GVSS2) can be efficiently delivered (supplied).

Hereinafter, the usage and structure of the first, second, and third gate high voltage lines (HVL1, HVL2, and HVL3) will be discussed, and the usage and structure of the first, second, and third gate low voltage lines (LVL1, LVL2, and LVL3) will be discussed.

The first gate high voltage GVDD carried through the first gate high voltage line HVL1 can be a high voltage used to cause the Q node to charge by being supplied to Q node charging blocks of respective input and reset blocks IR of the first logic block LOGIC #1 and the second logic block LOGIC #2. For example, the first gate high voltage GVDD carried through the first gate high voltage line HVL1 can be a high voltage used to cause the Q node to charge by being applied to the drain node or source node of a first Q node charging transistor T1.

Further, the first gate high voltage GVDD carried through the first gate high voltage line HVL1 can be a high voltage used to cause the Q node to charge by being supplied to the first real-time sensing control block RT #1 during a real-time sensing driving period.

The second gate high voltage GVDD_o carried through the second gate high voltage line HVL2 can be a high voltage used to cause the QB node to charge by being supplied to respective inverter blocks IVT of the first logic block LOGIC #1 and the second logic block LOGIC #2.

The third gate high voltage GVDD2 carried through the third gate high voltage line HVL3 can be applied to the drain nodes (or source nodes) and the gate nodes of respective first Q node charging control transistors T11 included in the first logic block LOGIC #1 and the second logic block LOGIC #2, and be applied to a Q node charging control node Nqc through the first Q node charging control transistors T11. The first Q node charging control transistor T11 included in each of the first logic block LOGIC #1 and the second logic block LOGIC #2 can serve to compensate for a negative threshold voltage of the first Q node charging transistor T1.

The first gate low voltage GVSS0 carried through the first gate low voltage line LVL1 can be supplied to the scan output buffer SCBUF and the sensing output buffer SEBUF of the first output buffer block BUF #1, and cause voltage levels of the first scan signal SC1 and the first sensing signal SE1 to have a turn-off voltage level. Through this, driving of the first scan signal line SCL1 and the first sensing signal line SENL1 can be turned off.

The first gate low voltage GVSS0 carried through the first gate low voltage line LVL1 can be supplied to the scan output buffer SCBUF and the sensing output buffer SEBUF of the second output buffer block BUF #2, and cause voltage levels of the second scan signal SC2 and the second sensing signal SE2 to have a turn-off voltage level. Through this, driving of the second scan signal line SCL2 and the second sensing signal line SENL2 can be turned off.

The second gate low voltage GVSS1 carried through the second gate low voltage line LVL2 can be a low voltage applied to the drain node or source node of the first inverter control transistor T4*q* included in the inverter block IVT of each of the first logic block LOGIC #1 and the second logic block LOGIC #2.

The second gate low voltage GVSS1 can be configured as a separate low voltage separate from the third gate low voltage GVSS2.

The third gate low voltage GVSS2 carried through the third gate low voltage line LVL3 can be a low voltage used to cause the Q node to discharge (or switch off) and the QB node to discharge (or switch off) by being supplied to each of the first logic block LOGIC #1 and the second logic block LOGIC #2.

The third gate low voltage GVSS2 carried through the third gate low voltage line LVL3 can be a power supply voltage supplied to the largest number of transistors.

Each of the first gate high voltage line HVL1, the second gate high voltage line HVL2, the first gate low voltage line LVL1, the second gate low voltage line LVL2, and the third gate low voltage line LVL3 can be desired to have a smaller line resistance because the first gate high voltage GVDD, the second gate high voltage GVDD_o, the first gate low voltage GVSS0, the second gate low voltage GVSS1, and the third gate low voltage GVSS2 directly affect respective output of the first gate driving panel circuit GPC #1 and the second gate driving panel circuit GPC #2.

Accordingly, each of the first gate high voltage line HVL1, the second gate high voltage line HVL2, the first gate low voltage line LVL1, the second gate low voltage line LVL2, and the third gate low voltage line LVL3 can have a multilayer line structure.

The first Q node charging control transistor T11 connected to the third gate high voltage line HVL3 may not require a relatively high voltage. Further, one or more lines can intersect, and overlap with, the third gate high voltage line HVL3. Considering these issues, the third gate high voltage line HVL3 can have a single-layer line structure.

Hereinafter, the multilayer line structure of the plurality of clock signal lines CL will be described with reference to FIG. 16A, and then, the multilayer line structure of each of the first gate high voltage line HVL1, the second gate high voltage line HVL2, the first gate low voltage line LVL1, the second gate low voltage line LVL2, and the third gate low voltage line LVL3 will be described with reference to FIG. 16B. Thereafter, the single-layer line structure of the third gate high voltage line HVL3 will be described with reference to FIG. 16C.

Figure 16A:
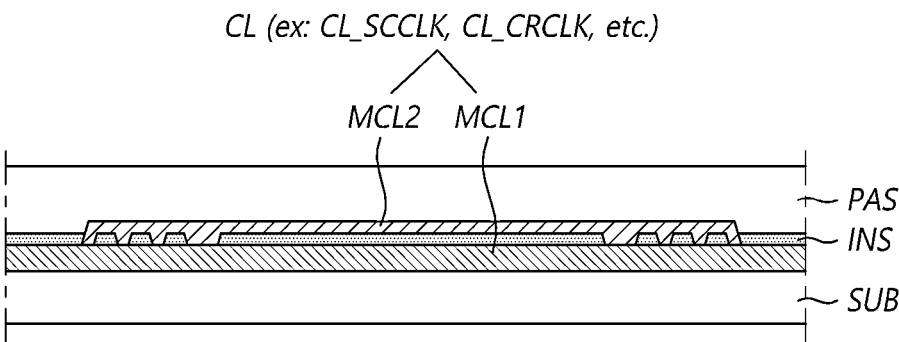
FIG. 16A illustrates an example multilayer line structure of one or more clock signal lines disposed in the gate bezel area of the display panel according to aspects of the present disclosure.

FIG. 16A illustrates an example multilayer line structure of one or more clock signal lines CL disposed in the gate bezel area GBA of the display panel 110 according to aspects of the present disclosure.

Referring to FIG. 16A, a plurality of clock signal lines CL disposed in a clock signal line area CLA can include a carry clock signal line CL_CRCLK and a scan clock signal line CL_SCCLK, and further include a sensing clock signal line. All or one or more of the plurality of clock signal lines CL can be multilayer lines. For example, at least one clock signal line CL can have a multilayer line structure.

Referring to FIG. 16A, the clock signal line(s) CL having such a multilayer line structure can include a first metal clock signal line MCL1 and a second metal clock signal line MCL2, which are electrically connected to each other. The first metal clock signal line MCL1 and the second metal clock signal line MCL2 can be located in different layers and be electrically connected to each other.

The first metal clock signal line MCL1 can be disposed in a first metal layer, which is a metal layer between a substrate SUB and an insulating layer INS on the substrate SUB.

The second metal clock signal line MCL2 can be disposed in a second metal layer, which is a metal layer between the insulating layer INS and a protective layer PAS on the insulating layer INS.

For example, the insulating layer INS can include a buffer layer and a gate insulating layer.

The second metal clock signal line MCL2 can be connected to the first metal clock signal line MCL1 through a contact hole in the insulating layer INS.

For example, a light shield can be located under an active layer (channel) of a driving transistor DRT disposed in the display area DA and can overlap with the channel of the driving transistor DRT. The insulating layer (e.g., the buffer layer) can be disposed between the channel of the driving transistor DRT and the light shield. The light shield can be formed from a first metal (e.g., a light shield metal). For example, the first metal layer can be a metal layer in which the light shield is disposed.

One of two or more capacitor electrodes constituting a storage capacitor Cst formed in the display area DA can be formed from the first metal (the light shield metal). For example, the first metal layer can be a metal layer in which one of two or more capacitor electrodes constituting the storage capacitor Cst is disposed.

In another example, the source and drain electrode of the transistor can be formed from a first metal (e.g., a source-drain metal). For example, the first metal layer can be a metal layer in which the source and drain electrodes of the transistor are disposed.

For example, a scan signal line SCL and a sensing signal line SENL can be formed from a second metal (e.g., a gate metal). For example, the second metal layer can be a metal layer in which the scan signal line SCL and the sensing signal line SENL are disposed. The second metal layer can be a metal layer in which the other one or another one of two or more capacitor electrodes constituting the storage capacitor Cst formed in the display area DA is disposed.

Figure 16B:
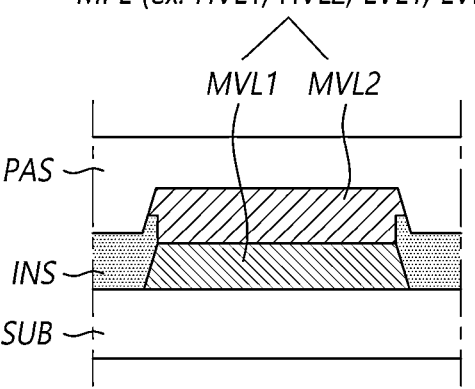
FIG. 16B illustrates an example multilayer line structure of one or more power lines disposed in the gate bezel area of the display panel according to aspects of the present disclosure.

FIG. 16B illustrates an example multilayer line structure of at least one multilayer power line MPL disposed in the gate bezel area GBA of the display panel 110 according to aspects of the present disclosure.

Referring to FIG. 16B, at least one multilayer power line MPL having a multilayer line structure can be disposed in the gate bezel area GBA.

The multilayer power line MPL can include a first metal power line MVL1 and a second metal power line MVL2. The first metal power line MVL1 and the second metal power line MVL2 can be located in different layers and can be electrically connected to each other.

The first metal power line MVL1 can be disposed in a first metal layer between a substrate SUB and an insulating layer INS on the substrate SUB. The second metal power line MVL2 can be disposed in a second metal layer between the insulating layer INS and a protective layer PAS on the insulating layer INS. For example, the insulating layer INS can include a buffer layer and a gate insulating layer.

The second metal power line MVL2 can be connected to the first metal power line MVL1 through a contact hole in the insulating layer INS.

For example, the first metal layer can be a metal layer in which a light shield located under the channel of a driving transistor DRT formed in the display area DA is disposed. The first metal layer can be a metal layer in which one of two or more capacitor electrodes constituting a storage capacitor Cst formed in the display area DA is disposed.

In another example, the first metal layer can be a metal layer constituting the source and drain electrode of the transistor.

For example, the second metal layer can be a metal layer in which a scan signal line SCL and a sensing signal line SENL are disposed. The second metal layer can be a metal layer in which the other one or another one of two or more capacitor electrodes constituting the storage capacitor Cst formed in the display area DA is disposed.

For example, the multilayer power line MPL having the multilayer line structure can include the first gate high voltage line HVL1, the second gate high voltage line HVL2, the first gate low voltage line LVL1, the second gate low voltage line LVL2, and the third gate low voltage line LVL3.

Figure 16C:
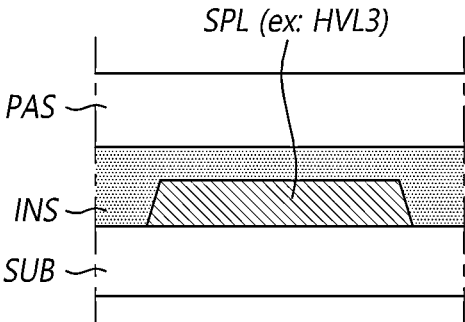
FIG. 16C illustrates an example single-layer line structure of a power line disposed in the gate bezel area of the display panel according to aspects of the present disclosure.

FIG. 16C illustrates an example single-layer line structure of at least one single-layer power line disposed in the gate bezel area GBA of the display panel 110 according to aspects of the present disclosure.

Referring to FIG. 16C, at least one single-layer power line SPL having a single-layer line structure can be disposed in the gate bezel area GBA.

The single-layer power line SPL can be disposed in a first metal layer between a substrate SUB and an insulating layer INS on the substrate SUB. For example, the insulating layer INS can include a buffer layer and a gate insulating layer.

For example, the first metal layer can be a metal layer in which a light shield located under the channel of a driving transistor DRT formed in the display area DA is disposed. The first metal layer can be a metal layer in which one of two or more capacitor electrodes constituting a storage capacitor Cst formed in the display area DA is disposed.

In another example, the first metal layer can be a metal layer constituting the source and drain electrode of the transistor.

For example, the single-layer power line SPL having the single-layer line structure can include the third gate high voltage line HVL3.

Referring to FIGS. 16A, 16B, and 16C, all or one or more of the plurality of clock signal lines CL can be multilayer lines. At least one of the plurality of gate high voltage lines HVL can be a single-layer line, and the remaining gate high voltage lines HVL can be multilayer lines. The plurality of gate low voltage lines LVL can be multilayer lines.

Figure 17:
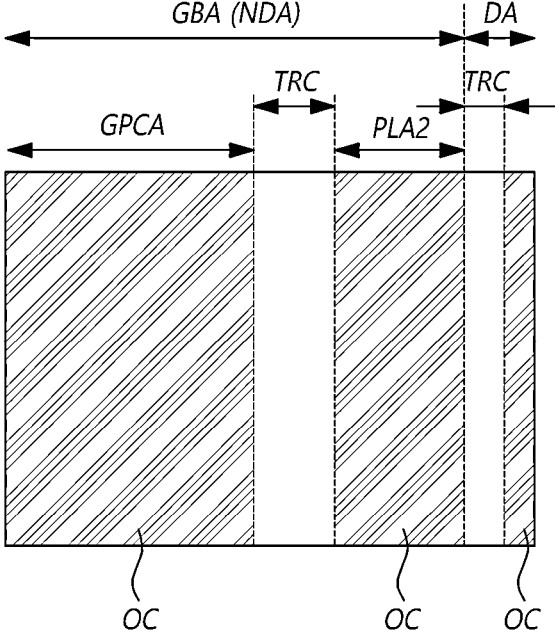
FIGS. 17 and 18 respectively are a plan view and a cross-sectional view for an example area including the gate bezel area in the display panel according to aspects of the present disclosure.

FIG. 17 is a plan view of an example area including the gate bezel area GBA in the display panel 110 according to aspects of the present disclosure.

Referring to FIG. 17, the gate bezel area GBA of the non-display area NDA can include a gate driving panel circuit area GPCA and a second power line area PLA2.

An overcoat layer OC can be disposed in the gate bezel area GBA of the non-display area NDA. At least one trench TRC in which the overcoat layer OC is removed can be present in the gate bezel area GBA.

For example, the at least one trench TRC can be formed in at least one of a first area between the gate driving panel circuit area GPCA and the second power line area PLA2 and a second area between the second power line area PLA2 and the display area DA.

For example, a first trench TRC can be located in the first area between the gate driving panel circuit area GPCA and the second power line area PLA2. For example, the overcoat layer OC can be disposed in each of the gate driving panel circuit area GPCA and the second power line area PLA2, and an area (i.e., the first area) between the gate driving panel circuit area GPCA and the second power line area PLA2, in which the overcoat layer is not disposed, can correspond to the first trench TRC.

For example, a second trench TRC can additionally located in the second area between the second power line area PLA2 and the display area DA. For example, the overcoat layer OC can be disposed in each of the second power line area PLA2 and the display area DA, and an area (i.e., the second area) between the second power line area PLA2 and the display area DA, in which the overcoat layer is not disposed, can correspond to the second trench TRC.

As the display panel 110 has the above-described trench structure, the penetration of moisture $H_2O$ into an emission layer EL can be prevented.

Figure 18:
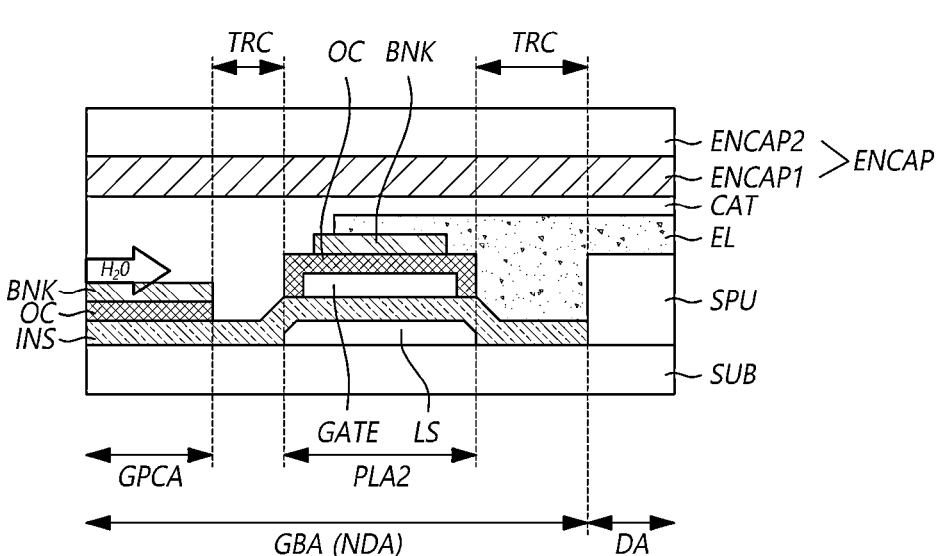

FIG. 18 is a cross-sectional view of an example area including the gate bezel area GBA in the display panel 100 according to aspects of the present disclosure.

Referring to FIG. 18, a light shield LS can be disposed on a substrate SUB in a second power line area PLA2 of the gate bezel area GBA.

In the gate bezel area GBA, an insulating layer INS can be disposed such that the insulating layer INS covers the light shield LS.

In the second power line area PLA2 of the gate bezel area GBA, a gate material layer GATE can be disposed on the insulating layer INS and overlap with the light shield LS.

In a gate driving panel circuit area GPCA of the gate bezel area GBA, an overcoat layer OC can be disposed on the insulating layer INS.

In the second power line area PLA2 of the gate bezel area GBA, the overcoat layer OC can be disposed such that the overcoat layer OC covers the gate material layer GATE on the insulating layer INS.

In a gate driving panel circuit area GPCA and the second power line area PLA2 of the gate bezel area GBA, a bank BNK can be disposed on the overcoat layer OC.

In the gate bezel area GBA, a trench TRC can be formed in an area between the gate driving panel circuit area GPCA and the second power line area PLA2, in which the overcoat layer OC and the bank BNK are not present (or removed).

In the gate bezel area GBA, an additional trench TRC can be formed in an area between the second power line area PLA2 and the display area DA, in which the overcoat layer OC and the bank BNK are not present (or removed).

Meanwhile, in the display area DA, an emission layer EL can be disposed under a cathode electrode CAT, and a subpixel section SPU can be located under the emission layer EL. The subpixel section SPU can include an anode electrode AND, transistors (DRT, SCT, SENT, and the like), and a storage capacitor Cst. The emission layer EL can extend to the gate bezel area GBA of the non-display area NDA.

For example, the emission layer EL can extend from the display area DA to the non-display area NDA and extend to an upper portion of the bank BNK in the second power line area PLA2 via the trench TRC.

In the display area DA, the cathode electrode CAT can be disposed on the emission layer EL. The cathode electrode CAT can extend to the gate bezel area GBA of the non-display area NDA. Accordingly, the cathode electrode CAT can extend from the display area DA to all or a portion of the gate driving panel circuit area GPCA.

The cathode electrode CAT can be disposed in an area in which the trench TRC between the gate driving panel circuit area GPCA and the second power line area PLA2 is present, and be disposed in an area in which the trench TRC between the second power line area PLA2 and the display area DA is present.

An encapsulation layer ENCAP can be disposed on the cathode electrode CAT. The encapsulation layer ENCAP can extend from the display area DA to a portion of the non-display area NDA.

The encapsulation layer ENCAP can include a first encapsulation layer ENCAP1 on the cathode electrode CAT and a second encapsulation layer ENCAP2 on the first encapsulation layer ENCAP1. For example, the first encapsulation layer ENCAP1 can include an adhesive and/or a moisture absorbent having an encapsulation function. The first encapsulation layer ENCAP1 can include an organic material. The second encapsulation layer ENCAP2 can include a metal or an inorganic material.

Figure 19:
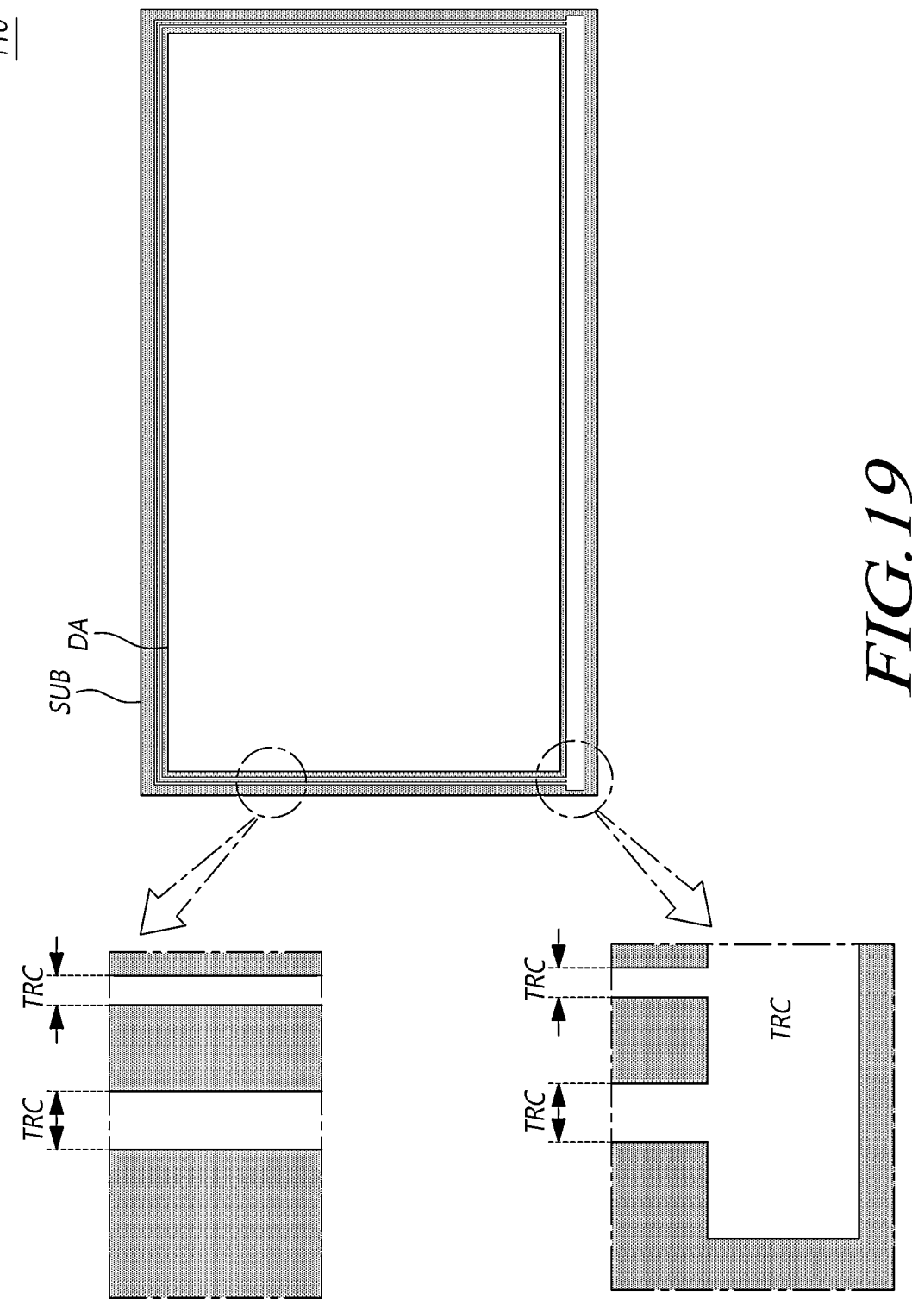
FIG. 19 is an example plan view of the display panel according to aspects of the present disclosure, and illustrates an example trench (or trenches) formed in one or more edges of the display panel.

FIG. 19 is an example plan view of the display panel 110 according to aspects of the present disclosure, and illustrates an example trench (or trenches) formed in one or more edges of the display panel 110 (e.g., upper, lower, left, and/or right edges).

Referring to FIG. 19, a trench TRC can be formed along the entire edge of the display panel 110. For example, the trench TRC can be located in the non-display area NDA such that the trench TRC surrounds the display area DA.

For example, two rows of trenches TRC as shown in FIGS. 17 and 18 can be formed in three outer edges among four outer edges of the display panel 110. For example, a width of a single row of trench TRC (e.g., formed in a bottom outer edge of the display panel 110) can be greater than a width of each of the two columns in one row of trenches TRC.

For example, a single row of trench TRC can be formed in one of the four outer edges of the display panel 110. The one outer edge in which the single row of trench TRC is formed can be an area in which circuit films CF on which source driver integrated circuits SDIC are mounted are connected.

Figure 20:
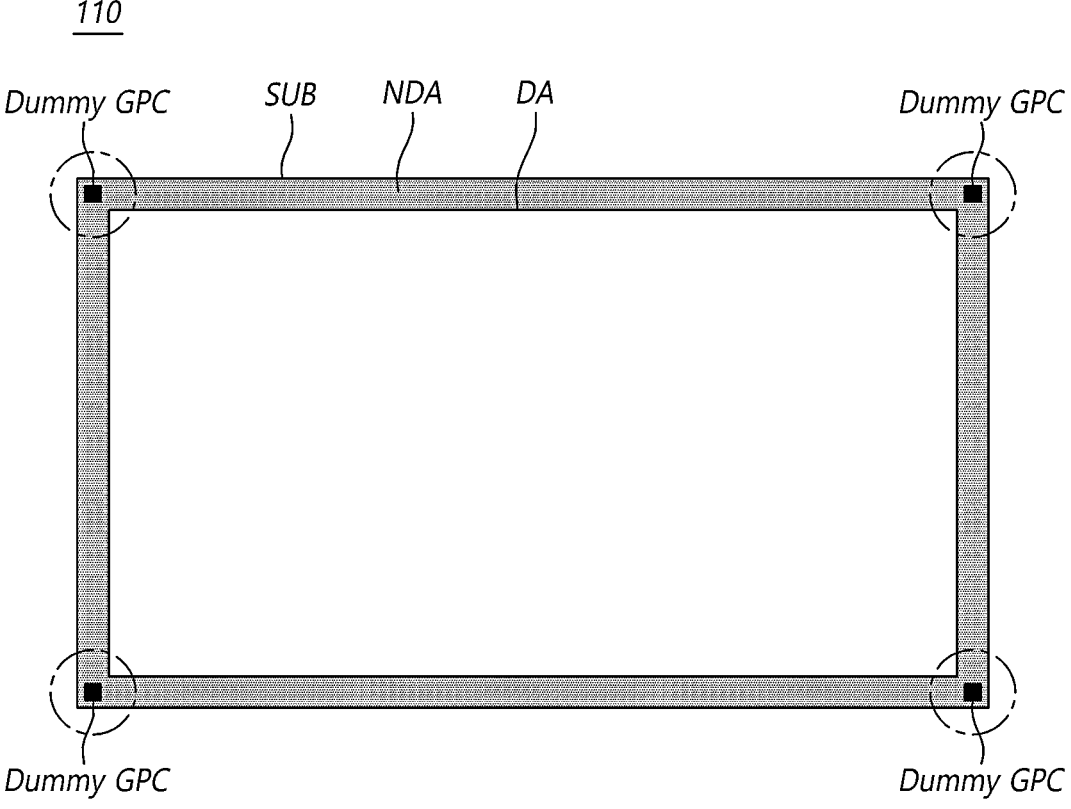
FIG. 20 is an example plan view of the display panel according to aspects of the present disclosure, and illustrates one or more example dummy gate driving panel circuits disposed in one or more corner areas of the display panel.

FIG. 20 is an example plan view of the display panel 110 according to aspects of the present disclosure, and illustrates one or more example dummy gate driving panel circuits Dummy GPC disposed in one or more corner areas of the display panel 110 (e.g., upper-left, upper-right, lower-left, and/or lower-rights corners).

Referring to FIG. 20, in one or more embodiments, the display panel 110 according to aspects of the present disclosure can include one or more dummy gate driving panel circuits Dummy GPC disposed at all, or one or more, of a plurality of corner areas (or corner points) of the non-display area DNA.

The dummy gate driving panel circuit Dummy GPC can have basically the same structure as the gate driving panel circuit GPC. However, the dummy gate driving panel circuit Dummy GPC may not be connected to a gate line GL actually used to drive the display. For example, such a gate line GL can be a scan signal line SCL or a sensing signal line SENL.

Figure 21:
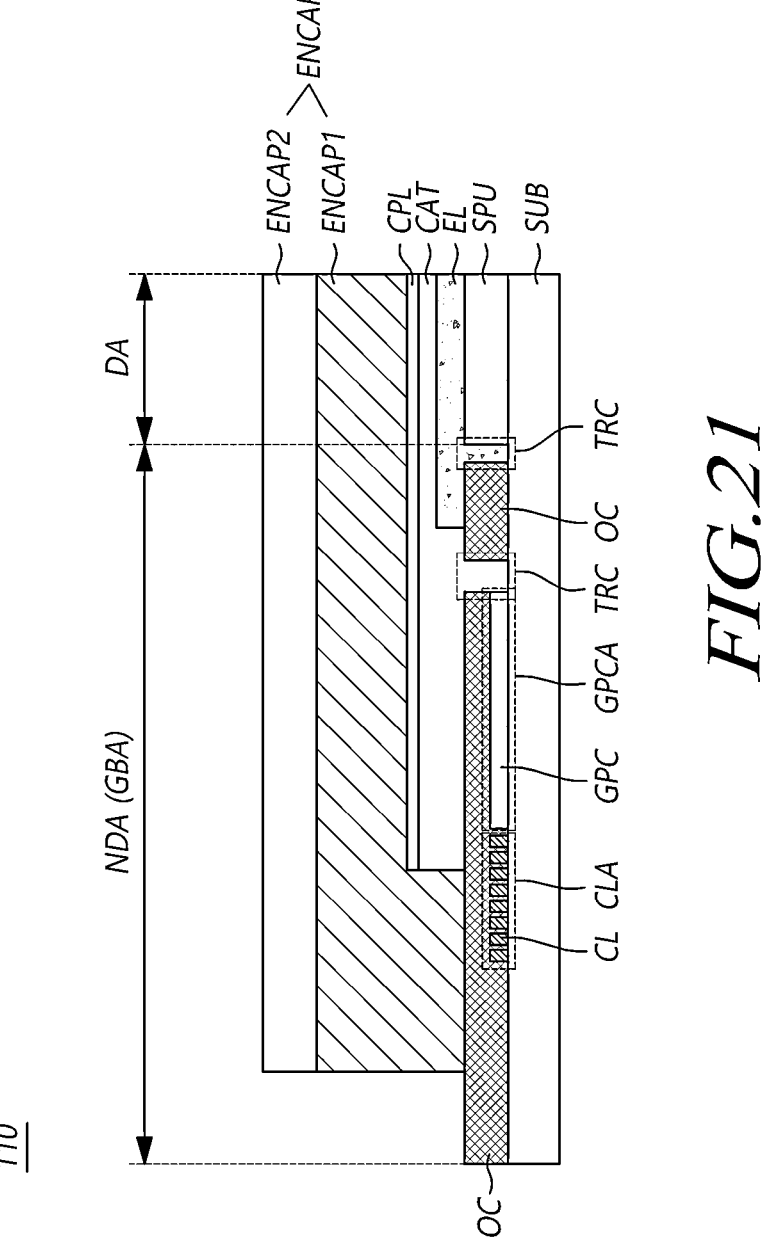
FIG. 21 is an example cross-sectional view of the display panel according to aspects of the present disclosure, and illustrates an area including the gate bezel area and a portion of display area.

FIG. 21 is an example cross-sectional view of the display panel 110 according to aspects of the present disclosure, and illustrates an area including the gate bezel area GBA and a portion of display area DA.

The cross-sectional view of FIG. 21 represents an area including the gate bezel area GBA where a gate driving panel circuit GPC is disposed and a portion of the display area DA adjacent to the gate bezel area GBA in the non-display area NDA of the display panel 110.

Referring to FIG. 21, in one or more embodiments, the display panel 110 according to aspects of the present disclosure can include a substrate SUB, the gate driving panel circuit GPC, a plurality of clock signal lines CL, an overcoat layer OC, a cathode electrode CAT, and the like.

The display area DA and the non-display area NDA can be defined on the substrate SUB.

The gate driving panel circuit GPC can be disposed on the substrate SUB, disposed in a gate driving panel circuit area GPCA included in the gate bezel area GBA of the non-display area NDA of the substrate SUB, and configured to output a corresponding gate signal to each of a plurality of gate lines GL disposed in the display area DA.

For example, the plurality of gate lines GL can include a plurality of scan signal lines SCL and a plurality of sensing signal lines SENL.

The plurality of clock signal lines CL can be disposed on the substrate SUB, and disposed in a clock signal line area CLA located on a first side of the gate driving panel circuit area GPCA in the non-display area NDA of the substrate SUB. Each of the plurality of clock signal lines CL can deliver a corresponding clock signal to the gate driving panel circuit GPC.

For example, the clock signal line area CLA can be located further away from the display area DA than the gate driving panel circuit area GPCA. For example, the clock signal line area CLA can be located in a further outer edge of the substrate SUB than the gate driving panel circuit area GPCA.

For example, the plurality of clock signal lines CL can include a plurality of carry clock signal lines CL_CRCLK, a plurality of scan clock signal lines CL_SCCLK, and a plurality of sensing clock signal lines CL_SECLK.

The overcoat layer OC can be disposed on the plurality of clock signal lines CL.

The overcoat layer OC can be disposed on the gate driving panel circuit GPC.

The cathode electrode CAT can be disposed in the display area DA and extend to the non-display area NDA.

The cathode electrode CAT can extend to the gate bezel area GBA in the non-display area NDA. For example, the cathode electrode CAT can extend to all or at least a portion of the gate driving panel circuit GPC such that the cathode electrode CAT is located on (or covers) all or at least a portion of the gate driving panel circuit GPC. According to this configuration, the cathode electrode CAT can overlap with all or at least a portion of the gate driving panel circuit GPC.

The cathode electrode CAT can extend to the gate bezel area GBA in the non-display area NDA. For example, the cathode electrode CAT can extend to all, or one or more, of the plurality of clock signal lines CL such that the cathode electrode CAT is located on (or covers) all, or one or more, of the plurality of clock signal lines CL. According to this configuration, the cathode electrode CAT can overlap with all, or one or more, of the plurality of clock signal lines CL.

A first power line area PLA1 can be disposed between the clock signal line area CLA and the gate driving panel circuit area GPCA, and a second power line area PLA2 can be disposed between the gate driving panel circuit area GPCA and the display area DA. It should be noted that, in FIG. 21, the first power line area PLA1 and the second power line area PLA2 are omitted.

Referring to FIG. 21, an emission layer EL located under the cathode electrode CAT can be disposed in the display area DA and, for example, extend to a portion of the non-display area NDA. The emission layer EL can overlap with a portion of the overcoat layer OC.

A subpixel section SPU can be located under the emission layer EL. The subpixel section SPU can include an anode electrode AND, transistors (DRT, SCT, SENT, and the like), and a storage capacitor Cst.

One or more trenches TRC, which can be holes formed in the overcoat layer OC or areas in which corresponding portions of the overcoat layer OC are removed, can be present in the non-display area NDA. For example, when a plurality of trenches TRC are present, one of the plurality of trenches TRC may not overlap with the emission layer EL, and the other or another thereof can overlap with the emission layer EL. The emission layer EL can extend to the non-display area NDA and be inserted into the one or more trenches TRC formed in the overcoat layer OC.

In one or more embodiments, the display panel 110 according to aspects of the present disclosure can include a capping layer CPL disposed on the cathode electrode CAT and an encapsulation layer ENCAP disposed on the capping layer CPL.

The encapsulation layer ENCAP can include a first encapsulation layer ENCAP1 and a second encapsulation layer ENCAP2. For example, the first encapsulation layer ENCAP1 can include an adhesive and/or a moisture absorbent having an encapsulation function. The first encapsulation layer ENCAP1 can include an organic material. The second encapsulation layer ENCAP2 can include a metal or an inorganic material. The second encapsulation layer ENCAP2 can be disposed such that the second encapsulation layer ENCAP2 covers the cathode electrode CAT, the capping layer CPL, and the first encapsulation layer ENCAP1.

The encapsulation layer ENCAP can overlap with the plurality of clock signal lines CL and the gate driving panel circuit GPC.

Each of the emission layer EL, the cathode electrode CAT, and the capping layer CPL can have a slightly different size or edge position from each other depending on process errors during the manufacturing process of the display panel 110. For example, the cathode electrode CAT may not overlap with all of the plurality of clock signal lines CL disposed in the clock signal line area CLA. Depending on the process errors, a portion of the cathode electrode CAT can overlap with all or one or more of the plurality of clock signal lines CL disposed in the clock signal line area CLA.

Figure 22:
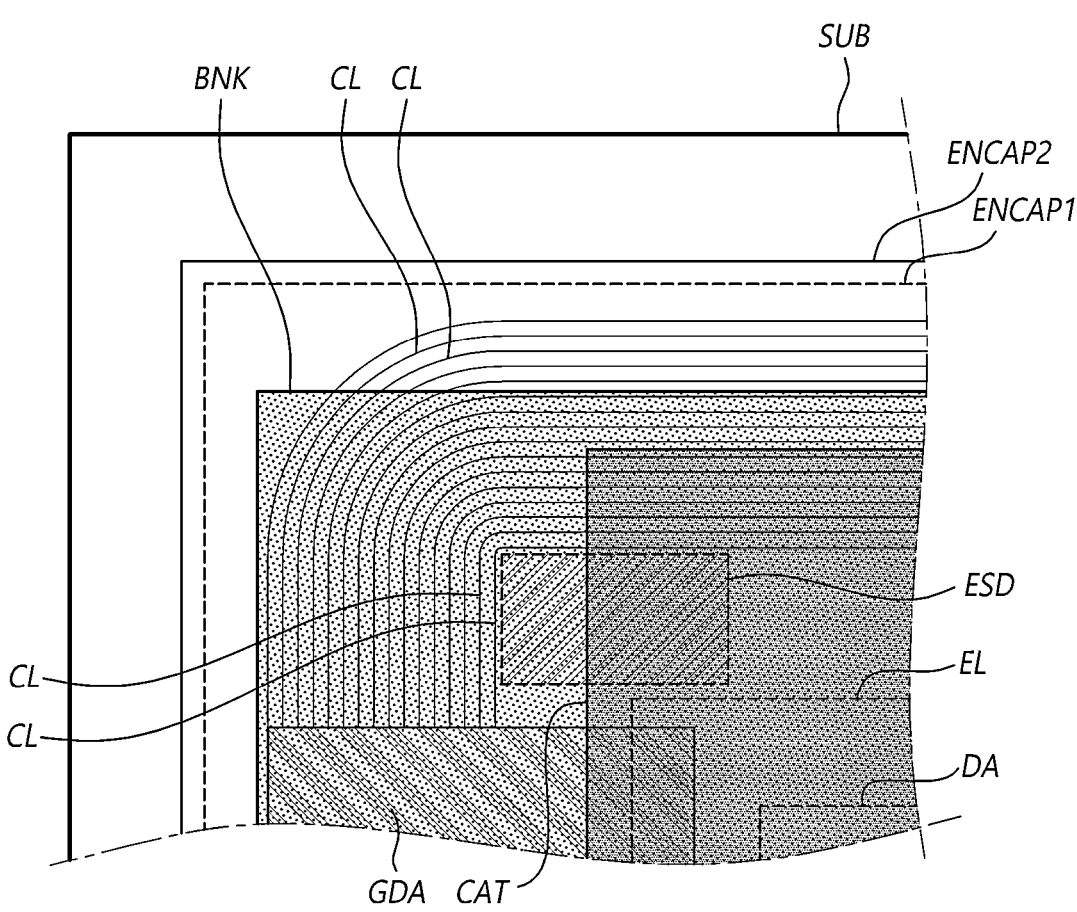
FIG. 22 is a plan view illustrating an example outer corner area of the display panel according to aspects of the present disclosure.

FIG. 22 is a plan view illustrating an example outer corner area of the substrate SUB of the display panel 110 according to aspects of the present disclosure.

Referring to FIG. 22, in one or more embodiments, the display panel 110 according to aspects of the present disclosure can include a bank BNK extending from the display area DA to the non-display area NDA, an emission layer EL (e.g., the emission layer EL discussed above with reference to FIG. 21) extending from the display area DA to the non-display area NDA, a cathode electrode CAT (e.g., the cathode electrode CAT discussed above with reference to FIG. 21) extending from the display area DA to the non-display area NDA and located on the emission layer EL, and an electrostatic discharge component ESD disposed in an outer corner area of the non-display area NDA.

In one or more embodiments, a corner portion of the bank BNK, a corner portion of the cathode electrode CAT, a corner portion of a first encapsulation layer ENCAP1 (e.g., the first encapsulation layer ENCAP1 discussed above with reference to FIG. 21), and a corner portion of a second encapsulation layer ENCAP2 (e.g., the second encapsulation layer ENCAP2 discussed above with reference to FIG. 21) can be located in an outer corner area of the substrate SUB of the display panel 110.

In the outer corner area of the display panel 110, among the bank BNK, the cathode electrode CAT, the first encapsulation layer ENCAP1, and the second encapsulation layer ENCAP2, the bank BNK can extend further outwardly than the cathode electrode CAT, and the first encapsulation layer ENCAP1 and the second encapsulation layer ENCAP2 can extend further outwardly than the bank BNK. The second encapsulation layer ENCAP2 can extend to a location the same as, or similar to, a location to which the first encapsulation layer ENCAP1 extends, or can extend further outwardly than the first encapsulation layer ENCAP1.

A portion of a gate driving area GDA can be disposed in the outer corner area of the substrate SUB of the display panel 110.

The gate driving area GDA can include the gate driving panel circuit area GPCA in which the gate driving panel circuit GPC is disposed. The gate driving area GDA can further include the clock signal line area CLA, the first power line area PLA1, and the second power line area PLA2.

The gate driving area GDA can overlap with the bank BNK, the first encapsulation layer ENCAP1, and the second encapsulation layer ENCAP2. All or a portion of the gate driving area GDA can overlap with the cathode electrode CAT.

The electrostatic discharge component ESD can be disposed in the outer corner area of the substrate SUB of the display panel 110. For example, the electrostatic discharge component ESD can include an electrostatic discharge circuit or an electrostatic discharge pattern.

A location at which the electrostatic discharge component ESD is disposed is not limited thereto. For example, one or more additional electrostatic discharge components ESD can be disposed in one or more other locations of the display device 100, in addition to the outer corner area shown in FIG. 22, or one or more other portions of the electrostatic discharge component ESD can be disposed in one or more other locations of the display device 100.

Referring to FIG. 22, the electrostatic discharge component ESD can overlap with the bank BNK. All or a portion of the electrostatic discharge component ESD can overlap with the cathode electrode CAT. The electrostatic discharge component ESD can overlap with the first encapsulation layer ENCAP1 and the second encapsulation layer ENCAP2, For example, the bank BNK can be disposed on the entire top surface, or overall, of the electrostatic discharge component ESD. The cathode electrode CAT can be disposed on the top surface of, or over, a portion of the electrostatic discharge component ESD.

The plurality of clock signal lines CL can be disposed along the outer corner of the substrate SUB and/or edges adjacent to the outer corner of the substrate SUB.

The plurality of clock signal lines CL can overlap with the first encapsulation layer ENCAP1 and the second encapsulation layer ENCAP2. All, or one or more, of the plurality of clock signal lines CL can overlap with the cathode electrode CAT. All, or one or more, of the plurality of clock signal lines CL may not overlap with the electrostatic discharge component ESD.

The emission layer EL can be disposed to extend from the display area DA to the non-display area NDA. For example, the emission layer EL can be one of components for composing one of an organic light emitting diode (OLED), a quantum dot organic light emitting diode (QD-OLED), and a light emitting diode chip (LED chip).

A portion of the gate driving area GDA can overlap with the emission layer EL. The electrostatic discharge component ESD may not overlap with the emission layer EL. In one or more embodiments, the electrostatic discharge component ESD can overlap with all or a portion of the emission layer EL.

Figure 23:
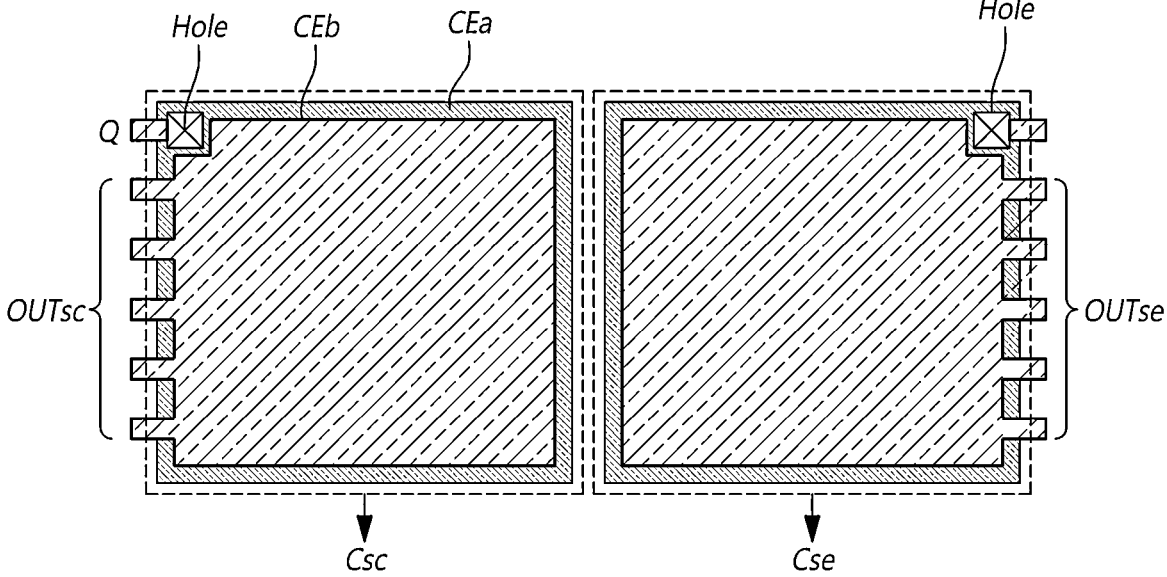
FIG. 23 illustrates example capacitors having a single capacitor structure in a gate driving panel circuit according to aspects of the present disclosure.

FIG. 23 illustrates example capacitors having a single capacitor structure in a gate driving panel circuit GPC (e.g., the gate driving panel circuit GPC in the figures including FIG. 9 discussed above) according to aspects of the present disclosure.

Referring to FIG. 23, in examples where the gate driving panel circuit GPC includes at least one n-type transistor, the gate driving panel circuit GPC can be designed to form a bootstrapping capacitor in order for a voltage value of an output signal to be output without loss relative to an input voltage. The bootstrapping capacitor can be formed by being connected to a scan pull-up transistor T6$sc$ or a sensing pull-up transistor T6$se$.

For example, the gate driving panel circuit GPC can be configured to include a scan bootstrapping capacitor Csc connected between the gate node and the source node (or drain node) of the scan pull-up transistor T6$sc$, and a sensing bootstrapping capacitor Cse connected between the gate node and the source node (or drain node) of the sensing pull-up transistor T6$se$.

Since the scan bootstrapping capacitor Csc and the sensing bootstrapping capacitor Cse can be configured to have the same form, hereinafter, for simplicity, discussions will be provided by focusing on the scan bootstrapping capacitor Csc.

Referring to FIG. 23, a scan bootstrapping capacitor Csc can have a single capacitor structure. The scan bootstrapping capacitor Csc can be a capacitor Ca formed by a first capacitor electrode CEa and a second capacitor electrode CEb. Referring to FIGS. 12 and 23, the first capacitor electrode CEa of the scan bootstrapping capacitor Csc can be connected to a Q node Q, and the second capacitor electrode CEb thereof can be connected to a scan output node OUTsc. In this configuration, the first capacitor electrode CEa to which a voltage of the Q node Q is applied can be a first metal, and the second capacitor electrode CEb connected to the scan output node OUTsc can be a second metal.

For example, the first metal can be a light shield metal disposed in the same layer as a light shield LS, and the second metal can be a gate metal disposed in the same layer as a gate electrode, a gate line, and/or the like. In an example where the Q node Q is formed in the same layer as the gate electrode, the gate line, and/or the like, the first capacitor electrode CEa, which is the light shield metal, can be electrically connected to the Q node Q, which is the gate metal, through a hole Hole. Further, the scan output node OUTsc can also be formed from the gate metal and be connected to the second capacitor electrode CEb. However, embodiments of the present disclosure are not limited to thereto. For example, the first metal of the first capacitor electrode CEa and the second metal of the second capacitor electrode CEb can be changed depending on design requirements.

Figure 24A:
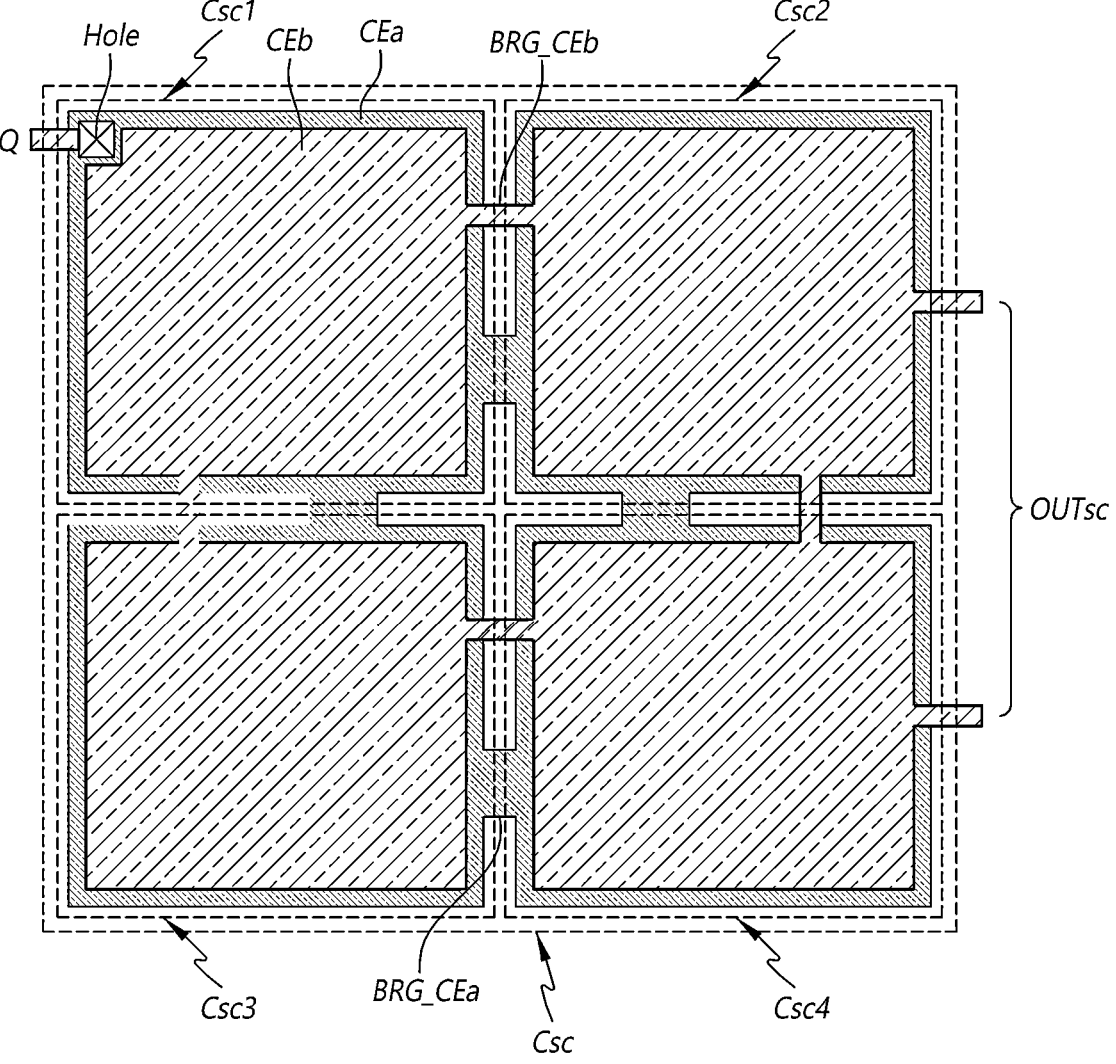
FIGS. 24A and 24B illustrate an example scan bootstrapping capacitor having a single capacitor structure configured with split sub-capacitor regions in a gate driving panel circuit according to aspects of the present disclosure.
Figure 24B:
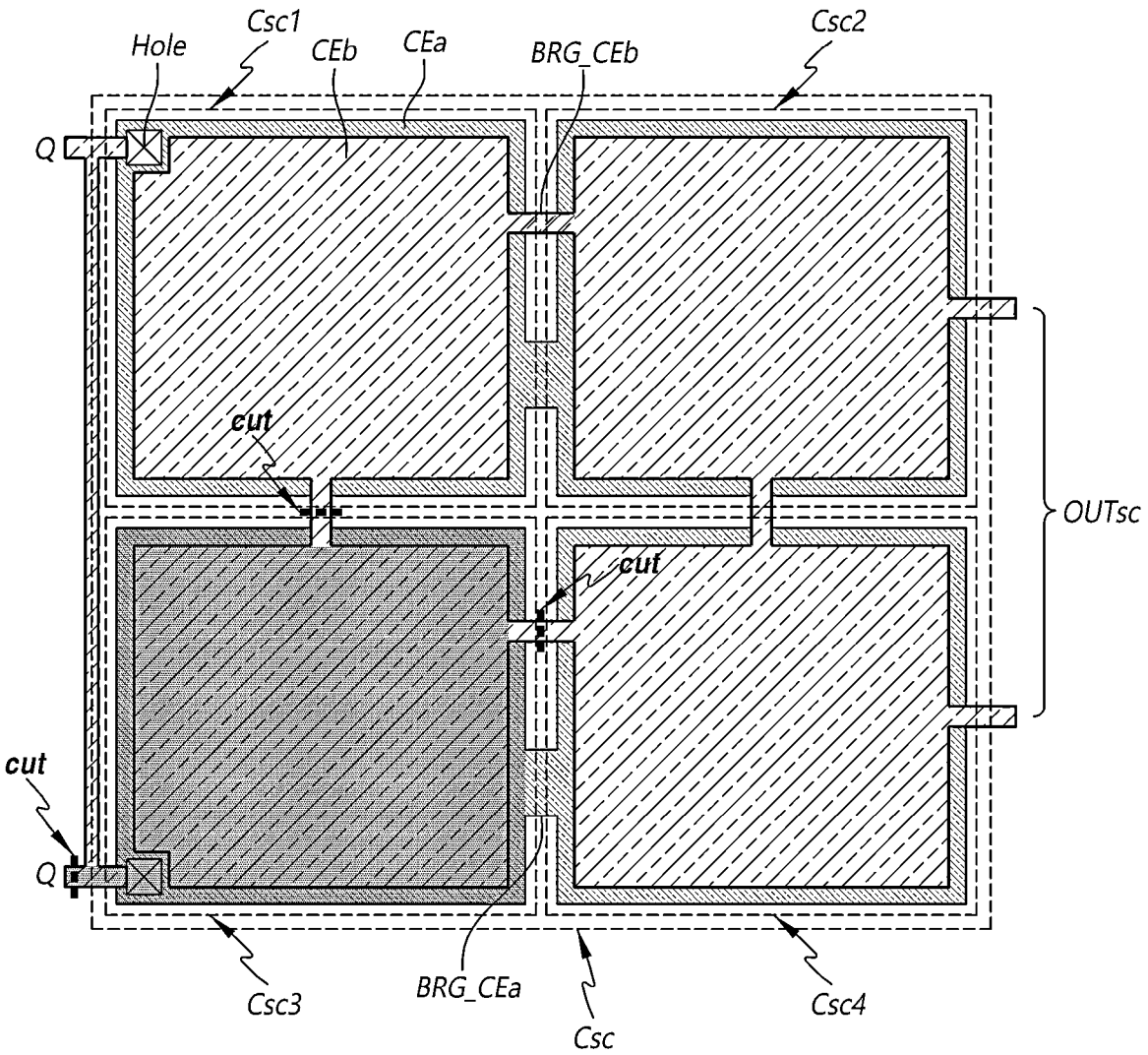

FIGS. 24A and 24B illustrate an example scan bootstrapping capacitor having a single capacitor structure configured with split sub-capacitor regions in a gate driving panel circuit GPC (e.g., the gate driving panel circuit GPC in the figures including FIG. 9 discussed above) according to aspects of the present disclosure.

Referring to FIGS. 24A and 24B, a scan bootstrapping capacitor Csc formed based on a single capacitor structure can be configured with split sub-capacitor regions (which can be referred to as a split pattern).

First and second metals of the scan bootstrapping capacitor Csc can be formed together in the same layer as a light shield LS, or a gate electrode, a gate line, and/or the like during the process of manufacturing transistors. In this case, in the process of manufacturing transistors, micro (u) scale of undesirable substances or particles can be generated. Therefore, design for minimizing, preventing, and curing the generation of such substances or particles during the manufacturing process can be desired.

To meet this requirement, in one or more embodiments, a scan bootstrapping capacitor Csc can be formed in a split pattern in which the scan bootstrapping capacitor Csc is split into at least two sub-capacitor regions. Two or more bridge metals can be disposed between the at least two sub-capacitor regions. By employing this structure, even when undesirable substances or particles are generated, a corresponding defected portion can be easily repaired or cured, thereby, leading normal operation to be performed. Although FIGS. 24A and 24B illustrate four sub-capacitor regions, for example, first to fourth sub-capacitor regions (Csc1 to Csc4), embodiments of the present disclosure are not limited thereto. The first to fourth sub-capacitor regions (Csc1 to Csc4) can have different shapes or have different capacitances. In a preferred embodiment, the first to fourth sub-capacitor regions (Csc1 to Csc4) can be formed to have the same capacitance.

Referring to FIG. 24B, the first to fourth sub-capacitor regions (Csc1 to Csc4) formed in the split pattern can share a Q node Q and receive a voltage through the shared Q node Q (or a voltage of the shared Q node Q). Although FIG. 24B illustrates that a gate line connected to the Q node Q branches, and the branches of the gate line are connected through holes Hole to first capacitor electrodes CEa, which are respective first metals of the first sub-capacitor region Csc1 and the third capacitor region Csc3, embodiments of the present disclosure are not limited thereto. For example, all of the first to fourth sub-capacitor regions (Csc1 to Csc4) can share the Q node Q, and the Q node Q formed from the same light shield metal as the first capacitor electrode CEa can be directly connected to at least one of the first capacitor electrodes CEa of the first to fourth sub-capacitor regions (Csc1 to Csc4) without being connected through such a hole Hole.

Further, although FIGS. 24A and 24B illustrate that a scan output node OUTsc is connected to second capacitor electrodes CEb, which are respective second metals of the second sub-capacitor region Csc2 and the fourth sub-capacitor region Csc4, embodiments of the present disclosure are not limited thereto. For example, all, or one or more, of the second capacitor electrodes CEb of the first to fourth sub-capacitor regions (Csc1 to Csc4) can be connected to the scan output node OUTsc, or the second capacitor electrodes CEb of the first to fourth sub-capacitor regions (Csc1 to Csc4) can be connected to respective scan output nodes OUTsc.

The first to fourth sub-capacitor regions (Csc1 to Csc4) can be electrically connected to each other through a first bridge BRG_CEa interconnecting the first capacitor electrodes CEa and a second bridge BRG_CEb interconnecting the second capacitor electrodes CEb. Respective widths of the first bridge BRG_CEa and the second bridge BRG_CEb can be the same as or different from, each other. The width of the first bridge BRG_CEa can be greater or less than that of the second bridge BRG_CEb. At least one of the first bridge BRG_CEa and the second bridge BRG_CEb can be electrically disconnected.

Further, since the first to fourth sub-capacitor regions (Csc1 to Csc4) share both the Q node Q and the scan output node OUTsc, therefore, the first to fourth sub-capacitor regions (Csc1 to Csc4) can be connected through any one of the first bridge BRG_CEa and the second bridge BRG_CEb.

Referring to FIG. 24B, even when undesirable substances or particles in the third sub-capacitor region Csc3 are generated during the manufacturing process, repair can be performed by cutting the bridge metal connected to the third sub-capacitor region Csc3, and thereby, the scan bootstrapping capacitor Csc can normally operate through the remaining first, second, and fourth sub-capacitor regions (Csc1, Csc2, and Csc4).

In this situation, such repair can be performed by cutting any one of the first bridge BRG_CEa interconnecting the first capacitor electrodes CEa and the second bridge BRG_CEb interconnecting the second capacitor electrodes CEb. For example, in a situation where the first capacitor electrode CEa and the second capacitor electrode CEb in the third sub-capacitor region Csc3 are short-circuited due to undesirable substances or particles, when the second bridge BRG_CEb connected to the third sub-capacitor region Csc3 is cut, the third capacitor region Csc3 can be electrically floating, and thereby, electrical charges may not be induced between the first capacitor electrode CEa and the second capacitor electrode CEb. As a result, the first bridge BRG-_CEa may not be needed to be cut separately.

In an embodiment, a separation distance between the second capacitor electrodes CEb can be set to at least 8 μm or more in order to cut and repair the second bridge BRG_CEb.

In this manner, the scan bootstrapping capacitor Csc can be formed by being split into at least two or more sub-capacitor regions, and all of the first to fourth sub-capacitor regions (Csc1 to Csc4) formed in the split pattern as shown in FIGS. 24A to 24B can share a Q node Q and a scan output node OUTsc. By employing this configuration, when a short circuit defect occurs due to undesirable substances or particles, by cutting of at least one of bridge metals electrically interconnecting the first to fourth sub-capacitor regions (Csc1 to Csc4), such a short circuit defect can be cured, and thereby, the advantage of enabling the scan bootstrapping capacitor Csc to normally operate can be provided.

Figure 25A:
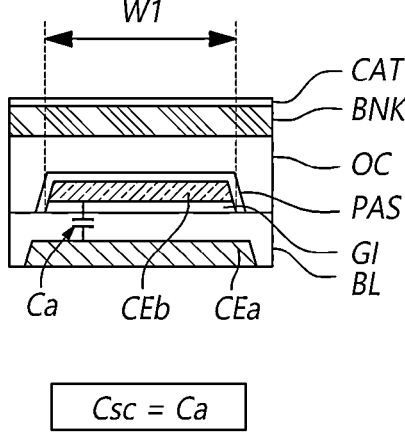
FIGS. 25A to 25C illustrate example cross-sectional views of capacitors applicable to a gate driving panel circuit according to aspects of the present disclosure.
Figure 25B:
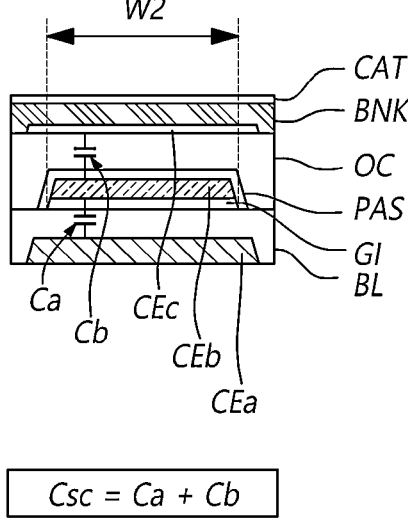
Figure 25C:
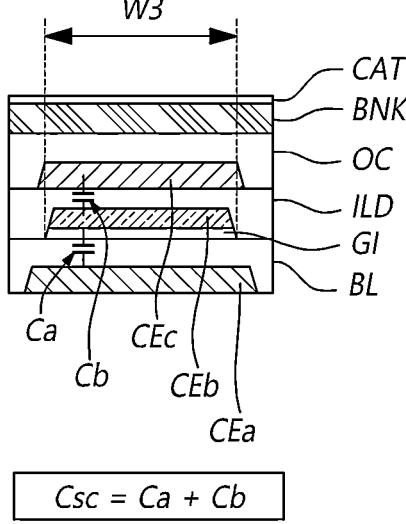

FIGS. 25A to 25C illustrate example cross-sectional views of capacitors applicable to a gate driving panel circuit GPC (e.g., the gate driving panel circuit GPC in the figures including FIG. 9 discussed above) according to aspects of the present disclosure.

Referring to FIG. 25A, a scan bootstrapping capacitor Csc can have a single capacitor structure.

The scan bootstrapping capacitor Csc can be a capacitor Ca formed by a first capacitor electrode CEa and a second capacitor electrode CEb.

An insulating layer including a buffer layer BL and a gate insulating layer GI can be disposed between the first capacitor electrode CEa and the second capacitor electrode CEb constituting the scan bootstrapping capacitor Csc. A protective layer PAS can be disposed on the second capacitor electrode CEb, an overcoat layer OC can be disposed on the protective layer PAS, a bank BNK can be disposed on the overcoat layer OC, and a cathode electrode CAT can be disposed on the bank BNK.

In the scan bootstrapping capacitor Csc, capacitance of the scan bootstrapping capacitor Csc can be determined depending on a value W1 of a first overlapping area in which the first capacitor electrode CEa and the second capacitor electrode CEb overlap each other.

Referring to FIG. 25B, a scan bootstrapping capacitor Csc can have a double capacitor structure. In other words, the scan bootstrapping capacitor Csc can have the structure of parallel capacitors. Therefore, the scan bootstrapping capacitor Csc having the double capacitor structure can have a greater capacitance compared to when the scan bootstrapping capacitor Csc has a single capacitor structure as in FIG. 25A.

The scan bootstrapping capacitor Csc can include a first capacitor Ca between a first capacitor electrode CEa and a second capacitor electrode CEb, and a second capacitor Cb between the second capacitor electrode CEb and a third capacitor electrode CEc.

The third capacitor electrode CEc constituting the bootstrapping capacitor Csc can be a metal located between the overcoat layer OC and the bank BNK.

The first capacitor electrode CEa and the third capacitor electrode CEc can be electrically connected together to the source node of a scan pull-up transistor T6sc, and the second capacitor electrode CEb can be electrically connected to the gate node of the scan pull-up transistor T6sc.

Accordingly, the scan bootstrapping capacitor Csc can be a composite capacitor formed by a parallel connection of the first capacitor Ca between the first capacitor electrode CEa and the second capacitor electrode CEb and the second capacitor Cb between the second capacitor electrode CEb and the third capacitor electrode CEc. Accordingly, the scan bootstrapping capacitor Csc can have a greater capacitance compared to when the scan bootstrapping capacitor Csc has a single capacitor structure.

Referring to FIG. 25B, in the scan bootstrapping capacitor Csc, capacitance of the scan bootstrapping capacitor Csc can be determined depending on a value W2 of a second overlapping area in which the first capacitor electrode CEa, the second capacitor electrode CEb, and the third capacitor electrode CEc overlap each other.

Referring to FIG. 25C, a scan bootstrapping capacitor Csc can have a double capacitor structure.

The scan bootstrapping capacitor Csc can be a composite capacitor formed by a parallel connection of a first capacitor Ca between a first capacitor electrode CEa and a second capacitor electrode CEb and a second capacitor Cb between the second capacitor electrode CEb and a third capacitor electrode CEc.

An interlayer insulating layer ILD can be disposed on the second capacitor electrode CEb constituting the scan bootstrapping capacitor Csc. The third capacitor electrode CEc constituting the scan bootstrapping capacitor Csc can be disposed between the interlayer insulating layer ILD and the overcoat layer OC.

In the scan bootstrapping capacitor Csc, capacitance of the scan bootstrapping capacitor Csc can be determined depending on a value W3 of a third overlapping area in which the first capacitor electrode CEa, the second capacitor electrode CEb, and the third capacitor electrode CEc overlap each other.

Referring to FIGS. 25A to 25C, the first capacitor electrodes CEa constituting the scan bootstrapping capacitors Csc can be a first metal, the second capacitor electrodes CEb can be a second metal, and the third capacitor electrodes CEc can be a third metal or a fourth metal.

For example, the first metal can be a light shield metal disposed in the same layer as a light shield LS, and the second metal can be a gate metal disposed in the same layer as a gate electrode, a gate line, and/or the like. The third metal can be an anode metal disposed in the same layer as an anode electrode AND, as shown in FIG. 25B. The fourth metal can be a source-drain metal disposed in the same layer as source and drain electrodes of a transistor, as shown in FIG. 25C.

Figure 26A:
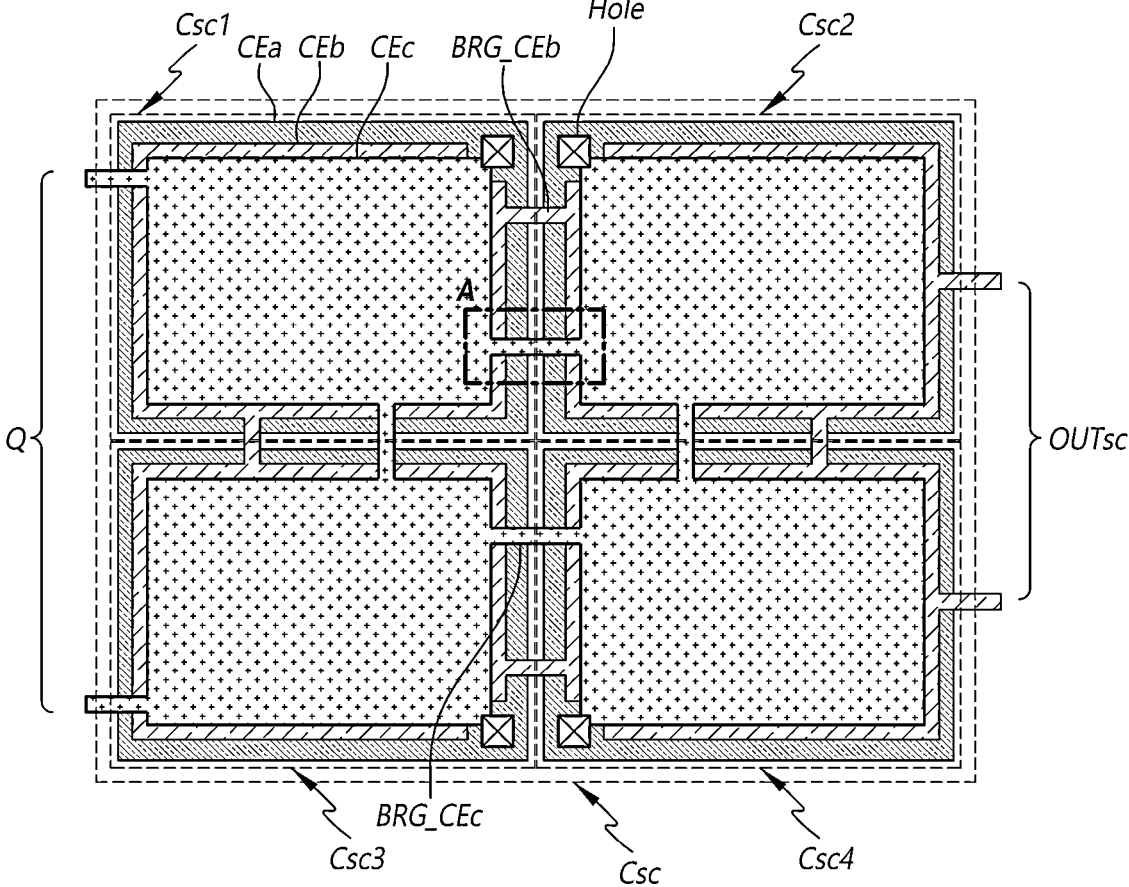
FIGS. 26A to 26C illustrate an example scan bootstrapping capacitor having a double capacitor structure configured with split sub-capacitor regions in a gate driving panel circuit according to aspects of the present disclosure.
Figure 26B:
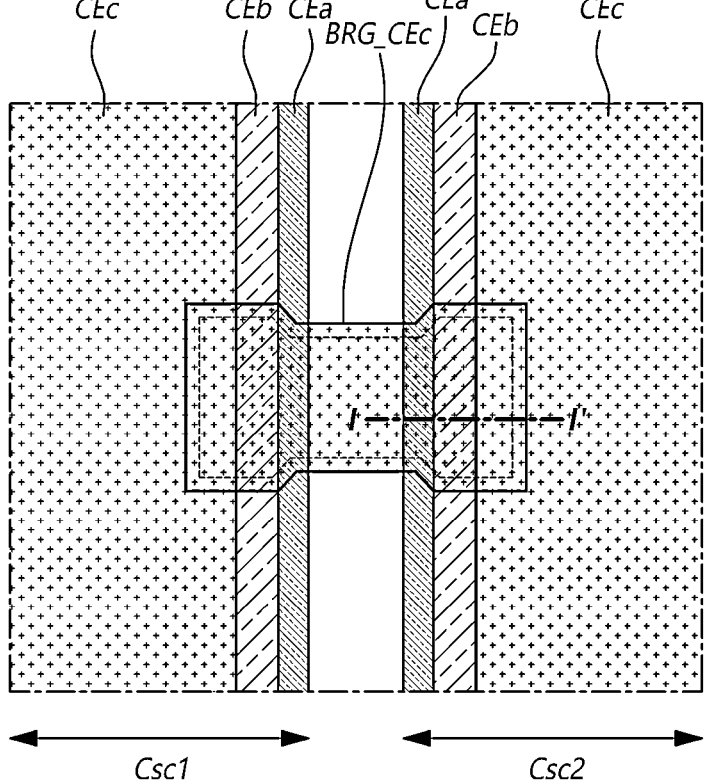
Figure 26C:
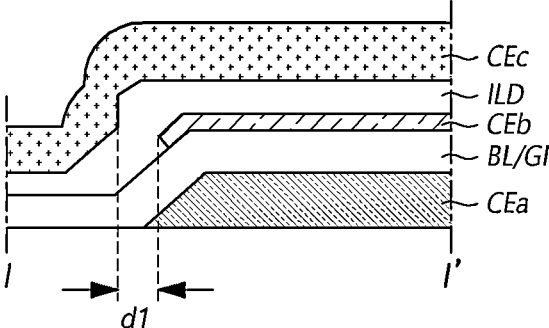

FIGS. 26A to 26C illustrate an example scan bootstrapping capacitor having a double capacitor structure configured with split sub-capacitor regions in a gate driving panel circuit GPC (e.g., the gate driving panel circuit GPC in the figures including FIG. 9 discussed above) according to aspects of the present disclosure.

Referring to FIG. 26A, a scan bootstrapping capacitor Csc formed in a split pattern can have a double capacitor structure. In other words, the scan bootstrapping capacitor Csc can be a composite capacitor formed by a parallel connection of a first capacitor Ca between a first capacitor electrode CEa and a second capacitor electrode CEb and a second capacitor Cb between the second capacitor electrode CEb and a third capacitor electrode CEc.

The structure of the scan bootstrapping capacitor Csc shown in FIG. 26A can represent the structure of FIG. 25C in which the first metal of the first capacitor electrode CEa is the light shield metal disposed in the same layer as the light shield LS, the second metal of the second capacitor electrode CEb can be the gate metal disposed in the same layer as the gate electrode, the gate line, and/or the like, and the third metal of the third capacitor electrode CEc can be the source-drain metal disposed between the interlayer insulating layer ILD and the overcoat layer OC. In an embodiment, as described above with reference to FIGS. 24A and 24B, first to fourth sub-capacitor regions (Csc1 to Csc4) of the scan bootstrapping capacitor Csc can share both a Q node Q and a scan output node OUTsc.

In an embodiment, each of the first to fourth sub-capacitor regions (Csc1 to Csc4) can have a different shape or a different capacitance. In a preferred embodiment, the first to fourth sub-capacitor regions (Csc1 to Csc4) can be configured to have the same capacitance as each other.

Referring to FIG. 26A, in the scan bootstrapping capacitor Csc, the first capacitor electrode CEa and the third capacitor electrode CEc can be electrically connected to each other through a hole Hole, and the second capacitor electrode CEb can be disposed between the first capacitor electrode CEa and the third capacitor electrode CEc to form capacitive coupling with each of the first capacitor electrode CEa and the third capacitor electrode CEc.

Holes Hole can be formed between the first sub-capacitor region Csc1 and the second sub-capacitor region Csc2 and between the third sub-capacitor region Csc3 and the fourth sub-capacitor region Csc4. Thus, the holes Hole can be located symmetrically. In an embodiment, a portion of an edge (e.g., a corner) of the second capacitor electrode CEb disposed in each sub-capacitor region overlapping with the corresponding hole Hole can be removed in order not to overlap the hole Hole. However, embodiments of the present disclosure are not limited thereto, and the holes Hole can be located inside of the first to fourth sub-capacitor regions (Csc1 to Csc4) depending on design requirements. For example, the holes Hole can be formed in respective central portions of the first to fourth sub-capacitor regions (Csc1 to Csc4). In this example, the second capacitor electrode CEb included in each sub-capacitor region can have an opening formed by removing the central portion of the second capacitor electrode CEb in order not to overlap the corresponding hole Hole, Although FIG. 26A illustrates that the third capacitor electrodes CEc, which are formed from the source-drain metal, of the first to fourth sub-capacitor regions (Csc1 to Csc4) are directly connected to the Q node Q, which are also formed from the source-drain metal, but embodiments of the present disclosure are not limited thereto. For example, the first to fourth sub-capacitor regions (Csc1 to Csc4) can be electrically connected through one or more holes Hole to the Q node Q, which is formed from the light shield metal or the gate metal.

Referring to FIG. 26A, the first to fourth sub-capacitor regions (Csc1 to Csc4) can be electrically connected to each other through one or more second bridges BRG_CEb interconnecting the second capacitor electrodes CEb of the first to fourth sub-capacitor regions (Csc1 to Csc4) and one or more third bridges BRG_CEc interconnecting the third capacitor electrodes CEc of the first to fourth sub-capacitor regions (Csc1 to Csc4). Since the first capacitor electrode CEa is connected to the third capacitor electrode CEc through the hole Hole, a separate first bridge BRG_CEa may not be formed. However, embodiments of the present disclosure are not limited thereto. For example, one or more first bridges BRG_CEa can be formed to interconnect the first capacitor electrodes CEa and the third capacitor electrodes CEc. At least one of the first bridge BRG_CEa, the second bridge BRG_CEb and the third bridge BRG_CEc can be electrically disconnected.

Respective widths of the second bridge BRG_CEb and the third bridge BRG_CEc can be the same as, or different from, each other. The width of the second bridge BRG_CEb can be greater or less than that of the third bridge BRG_CEc. In an embodiment, the first to fourth sub-capacitor regions (Csc1 to Csc4) can share both the Q node Q and the scan output node OUTsc. Therefore, the first to fourth sub-capacitor regions (Csc1 to Csc4) can be connected through any one of the second bridge BRG_CEb and the third bridge BRG_CEc.

FIG. 26B is an enlarged view of area A in FIG. 26A, and FIG. 26C is a cross-sectional view of the third bridge BRG_CEc in FIG. 26B.

Referring to FIGS. 26B and 26C, each of one or more third bridges BRG_CEc can be formed by overlapping with the first capacitor electrode CEa and the second capacitor electrode CEb.

An insulating layer including a buffer layer BL and a gate insulating layer GI can be disposed on the first capacitor electrode CEa, and the second capacitor electrode CEb can be disposed on the buffer layer BL and the gate insulating layer GI. An interlayer insulating layer ILD, which is an inorganic material, can be disposed such that the interlayer insulating layer ILD covers the second capacitor electrode CEb. The third bridges BRG_CEc disposed along the interlayer insulating layer ILD can interconnect the third capacitor electrodes CEc of the first to fourth sub-capacitor regions (Csc1 to Csc4).

The second capacitor electrode CEb can be formed such that the second capacitor electrode CEb covers at least a portion of a side surface of the insulating layer including the buffer layer BL and the gate insulating layer GI or at least a portion of a side surface of the gate insulating layer GI disposed on the buffer layer BL. In an embodiment, the third bridge BRG_CEc formed along a curved portion of the interlayer insulating layer ILD can be spaced apart by a first distance d1 from an end of the second capacitor electrode CEb in the curved portion. In this embodiment, when the first distance d1 is small, there can occur a short-circuit defect by a connection or contact between the third bridge BRG_CEc and the second capacitor electrode CEb. For example, in a situation where the first distance d1 is set to 2 μm, when an overlay shift occurs by 2 μm or more due to a tolerance during the manufacturing process, a short circuit defect can occur due to a step difference. Therefore, an additional robust structure can be desired to cure or prevent a defect caused by a step. Such a configuration will be described with reference to FIGS. 27A to 27C.

Figure 27A:
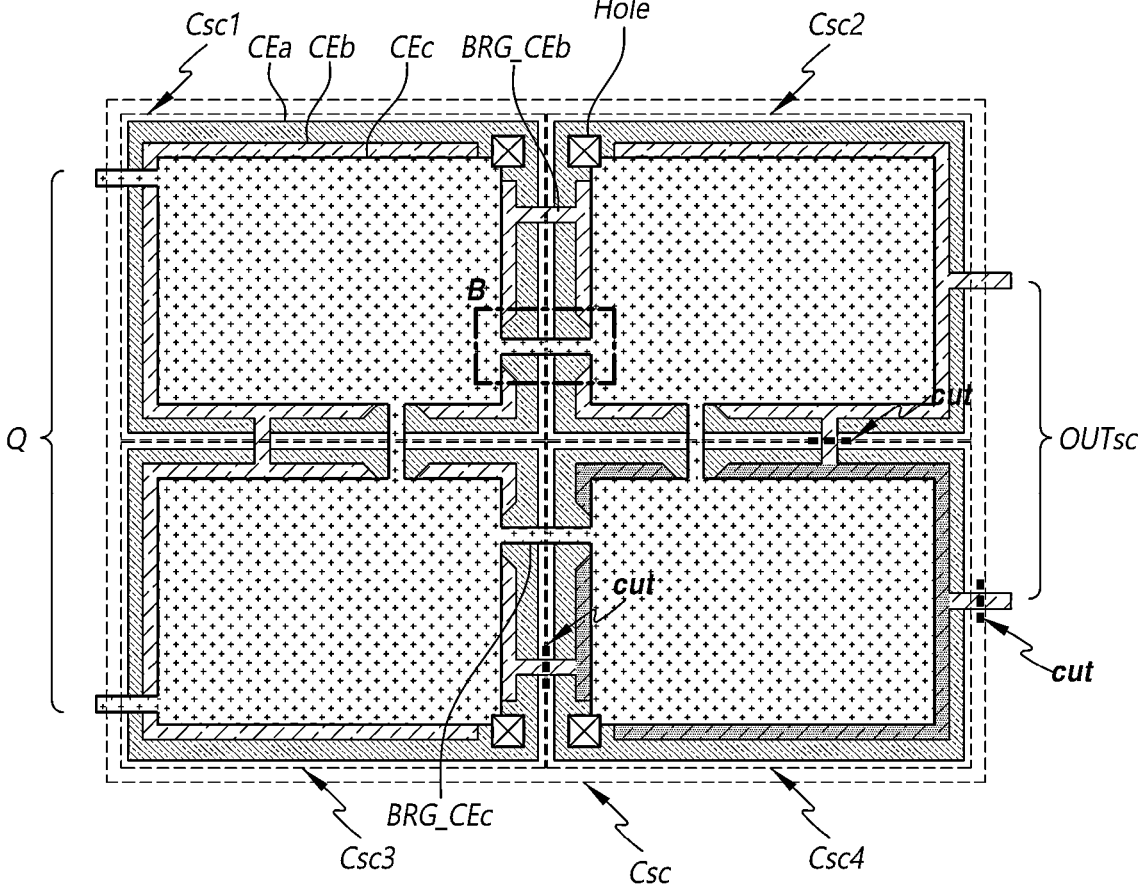
FIGS. 27A to 27C illustrate an example scan bootstrapping capacitor having a double capacitor structure configured with split sub-capacitor regions designed to cure a defect by a step in a gate driving panel circuit according to aspects of the present disclosure.
Figure 27B:
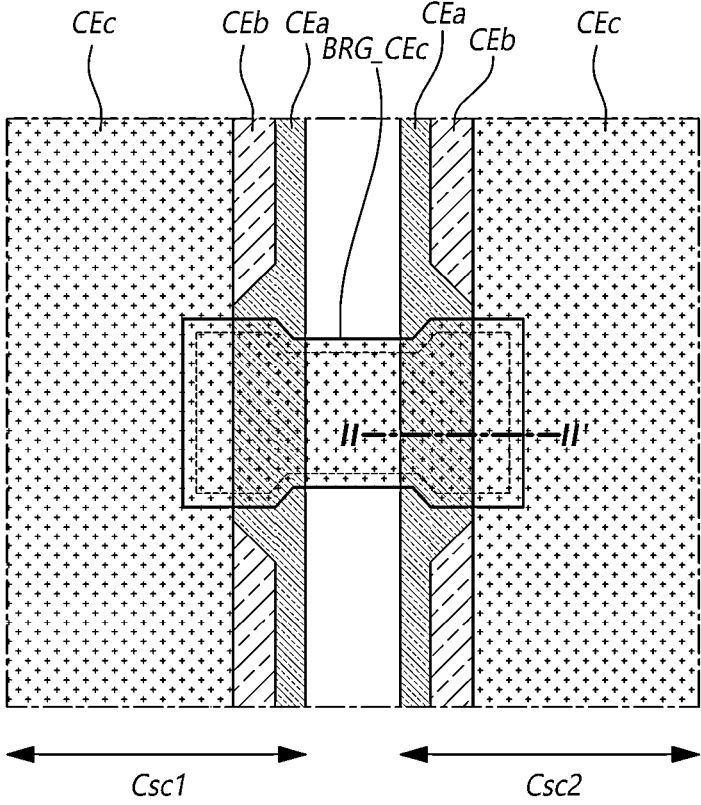
Figure 27C:
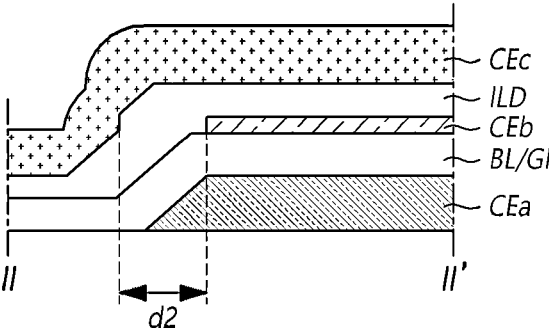

FIGS. 27A to 27C illustrate an example scan bootstrapping capacitor having a double capacitor structure configured with split sub-capacitor regions designed to cure or prevent a defect by a step in a gate driving panel circuit GPC (e.g., the gate driving panel circuit GPC in the figures including FIG. 9 discussed above) according to aspects of the present disclosure.

Referring to FIGS. 27A to 27C, the scan bootstrapping capacitor Csc having a double capacitor structure configured with split sub-capacitor regions can have a robust structure in which a portion of a second capacitor electrode CEb (e.g., the second capacitor electrode CEb discussed above with reference to the figures) overlapping with a third bridge BRG_CEc (e.g., the third bridge BRG_CEc discussed above with reference to the figures) is removed.

The second capacitor electrode CEb can be formed such that the second capacitor electrode CEb does not cover at least a portion of a side surface of an insulating layer including a buffer layer BL and a gate insulating layer GI or at least a portion of a side surface of the gate insulating layer GI disposed on the buffer layer BL. In an embodiment, the third bridge BRG_CEc formed along a curved portion of the interlayer insulating layer ILD can be spaced apart by a second distance d2 from an end of the second capacitor electrode CEb in the curved portion. In this embodiment, the second distance d2 between the end of the second capacitor electrode CEb and the third bridge BRG_CEc can be designed to have a sufficiently great distance taking account of an overlay shift during the manufacturing process. For example, in a situation where the second distance d2 is set to 6 μm or more, even when an overlay shift of 2 to 3 μm occurs due to a tolerance during the manufacturing process, a short circuit defect due to a step may not occur. According to the embodiment discussed above, even when a short circuit defect can occur due to undesirable substances or particles during the manufacturing process, the defect of a capacitor configured with split sub-capacitor regions can be effectively cured or prevented by cutting and repairing a bridge metal connected to a corresponding sub-capacitor region in which such a defect has occurred, thereby, providing an advantage of enabling the capacitor to normally operate. Further, a short circuit defect due to an overlay shift can be cured or prevented even in a double capacitor structure through the robust structure in which the second distance d2 between an end of the second capacitor electrode CEb and the third bridge BRG_CEc is set to have a sufficiently great distance.

It should be noted here that although the embodiments discussed above have been provided based on scan bootstrapping capacitors Csc, but embodiments of the present disclosure are not limited to thereto. For example, a sensing bootstrapping capacitor Cse connected to a sensing pull-up transistor T6se of a sensing output buffer SEBUF or a carry bootstrapping capacitor Ccr connected to a carry pull-up transistor T6cr of a carry output buffer CRBUF can also be configured in the same structure as the scan bootstrapping capacitors Csc. For example, a first end of the sensing bootstrapping capacitor Cse and a first end of the carry bootstrapping capacitor Ccr can be connected to a shared Q node Q together, and a second opposing end of the sensing bootstrapping capacitor Cse and a second opposing end of the carry bootstrapping capacitor Ccr can be connected to a sensing output node OUTse and a carry output node OUTcr, respectively.

In an embodiment, a sensing control capacitor Crt can be configured in the same structure as the carry bootstrapping capacitor Ccr, the scan bootstrapping capacitor Csc, and the sensing bootstrapping capacitor Cse.

For example, first and second capacitor electrodes (CEa and CEb) of the sensing control capacitor Crt can be connected to a first gate high voltage node HV1 and an intermediate node M, respectively. In this example, when the sensing control capacitor Crt has a single capacitor structure, first and second metals of the sensing control capacitor Crt can be formed together in the same layer as a light shield LS, or a gate electrode, a gate line, and/or the like during the transistor manufacturing process.

In an embodiment, when the sensing control capacitor Crt has a double capacitor structure, a first metal of the first capacitor electrode CEa can be a light shield metal disposed in the same layer as the light shield LS, and a second metal of the second capacitor electrode CEb can be a gate metal disposed in the same layer as the gate electrode, gate line, and/or the like. In an embodiment, a third metal of a third capacitor electrode CEc can be an anode metal disposed in the same layer as an anode electrode AND as shown in FIG. 25B, or the third metal can be a source-drain metal disposed in the same layer as the source and drain electrodes of a transistor as shown in FIG. 25C. The sensing control capacitor Crt can be configured to have a smaller capacitor area or smaller capacitance than bootstrapping capacitors such as the carry bootstrapping capacitor Ccr, the scan bootstrapping capacitor Csc, and the sensing bootstrapping capacitor Cse, and therefore, the number of sub-capacitor regions split into two or more sub-capacitor regions can be less than the number of sub-capacitor regions in each of the bootstrapping capacitors.

The embodiments of the display device 100 according to aspects of the present disclosure described above can be briefly discussed as follows.

According to the embodiments described herein, a display device (e.g., the display device 100) include a substrate including a display area in which images can be displayed and a non-display area different from the display area, and a gate driving panel circuit configured to output a plurality of scan signals to a plurality of scan signal lines disposed in the display area.

The gate driving panel circuit can include an output buffer block including a scan output buffer configured to receive a clock signal and output a scan signal, and a logic block configured to control respective voltages of a Q node and a QB node, which are electrically connected to the output buffer block.

The scan output buffer can include a scan pull-up transistor disposed between a clock node to which the clock signal is input and a scan output node from which the scan signal is output, and a scan pull-down transistor disposed between a gate low voltage node to which a gate low voltage is applied and the scan output node.

The gate node of the scan pull-up transistor can be electrically connected to the Q node, and the scan output buffer can include a first capacitor disposed between the gate node and a source node of the scan pull-up transistor.

The first capacitor can include at least two sub-capacitor regions.

The first capacitor can include two or more bridge metals disposed between the at least two sub-capacitor regions.

The first capacitor can further include a first capacitor electrode disposed in each of the at least two sub-capacitor regions, a second capacitor electrode disposed in each of the at least two sub-capacitor regions and spaced apart from the first capacitor electrode, a first bridge interconnecting the respective first capacitor electrodes disposed in the at least two sub-capacitor regions, and a second bridge interconnecting the respective second capacitor electrodes disposed in the at least two sub-capacitor regions.

At least one of the first bridge and the second bridge can be electrically disconnected.

The first capacitor can have a double capacitor structure.

The first capacitor can further include a first capacitor electrode disposed in each of the at least two sub-capacitor regions, a second capacitor electrode disposed in each of the at least two sub-capacitor regions and spaced apart from the first capacitor electrode, a third capacitor electrode disposed in each of the at least two sub-capacitor regions and spaced apart from the second capacitor electrode, a first bridge interconnecting the respective first capacitor electrodes disposed in the at least two sub-capacitor regions, a second bridge interconnecting the respective second capacitor electrodes disposed in the at least two sub-capacitor regions, and a third bridge interconnecting the respective third capacitor electrodes disposed in the at least two sub-capacitor regions.

The first capacitor electrode can include a light shield metal, the second capacitor electrode can include a gate metal, and the third capacitor electrode can include a source-drain metal or an anode metal.

At least one of the first bridge, the second bridge, and the third bridge can be electrically disconnected.

The gate driving panel circuit can further include a second capacitor connected between a first gate high voltage node and an intermediate node.

The first capacitor can have a capacitance greater than the second capacitor.

An area of the first capacitor can be greater than that of the second capacitor.

The output buffer block can further include a carry output buffer comprising a carry pull-up transistor and a carry pull-down transistor to output a carry signal, and a sensing output buffer comprising a sensing pull-up transistor and a sensing pull-down transistor to output a sensing signal.

The carry output buffer can further include a capacitor disposed between a gate node and a source node of the carry pull-up transistor.

The sensing output buffer can further include a capacitor disposed between a gate node and a source node of the sensing pull-up transistor.

The first capacitor can include a first capacitor electrode and a second capacitor electrode.

The capacitance of the first capacitor can be determined depending on an area in which the first capacitor electrode and the second capacitor electrode overlap each other.

The first capacitor can further include a third capacitor electrode disposed on the second capacitor electrode. An insulating layer can be disposed between the second capacitor electrode and the third capacitor electrode.

The third capacitor electrode can be electrically connected to the first capacitor electrode.

The display device can further include a plurality of clock signal lines disposed in a clock signal line area in the non-display area and delivering a plurality of clock signals to the gate driving panel circuit, a plurality of gate high voltage lines disposed in a first power line area in the non-display area and delivering a plurality of gate high voltages to the gate driving panel circuit, and a plurality of gate low voltage lines disposed in a second power line area in the non-display area and delivering a plurality of gate low voltages to the gate driving panel circuit.

The gate driving panel circuit can be disposed in a gate driving panel circuit area in the non-display area, and the first power line area and the second power line area can be separated by the gate driving panel circuit area.

The plurality of clock signal lines can include a plurality of scan clock signal lines and a plurality of carry clock signal lines, and a line width of each of the plurality of scan clock signal lines is greater than that of each of the plurality of carry clock signal lines.

Each of all or one or more of the plurality of clock signal lines can be a multilayer line. Each of one or more of the plurality of gate high voltage lines can be a single-layer line, and each of the remaining one or more gate high voltage lines can be a multilayer line. Each of the plurality of gate low voltage lines can be a multilayer line.

The display device can further include a bank extending from the display area to the non-display area, an emission layer extending from the display area to the non-display area, a cathode electrode extending from the display area to the non-display area and located on the emission layer, and an electrostatic discharge component disposed in an outer corner area of the non-display area.

The electrostatic discharge component may not overlap with the emission layer. A portion of the electrostatic discharge component can overlap with the cathode electrode. The electrostatic discharge component can overlap with the bank.

The output buffer block can be configured to output the plurality of scan signals during each active period and output one of the plurality of scan signals during any one blank period among a plurality of blank periods.

The logic block can be configured to charge the Q node so that the output buffer block can output the plurality of scan signals during each active period.

The gate driving panel circuit can further include a real-time sensing control block for charging the Q node during any one blank period among the plurality of blank periods.

According to the embodiments described herein, a gate driving panel circuit (e.g., the gate driving panel circuit GPC) include an output buffer block configured to receive a clock signal and output a scan signal, and a logic block configured to control respective voltages of a Q node and a QB node electrically connected to the output buffer block.

The output buffer block can include a pull-up transistor between a clock node to which the clock signal is input and an output node from which the scan signal is output, and a pull-down transistor between a gate low voltage node to which a gate low voltage is applied and the output node.

A gate node of the pull-up transistor can be electrically connected to the Q node.

The output buffer block can include a first capacitor between the gate node and a source node of the pull-up transistor.

The first capacitor can include at least two sub-capacitor regions.

According to the embodiments described herein, a gate driving panel circuit (e.g., the gate driving panel circuit GPC) can have a structure suitable for a gate-in-panel (GIP) type, and a display device (e.g., the display device 100) can be provided that includes the gate driving panel circuit.

According to the embodiments described herein, since a display panel (e.g., the display panel 110) and a display device (e.g., the display device 100) include a gate driving panel circuit (e.g., the gate driving panel circuit GPC) disposed on a substrate of the display panel and formed during the manufacturing process of the display panel or the display device, advantage of enabling process optimization of the display panel and the display device can be provided.

According to the embodiments described herein, a gate driving panel circuit (e.g., the gate driving panel circuit GPC) can be capable of (or is suitable for) eliminating, minimizing or preventing defects and other limitations such as short circuit caused by undesirable substances or particles through an easily repairable capacitor structure, and a display device (e.g., the display device 100) including the gate driving panel circuit can be provided.

According to the embodiments described herein, production energy can be reduced and a manufacturing process leading to poor yields can be cured or prevented by reducing the number of discarded display panels and thereby improving panel manufacturing yields through an easily repairable capacitor structure.

The embodiments of the present disclosure described above have been described for illustrative purposes; those skilled in the art will appreciate that various modifications, additions and substitutions are possible, without departing from the scope and spirit of the invention as disclosed in the accompanying claims. Although the exemplary embodiments have been described for illustrative purposes, a person skilled in the art will appreciate that various modifications and applications are possible without departing from the essential characteristics of the present disclosure. For example, the specific components of the exemplary embodiments can be variously modified.

What is claimed is:

1. A display device comprising:
a substrate including a display area in which one or more images are displayed and a non-display area different from the display area; and
a gate driving panel circuit configured to output a plurality of gate signals to a plurality of gate signal lines disposed in the display area,
wherein the gate driving panel circuit comprises:
an output buffer block configured to receive at least one first input signal and output at least one output signal, and
a logic block configured to control respective voltages of a Q node and a QB node, which are electrically connected to the output buffer block,
wherein the output buffer block comprises:
at least one first transistor, each of which is disposed between a first input node to which the first input signal is input and an output node from which the output signal is output, and at least one second transistor, each of which is disposed between a second input node to which a second input signal different from the first input signal is input and the output node, wherein a gate node of each of the at least one first transistor is electrically connected to the Q node, and wherein the output buffer block comprises at least one first capacitor comprising at least two sub-capacitor regions.

2. The display device of claim 1, wherein each of the at least one first capacitor comprises at least two sub-capacitor regions, and each of the at least one first capacitor is disposed between a gate node and a source node of the corresponding first transistor.

3. The display device of claim 1, wherein among the first input signal and the second input signal, one is a clock signal and the other is a first gate voltage.

4. The display device of claim 1, wherein the at least one first capacitor includes two or more bridge metals disposed between the at least two sub-capacitor regions.

5. The display device of claim 1, wherein the gate driving panel circuit further comprises a second capacitor connected to a second gate voltage node.

6. The display device of claim 5, wherein the first capacitor has a capacitance greater than the second capacitor, or an area of the first capacitor is greater than an area of the second capacitor.

7. The display device of claim 1, wherein the at least one output signal includes a gate signal output to a gate signal line electrically connected to a sub-pixel in the display area among the plurality of gate signal lines, and the at least one first transistor and the at least one second transistor are configured to output the gate signal to the gate signal line disposed in the display area.

8. The display device of claim 1, wherein the at least one output signal comprises a carry signal output to other circuit portion in the gate driving panel circuit, and the at least one first transistor and the at least one second transistor are configured to output the carry signal to the other circuit portion.

9. The display device of claim 1, wherein each of the at least one first capacitor comprises a first capacitor electrode and a second capacitor electrode, and a capacitance of the first capacitor is determined depending on an area in which the first capacitor electrode and the second capacitor electrode overlap each other.

10. The display device of claim 9, wherein:

the first capacitor further comprises a third capacitor electrode on the second capacitor electrode;

an insulating layer is disposed between the second capacitor electrode and the third capacitor electrode; and the third capacitor electrode is electrically connected to the first capacitor electrode.

11. The display device of claim 1, further comprising:

a plurality of clock signal lines disposed in a clock signal line area in the non-display area and configured to deliver a plurality of clock signals to the gate driving panel circuit;

a plurality of gate high voltage lines disposed in a first power line area in the non-display area and configured to deliver a plurality of gate high voltages to the gate driving panel circuit; and a plurality of gate low voltage lines disposed in a second power line area in the non-display area and configured to deliver a plurality of gate low voltages to the gate driving panel circuit, wherein the gate driving panel circuit is disposed in a gate driving panel circuit area in the non-display area, and the first power line area and the second power line area are separated by at least a portion of the gate driving panel circuit area.

12. The display device of claim 11, wherein the plurality of clock signal lines comprise a plurality of gate clock signal lines and a plurality of carry clock signal lines, and a line width of each of the plurality of gate clock signal lines is greater than a line width of each of the plurality of carry clock signal lines, and wherein the plurality of gate clock signal lines comprise a plurality of scan clock signal lines or a plurality of sensing clock signal lines.

13. The display device of claim 11, wherein the clock signal line area is located further away from the gate driving panel circuit area than the first power line area.

14. A gate driving panel circuit comprising:

an output buffer block configured to receive at least one first input signal and output at least one output signal; and a logic block configured to control respective voltages of a Q node and a QB node electrically connected to the output buffer block, wherein the output buffer block comprises:

at least one first transistor, each of which is disposed between a first input node to which the first input signal is input and an output node to which the output signal is output, and at least one second transistor, each of which is disposed between a second input node to which a second input signal different from the first input signal is applied and the output node, wherein a gate node of each of the at least one first transistor is electrically connected to the Q node, and wherein the output buffer block further comprises at least one capacitor comprising at least two sub-capacitor regions.

15. The gate driving panel circuit of claim 14, wherein the at least two sub-capacitor regions share the Q node and the output node.

16. The gate driving panel circuit of claim 14, wherein each of the at least one capacitor further comprises:

a first capacitor electrode disposed in each of the at least two sub-capacitor regions;

a second capacitor electrode disposed in each of the at least two sub-capacitor regions and spaced apart from the first capacitor electrode; and a first bridge interconnecting the respective first capacitor electrodes disposed in the at least two sub-capacitor regions.

17. The gate driving panel circuit of claim 16, wherein each the at least one capacitor further comprises:

a second bridge interconnecting the respective second capacitor electrodes disposed in the at least two sub-capacitor regions;

a third capacitor electrode disposed in each of the at least two sub-capacitor regions and spaced apart from the second capacitor electrode; and a third bridge interconnecting the respective third capacitor electrodes disposed in the at least two sub-capacitor regions.

18. The gate driving panel circuit of claim 17, wherein the first capacitor electrode comprises a light shield metal, the second capacitor electrode comprises a gate metal, and the third capacitor electrode comprises a source-drain metal or an anode metal.

19. The gate driving panel circuit of claim 17, wherein at least one of the first bridge, the second bridge, and the third bridge is electrically disconnected.

20. The gate driving panel circuit of claim 16, wherein the Q node formed from a same light shield metal as the first capacitor electrode is directly connected to at least one of the first capacitor electrodes of the at least two sub-capacitor regions.

* * * * *